(12) United States Patent
Yasuhara et al.

(10) Patent No.: US 7,067,876 B2
(45) Date of Patent: Jun. 27, 2006

(54) SEMICONDUCTOR DEVICE

(75) Inventors: Norio Yasuhara, Kawasaki (JP);
Kazutoshi Nakamura, Yokohama (JP);
Yusuke Kawaguchi, Miura-Gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 599 days.

(21) Appl. No.: 10/139,324

(22) Filed: May 7, 2002

(65) Prior Publication Data

US 2002/0167047 A1 Nov. 14, 2002

(30) Foreign Application Priority Data

May 9, 2001 (JP) .......................................... 2001-139060
Mar. 7, 2002 (JP) .......................................... 2002-061988

(51) Int. Cl.
*H01L 29/76* (2006.01)

(52) U.S. Cl. ........................................ 257/335; 257/336
(58) Field of Classification Search .................. 257/327, 257/328, 329, 330, 331, 332, 333, 334, 335, 257/336, 337, 338, 339, 340, 341, 342, 343, 257/344, 345, 346
See application file for complete search history.

(56) References Cited

U.S. PATENT DOCUMENTS

| 5,463,241 | A | * | 10/1995 | Kubo |
| 5,841,166 | A | | 11/1998 | D'Anna |
| 5,869,875 | A | | 2/1999 | Hebert |
| 5,981,983 | A | * | 11/1999 | Funaki et al. |
| 6,222,233 | B1 | * | 4/2001 | D'Anna |
| 6,372,557 | B1 | * | 4/2002 | Leong |

FOREIGN PATENT DOCUMENTS

| JP | 09-139438 | 5/1997 |
| JP | 2001-094094 | 4/2001 |
| KR | 2000-0061628 | 10/2000 |

* cited by examiner

*Primary Examiner*—Minhloan Tran
*Assistant Examiner*—Kevin Quinto
(74) *Attorney, Agent, or Firm*—Oblon, Spivak, McClelland, Maier & Neustadt, P.C.

(57) ABSTRACT

A semiconductor device comprises a semiconductor substrate; a semiconductor layer having a higher resistance than that of said semiconductor substrate and provided on a top surface of said semiconductor substrate; a gate electrode provided on a gate insulating film on the top surface of said semiconductor layer; a drain layer of a first conductivity type selectively provided in a location in said semiconductor layer in one side of said gate electrode; a drain electrode connected to said drain layer; a source layer of the first conductivity type selectively provided in a location in said semiconductor layer in the other side of said gate electrode; an element-side connecting portion selectively provided on said semiconductor layer, which does not reach a channel portion between said source layer and said drain layer of said semiconductor layer and also does not reach to said semiconductor substrate, and which is in contact with said source layer and has lower resistance than that of said semiconductor layer; a contact-side connecting portion selectively provided on said semiconductor layer, having lower resistance than said semiconductor layer and extending deeper toward said semiconductor substrate than said element-side connecting portion; a first source electrode connecting said source layer, said element-side connect portion and said contact-side connect portion; and a bottom electrode provided on the bottom surface of said semiconductor substrate in connection therewith.

24 Claims, 36 Drawing Sheets

SEMICONDUCTOR DEVICE

CROSS-REFERENCE TO RELATED APPLICATIONS

This application is based upon and claims the benefit of priority from the prior Japanese Patent Applications No. 2001-139060, filed on May 9, 2001, and No. 2002-61988, filed on Mar. 7, 2002, the entire contents of which are incorporated herein by reference.

BACKGROUND OF THE INVENTION

1. Field of the Invention

This invention relates to a semiconductor device and more specifically to, a power semiconductor device.

2. Related Background Art

Electronic devices such as personal computers and communication devices have power sources incorporating DC-DC converters, for example. For years, electronic devices are getting progressively small-sized, the drive voltage is getting lower, and the drive current is getting larger. Responsively, the need of a power source capable of efficiently supplying a large current and dealing with high frequencies has arisen.

To supply a large current under a low voltage, it is desirable that the ON resistance of the power semiconductor element used in the power source is as low as possible. To cope with high frequencies, the switching speed of the power semiconductor element used in the power source must be high.

For years, Schottky diodes are generally used in power sources for the purpose of rectification. Recently, power MOSFET has come to be used in lieu of Schottky diodes to enable the supply of a large current under a low voltage. Therefore, rectifying power MOSFET for rectification is required in addition to switching power MOSFET for switching the input and the output of the power source. This kind of power source is called a synchronous rectification circuit type power source because of synchronous switching motions of the rectifying power MOSFET and the switching power MOSFET.

FIG. 24 is a circuit diagram of a DC-DC converter 2000 used in a power source of a typical synchronous rectification circuit type. It is desirable that both the rectifying power MOSFET 2010 and the switching power MOSFET 2020 are switchable at a high speed because they are synchronously operated. In addition, both the rectifying power MOSFET 2010 and the switching power MOSFET 2020 preferably have the ON resistance as low as possible because a large current flows through MOSFET 2010 and 2020. Therefore, it is desirable to improve DC-DC converter 2000 of the synchronous rectification circuit type by decreasing the ON resistance of the switching power MOSFET 2020 and the rectifying power MOSFET 2010, increasing their switching speeds, and so on.

Some DC-DC converters include an inductance 2050 connected between the source electrode 2031 of the switching power MOSFET 2020 and the output 2040 of the DC-DC converter, for example. Switching of the power source including the inductance connected thereto is generally called L-load switching.

In the ON state of the switching power MOSFET 2020, the potential difference between the drain electrode 2060 and the source electrode 2031 is nearly zero, and electric energy is accumulated in the inductance 2050.

On the other hand, when the switching power MOSFET 2020 is switched from ON to OFF, connection between the drain electrode 2060 and the source electrode 2031 is interrupted. In addition, since the inductance 2050 behaves to maintain the current having got in the ON state of the switching power MOSFET 2020, the potential of the source electrode 2031 decreases. As a result, the voltage of the drain electrode 2060 is substantially clamped, and the potential difference between the drain electrode 2060 and the source electrode 2031 becomes larger than the potential difference between the input 2070 and the output 2040 of the DC-DC converter 2000. Depending on the magnitude of the inductance, the voltage between the drain electrode 2060 and the source electrode 2031 may exceed the withstanding voltage between the drain electrode 2060 and the source electrode 2031. In this case, an avalanche current by avalanche breakdown flows between the drain electrode 2060 and the source electrode 2031.

FIG. 25A is an enlarged cross-sectional view of a conventional switching power MOSFET 2020. The switching power MOSFET 2020 is symmetrical with respect to the broken line in FIGS. 25A. Therefore, explanation will be continued remarking the left side of the broken line.

The switching power MOSFET 2020 has the configuration explained below. A $p^-$-type silicon layer 2105 is formed on a $p^{++}$-type silicon substrate 2100. The drain electrode 2060 is connected to an n-type drain layer 2110 formed in the silicon layer 2105. An $n^+$-type source layer 2140 is formed for connection from the n-type drain layer 2110 via a channel portion 2130 under the gate electrode 2080 to the source electrode 2030. The source electrode 2030 is connected also to a p-type base layer 2150 formed around the $n^+$-type source layer 2140. A $p^+$-type connecting layer 2160 is formed to connect the source electrode 2030 to the $p^{++}$-type silicon substrate 2100. Further formed on the bottom surface of the silicon substrate 2100 is a source electrode 2031. Since the $p^+$-type connecting layer 2160 extends to the silicon substrate 2100, the source electrode 2030 and the source electrode 2031 are electrically connected. As a result, a large current can flow when the channel portion 2130 is ON.

The channel portion 2130 is made up of the $p^-$-type silicon layer 2105 and the p-type base layer 2150. Therefore, the n-type drain layer 2110, channel portion 2130 and $n^+$-type source layer 2140 parasitically make up an npn bipolar transistor.

FIG. 25B is a circuit diagram of a parasitic npn bipolar transistor made up of the n-type drain layer 2110, channel portion 2130 and $n^+$-type source layer 2140. The base of the parasitic npn bipolar transistor is connected to the source electrode 2030 via the p-type base layer 2150.

As already explained with reference to FIG. 24, an avalanche current by avalanche breakdown may flow between the drain electrode 2060 and the source electrode 2031. The avalanche current flows to the source electrode 2031 through the resistor of the p-type base layer 2150 and further through the $p^+$-type connecting layer 2160 and $p^{++}$-type semiconductor substrate 2100. If the current is large, a voltage drop occurring in the p-type base layer 2150 forwardly biases the junction between the $n^+$-type source layer 2140 and the p-type base layer 2150. As a result, the parasitic npn bipolar transistor shown in FIG. 25B undesirably turns ON. Once the parasitic npn bipolar transistor turns ON, a still larger current flows between the drain electrode 2060 and the source electrode 2031. It results in raising the problem that the power MOSFET shown in FIG. 25A breaks (this phenomenon is hereinafter called "device breakdown by L-load switching").

Still referring to FIG. 25A, the p+-type connecting layer 2160 must diffuse to reach the silicon substrate 2100. The p+-type connecting layer 2160 is diffused both vertically and laterally. If the p+-type connecting layer 2160 reaches the channel portion by lateral diffusion, the threshold voltage of the switching power MOSFET 2020 rises. Once the threshold voltage of the switching power MOSFET 2020 rises, its switching delays, and the ON resistance of the switching power MOSFET 2020 increases.

On the other hand, if the p+-type connecting layer 2160 is located apart from the channel portion not to reach the channel portion even upon lateral diffusion thereof, then the width of the switching power MOSFET 2020 increases and results in increasing the area of the DC-DC converter 2000. In case the switching power MOSFET 2020 is formed to occupy a constant area, it results in decreasing the unit cells of the switching power MOSFETs 2020 or the device units that can be made. Therefore, since the total channel width of the switching power MOSFETs 2020 within a given area becomes narrower, the ON-state current decreases. It results in substantially increasing the ON resistance of the switching power MOSFET 2020.

FIG. 26 is an enlarged cross-sectional view of another model of conventional switching power MOSFET 2020. FIG. 25 shows a MOSFET 2020 having a flat-type gate, but the FIG. 26 shows a MOSFET 2020' having a vertical-type trench gate.

The MOSFET 2020' includes a source layer 2220 connected to a source electrode 2210, a drain layer 2240 connected to a drain electrode 2230 and a trench gate electrode 2260 buried between the source layer 2220 and the drain layer 2240 via an insulating film 2250.

This MOSFET 2020' efficiently uses the side surface of the gate electrode, and thereby reduces the ON resistance.

However, since the trench gate electrode 2260 is adjacent to the drain layer 2240 via the insulating film 2250, and the insulating film 2250 is thinned to lower the ON resistance, the MOSFET 2020' involves the problem that the parasitic capacitance between the trench gate electrode 2260 and the drain layer 2240 becomes large. Because of this parasitic capacitance, the MOSFET 2020' is slow in switching, and it is not suitable for use as a high-frequency switch.

The rectifying power MOSFET 2010 also involves the same problems discussed above.

SUMMARY OF THE INVENTION

According to an embodiment of the invention, there is provided a semiconductor device comprising: a semiconductor substrate; a semiconductor layer having a higher resistance than that of said semiconductor substrate and provided on a top surface of said semiconductor substrate; a gate electrode provided on a gate insulating film on the top surface of said semiconductor layer; a drain layer of a first conductivity type selectively provided in a location in said semiconductor layer in one side of said gate electrode; a drain electrode connected to said drain layer; a source layer of the first conductivity type selectively provided in a location in said semiconductor layer in the other side of said gate electrode; an element-side connecting portion selectively provided on said semiconductor layer, which does not reach a channel portion between said source layer and said drain layer of said semiconductor layer and also does not reach to said semiconductor substrate, and which is in contact with said source layer and has lower resistance than that of said semiconductor layer; a contact-side connecting portion selectively provided on said semiconductor layer, having lower resistance than said semiconductor layer and extending deeper toward said semiconductor substrate than said element-side connecting portion; a first source electrode connecting said source layer, said element-side connecting portion and said contact-side connecting portion; and a bottom electrode provided on the bottom surface of said semiconductor substrate in connection therewith.

According to a further embodiment of the invention, there is provided a semiconductor device comprising: a semiconductor substrate; a semiconductor layer having a higher resistance than that of said semiconductor substrate and formed on a top surface of said semiconductor substrate; a gate electrode formed on a gate insulating film on the top surface of said semiconductor layer; a drain layer of a first conductivity type selectively formed in a location in said semiconductor layer in one side of said gate electrode; a drain electrode connected to said drain layer; a source layer of the first conductivity type selectively formed in a location in said semiconductor layer in the other side of said gate electrode; a first semiconductor region of a second conductivity type connected to said source layer, which has lower resistance than that of said semiconductor layer and is selectively formed on said semiconductor layer, and which reaches said semiconductor substrate; a second semiconductor region of the second conductivity type having a lower resistance than said semiconductor layer, and selectively formed on said semiconductor layer, which reaches said semiconductor substrate and is not adjacent to said source layer; a short-circuiting electrode connected to said source layer and said first semiconductor region; a source electrode formed on the bottom surface of said semiconductor substrate in connection therewith; a bipolar transistor provided in a region from said drain electrode to said short-circuiting electrode and formed by said drain layer, said source layer and a channel portion which is provided between said drain layer and said source layer; and a diode provided in a region from said drain electrode to said second semiconductor region and formed by said drain layer and said second semiconductor region, wherein the withstanding voltage between said drain layer and said second semiconductor region in said diode is substantially equal to or lower than the withstanding voltage between said drain electrode and said source layer in said bipolar transistor.

DETAILED DESCRIPTION OF THE INVENTION

Embodiments of the invention will now be explained below with reference to the drawings. The embodiments, however, should not be construed to limit the invention. Semiconductor devices according to the following embodiments of the invention do not lose the effects of the embodiments even when modified in conductivity type of each component from the p-type to the n-type or from the n-type to the p-type.

Figure 1:
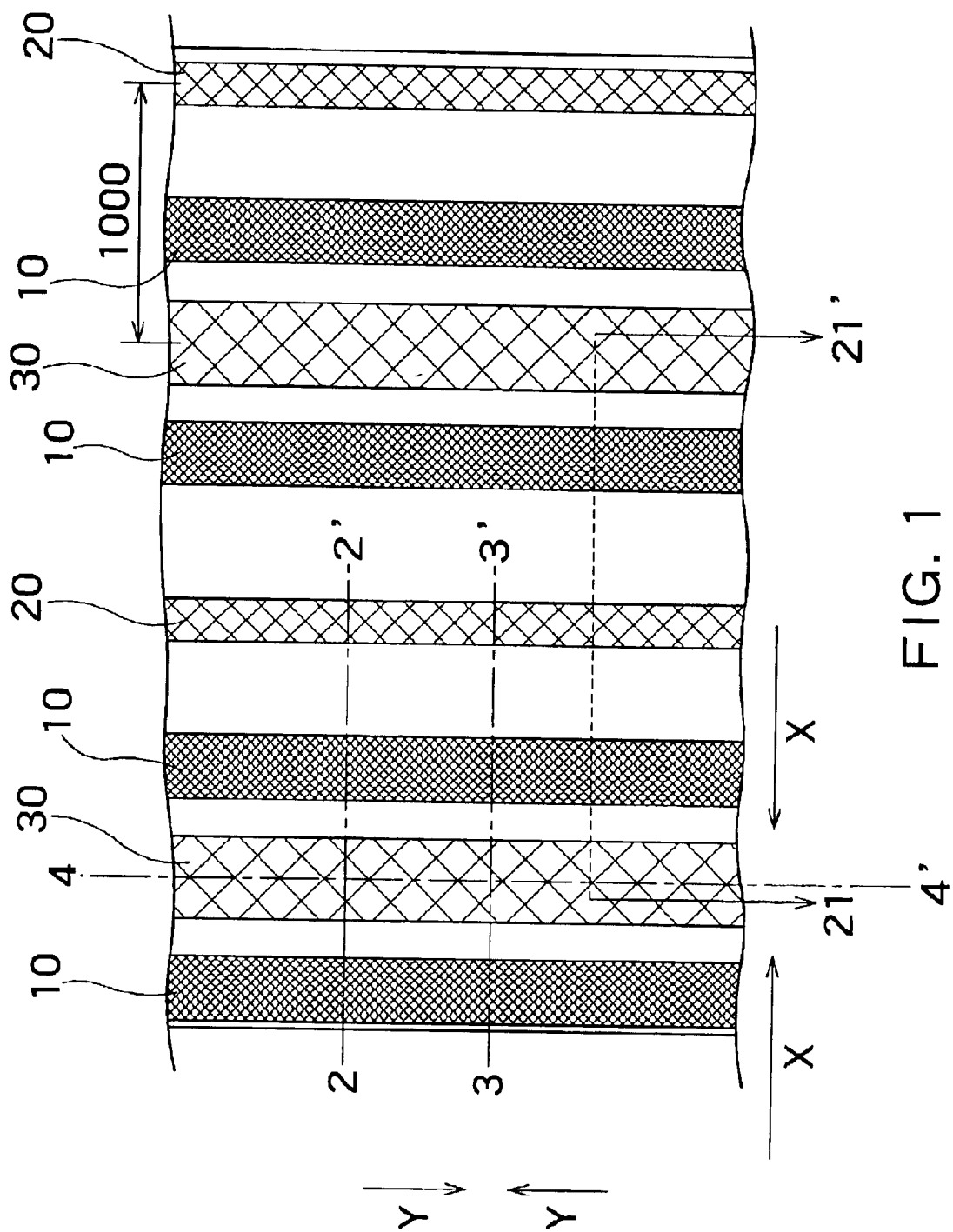
FIG. 1 is an enlarged schematic plan view of a part of a semiconductor device according to the first embodiment of the invention.
Figure 25A:
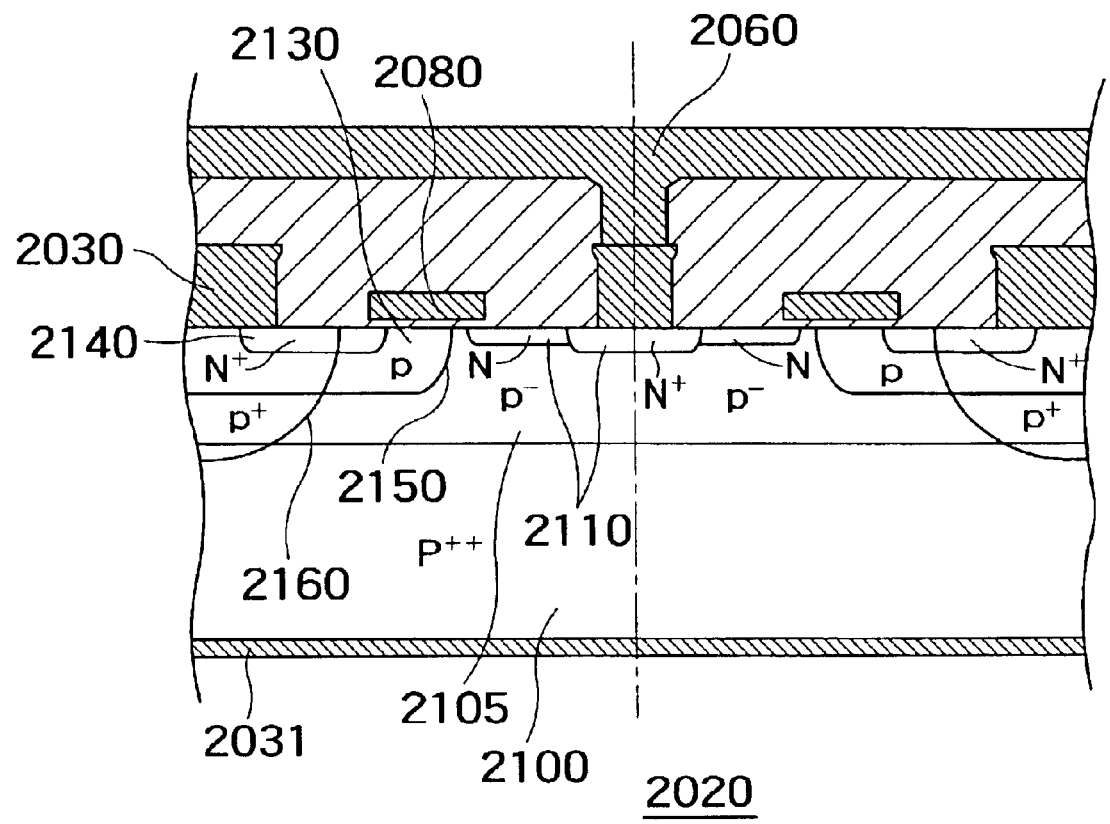
FIGS. 25A and 25B are an enlarged cross-sectional view and a circuit diagram of a conventional switching power MOSFET 2020.

The section of the conventional device shown in FIG. 25A corresponds to the section take along the line 21–21' in FIG. 1. Therefore, in FIG. 25A, the section of the semiconductor device was bilaterally symmetrical with respect to the drain electrode. However, for easier explanation of embodiments according to the invention, the section taken along the line 2–2' or the line 3–3' of FIG. 1 is used for explanation made below.

FIG. 1 is an enlarged, partial plan view that schematically shows a semiconductor device according to the first embodiment of the invention. The semiconductor device shown here includes a plurality of gate electrodes formed substantially in parallel, and includes drain electrodes 20 and source electrodes 30 formed alternately between the gate electrodes 10 substantially in parallel therewith.

Figure 2:
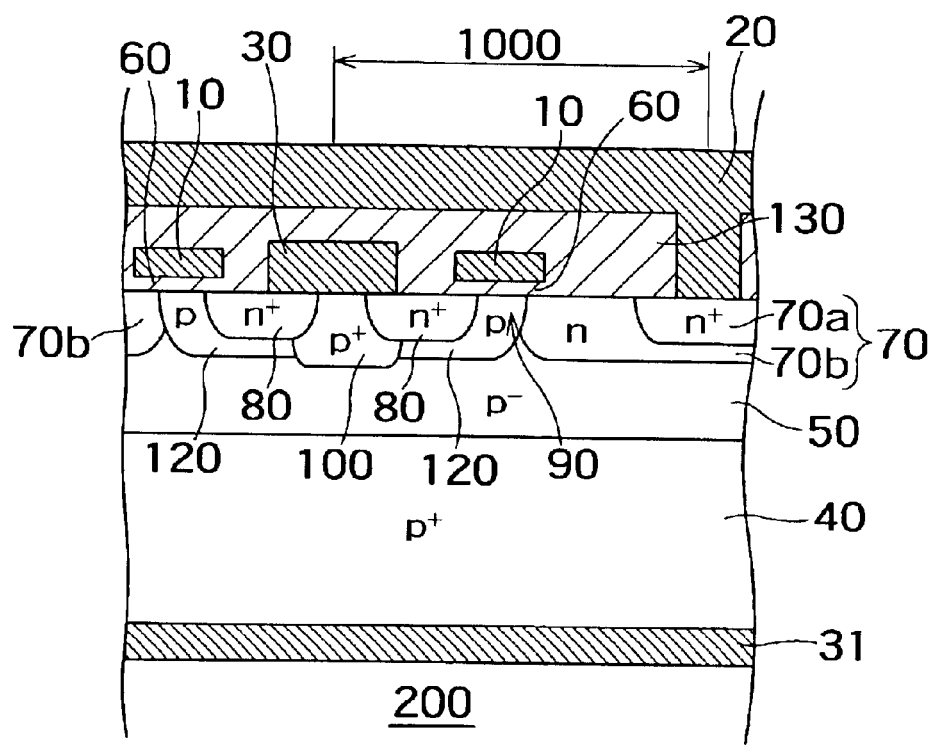
FIG. 2 is an enlarged cross-sectional view taken along the line 2–2' of FIG. 1.

FIG. 2 is an enlarged cross-sectional view that shows a section of the semiconductor device according to the first embodiment of the invention, taken along the line 2–2' of FIG. 1.

Figure 3:
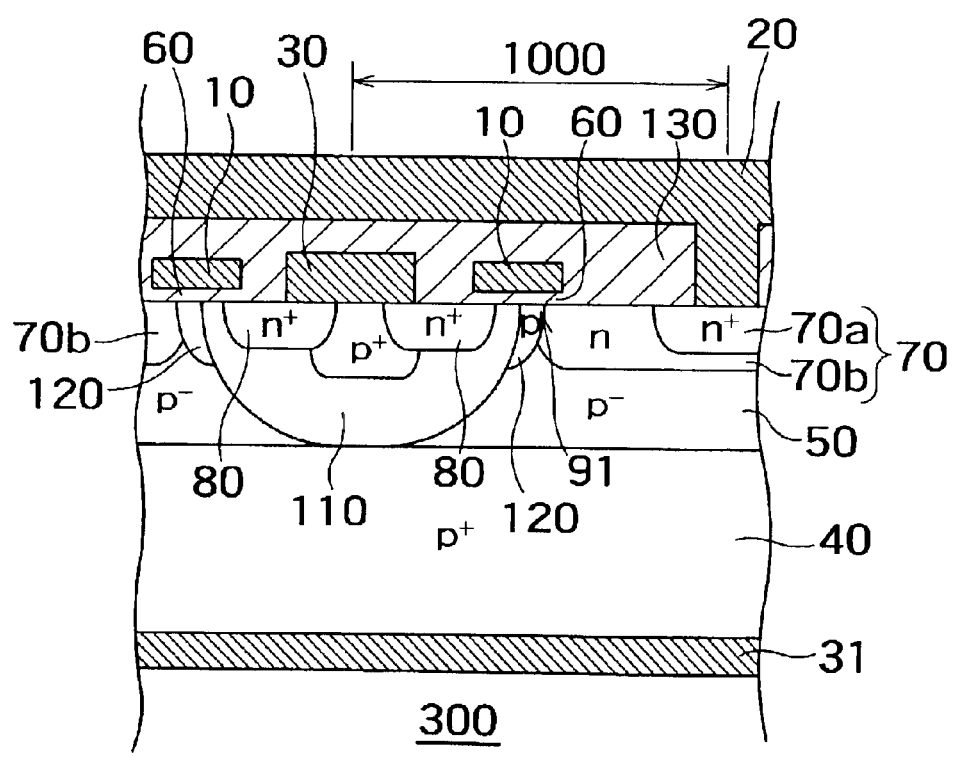
FIG. 3 is an enlarged cross-sectional view taken along the line 3–3' of FIG. 1.

FIG. 3 is an enlarged cross-sectional view that shows a section of the semiconductor device according to the first embodiment of the invention, taken along the line 3–3' of FIG. 1.

The semiconductor device according to the instant embodiment includes a p$^+$-type semiconductor substrate 40; p$^-$-type semiconductor layer 50 higher in resistance than the semiconductor substrate 40 and formed on the semiconductor substrate 40; gate electrodes 10 formed on a gate insulating film 60 on the surface of the semiconductor layer 50, n-type drain layer 70 selectively formed in a location of the semiconductor layer 50 in one side of each gate electrode 10; drain electrode 20 connected to the drain layer 70; n$^+$-type source layer 80 selectively formed in another location of the semiconductor layer 50 in the other side of each gate electrode 10; an element-side connecting portion 100 (see FIG. 2) adjacent to the source layer 80, having a lower resistance than that of the semiconductor layer 50 and selectively formed in the semiconductor layer 50, which does not reach a channel portion 90 of the semiconductor layer 50 between the source layer 80 and the drain layer 70 and also does not reach the substrate 40; contact-side connecting portion 110 (see FIG. 3) adjacent to the element-side connecting portion 100, having a lower resistance than that of the semiconductor layer 50 and selectively formed in the semiconductor layer 50, and reaching the semiconductor substrate 40; source electrode 30 connected to the source layer 80, element-side connecting portion 100 and contact-side connecting portion 110; and source electrode 31 connected to the bottom surface of the semiconductor substrate 40.

A semiconductor substrate of GaAs or SiC, for example, may be used as the semiconductor substrate 40.

The semiconductor device according to the instant embodiment further includes a p-type base layer 120 made in form of a tap around the source layer 80 and diffused into the channel portion 90 to determine the threshold voltage of the semiconductor device. The drain layer 70 has an n$^+$-type contact portion 70a which contacts ohmically contact with the drain electrode 20, and a field buffering portion 70b for raising the withstanding voltage between the source electrode 30 and the drain electrode 20. The gate electrode 10, drain electrode 20 and source electrode 30 are insulated from each other by an insulating element 130 such as an oxide film like SiO$_2$, for example.

The drain layer 70, source layer 80 and base layer 120 used in this embodiment are diffusion layers. The diffusion layers are formed, for example, by selectively implanting impurities into the semiconductor layer 50 by means of a photolithography process and thereafter diffusing the impurities in an annealing process. Also in case the element-side connecting portion 100 and the contact-side connecting portion 110 are diffusion layers, they are formed in substantially the same manner.

The contact-side connecting portion 110 is made around the source layer 80 in form of a tub surrounding this source layer 80. The bottom electrode 31 is connected to the source electrode 30 via the contact-side connecting portion 110 to serve as the second source electrode 31.

According to this embodiment, impurity concentration of the p$^+$-type contact-side connecting portion 110 is higher than impurity concentrations of the p-type semiconductor layer 50 and the p-type base layer 120. Therefore, resistance of the contact-side connecting portion 110 is lower than resistances of the semiconductor layer 50 and the base layer 120.

For simplicity, among semiconductor devices according to the instant embodiment, the portion including the element-side connecting portion 100 shown in FIG. 2 is referred to as an element-side semiconductor device 200 whereas the portion including the contact-side connecting portion 110 shown in FIG. 3 is referred to as a contact-side semiconductor device 300.

Figure 4:
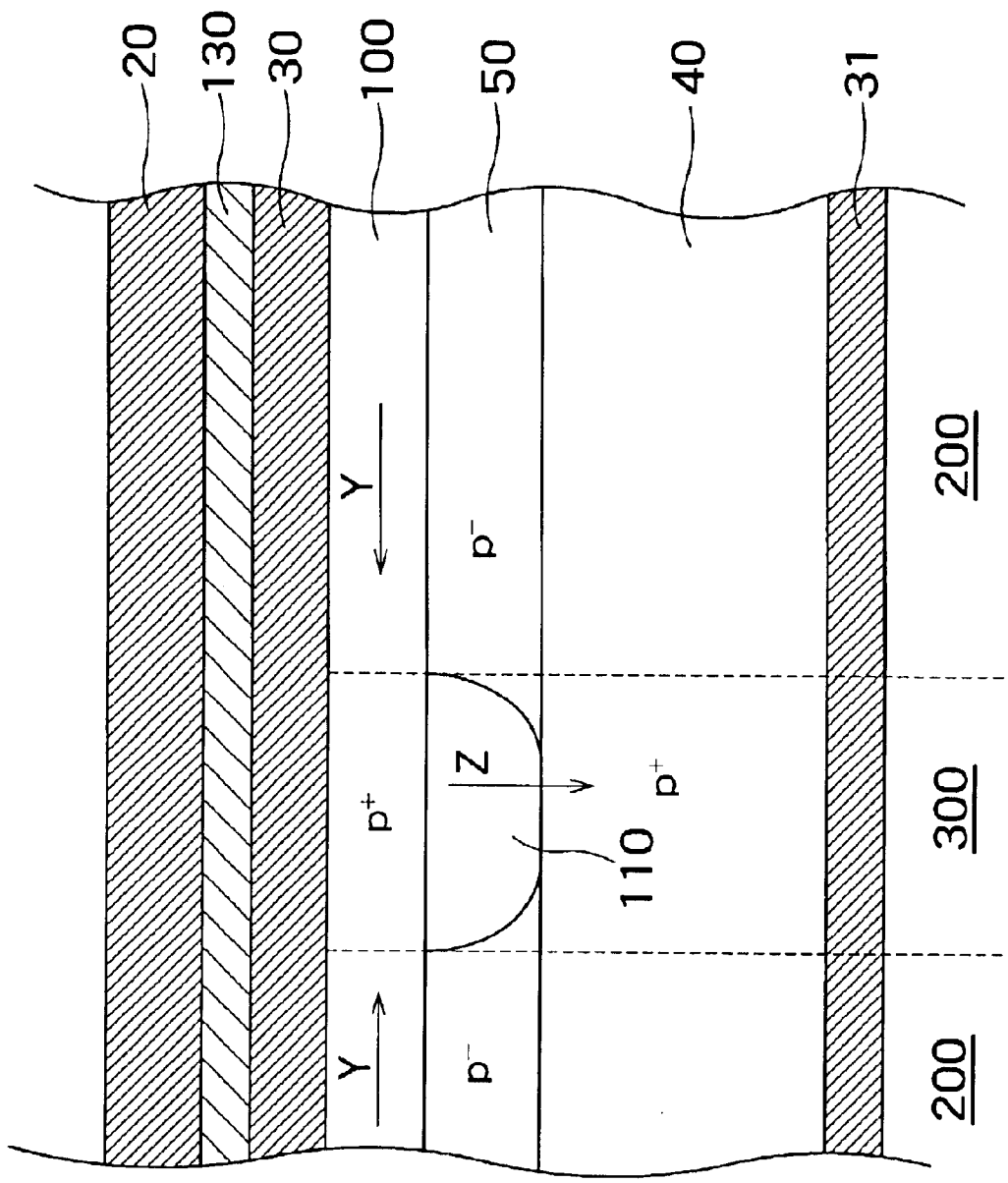
FIG. 4 is an enlarged cross-sectional view taken along the line 4–4' of FIG. 1.

FIG. 4 is an enlarged cross-sectional view of a semiconductor device according to the instant embodiment shown in FIG. 1, taken along the line 4–4' of FIG. 1. FIG. 4 shows the semiconductor device according to the embodiment, sectioning it by a broken line into the part of the element-side semiconductor device 100 and the part of the contact-side semiconductor device 300.

In the part of the element-side semiconductor device 200, the element-side connecting portion 100 does not reach the semiconductor substrate 40. In contrast, in the part of the contact-side semiconductor device 300, the contact-side connecting portion 110 is widely diffused and reaches the semiconductor substrate 40. The element-side connecting portion 100 and the contact-side connecting portion 110 are adjacent to each other, and have a specific resistance approximately equal to that of the semiconductor substrate 40. The element-side connecting portion 100 and the contact-side connecting portion 110 are formed as a unitary body. In this embodiment, a plurality of element-side connecting portions 100 and a plurality of contact-side connecting portions 110 are aligned in a regularly alternate order to form a straight line.

As shown in FIGS. 1 through 4, in the instant embodiment, a plurality of element-side connecting portions 100 are formed to extend straight. The contact-side connecting portions 110 are formed to intervene between element-side connecting portions 100 and adjacent to element-side connecting portions 100, or in other words, which are formed to overlap the element-side connecting portions 100. On the cross section perpendicular to the line of the element-side connecting portions 100, the contact-side connecting portions 110 are diffused more widely and more deeply than the element-side connecting portions 100.

Next explained are operations of the semiconductor device according to the embodiment. When the semiconductor device is ON, a predetermined voltage is applied to the gate electrode 10. As a result, the channel portion 90 under the gate electrode 10 is reversed, and the drain electrode 20 and the source electrode 30 become conductive.

The gate electrodes 10 in FIGS. 2 and 3 are applied with an equal voltage. In FIG. 2, however, since the element-side connecting portion 100 does not reach the channel portion 90, the channel portion 90 mainly consists of the base layer 120. Therefore, the threshold voltage of the channel portion 90 is mainly determined by the impurity concentration of the base layer 120. In contrast, in FIG. 3, since the contact-side connecting portion 110 reaches the channel portion 91, the channel portion 91 is mainly made up of the base layer 120 and the contact-side connecting portion 110. Therefore, impurity concentration of the channel portion 91 of the contact-side semiconductor device 300 is higher than the impurity concentration of the channel portion 90 of the element-side semiconductor device 200. Therefore, the contact-side threshold voltage of the contact-side semiconductor device 300 is higher than the element-side threshold voltage of the element-side semiconductor device 200.

In the instant embodiment, a voltage not lower than the element-side threshold voltage and not higher than the contact-side threshold voltage is enough as the gate voltage to be applied to the gate electrode 10. Since the gate electrodes 10 in the element-side semiconductor device 200 and the contact-side semiconductor device 300 are applied with an equal voltage, the element-side semiconductor device 200 turns ON, whereas the contact-side semiconductor device 300 remains the OFF state. As a result, the semiconductor device can supply a current under a relatively low gate voltage without the need of a high gate voltage enough to turn ON the element-side semiconductor device 200 and the contact-side semiconductor device 300. Because the gate voltage necessary for switching is low, the switching speed increases. Therefore, the semiconductor device according to the embodiment can deal with inputs of high frequencies.

In addition to the element-side semiconductor device 200, the contact-side semiconductor device 300 may be also turned ON by setting the gate voltage higher than the contact-side threshold voltage. If the contact-side semiconductor device 300 also turns ON, then the ON resistance of the semiconductor device decreases as compared to the state where only the element-side semiconductor device 200 is ON. In the ON state, however, resistance of the channel portion 91 of the contact-side semiconductor device 300 is higher than the resistance of the channel portion 90 of the element-side semiconductor device 200. Therefore, almost all of the current flowing in the semiconductor device flows in the channel portion 90 of the element-side semiconductor device 200.

The threshold voltage of the semiconductor device according to the instant embodiment is mainly adjusted by the base layer 120, and does not depend on the element-side connecting portion 100 and the contact-side connecting portion 110. Therefore, fluctuation of the threshold voltage among wafers or lots becomes small.

Once the element-side semiconductor device 200 turns ON, a current flows from the drain layer 70 via the channel portion 90 to the source layer 80. Thereafter, the current flows from the source layer 80 to the source electrode 30. The current still flows from the source electrode 30 to the contact-side connecting portion 110. Alternatively, this current flows from the source electrode 30 to the element-side connecting portion 100 and then to the contact-side connecting portion 110. The current having flown to the contact-side connecting portion 110 flows through the semiconductor substrate 40 to the source electrode 31.

That is, the current flows in the element-side semiconductor device 200 through the channel portion 90 from the drain layer 70 toward the source layer 80 (in the direction marked with the arrow X in FIG. 1). After that, it flows in the source electrode or the element-side connecting portion 100 in the different direction from the arrow-X direction, namely from the element-side connecting portion 100 toward the contact-side connecting portion 110 (in the direction marked with the arrow Y in FIG. 1). In case of the instant embodiment, the arrow-Y direction is approximately perpendicular to the arrow-X direction. The current further flows from the source electrode 30 or the element-side connecting portion 100 to the contact-side connecting portion 110, and then from the contact-side connecting portion 110 toward the source electrode 31 (in the direction marked with the arrow Z in FIG. 4). In case of this embodiment, the arrow-Z direction is approximately perpendicular to the arrow-Y direction and the arrow-X direction.

In the conventional device, the channel is formed throughout the channel portion 2130, and a current flows. In this embodiment, almost no current flows in the channel portion 91 of the contact-side semiconductor device 300 even when a predetermined threshold voltage is applied to the gate electrode 10. Therefore, the total channel width of the semiconductor device becomes narrower than that of the conventional device as much as the channel width of the channel portion 91 in the contact-side semiconductor device 300. When the total channel width becomes narrower, the ON resistance undesirably increases.

However, the element-side connecting portion 100 of the semiconductor device according to the embodiment need not diffuse up to the semiconductor substrate 40. Therefore, the lateral width toward the channel portion 90 of the element-side connecting portion 100 is smaller than that of the contact-side connecting portion 110 or the connect-layer 2160 of the conventional device. Therefore, even when the interval between electrodes or interval between diffusion layers is narrowed to downsize the semiconductor device, the element-side connecting portion 100 does not reach the channel portion 90. As a result, the threshold voltage of the semiconductor device according to the embodiment does not rise because of the downsizing of the semiconductor device, and downsizing of the semiconductor does not invite any problems. That is, according to this embodiment, more unit cells of semiconductor elements or more element units can be formed in a given area. Therefore, the channel width of MOSFET increases, and the ON resistance decreases accordingly. Additionally, downsizing the semiconductor device contributes to lowering its manufacturing cost.

Thus the rise of the ON resistance by the existence of the contact-side semiconductor device 300 and the decrease of the ON resistance by downsizing of the semiconductor device are in a trade-off relation.

The ON resistance of the semiconductor device according to the embodiment decreases depending on the ratio of areas occupied by the element-side semiconductor device 200 and areas occupied by the contact-side semiconductor device 300.

For example, if the ratio between the areas for forming the element-side semiconductor device 200 and the areas for forming the contact-side semiconductor device 300 is 19:1, then the total channel width diminishes by approximately 5%, and the channel resistance increases by approximately 5%. In the semiconductor device according to the embodiment, a part of the connect layer is uses as the contact-side connecting portion 110, and the other part thereof is used as the element-side connecting portion 100. Therefore, resistance between the MOSFET and the semiconductor substrate in the instant embodiment is higher than the resistance between MOSFET and the semiconductor substrate in the conventional device. Therefore, the rising ratio of the ON resistance of the semiconductor device according to the embodiment, which is the sum of the rising ratio of the channel resistance caused by a decrease of the total channel width and the rising ratio of the resistance between MOSFET and the semiconductor substrate will be normally about 20%.

On the other hand, the contraction ratio due to formation of the element-side semiconductor device 200 can be limited within 75% approximately. Taking account of approximately 20% as the rising ratio of the ON resistance of the semiconductor device according to the embodiment, the ON resistance in a given area of this embodiment amounts to 1.2×0.75=0.9 times the ON resistance in a given area of the conventional device. Therefore, the ON resistance of the embodiment decreases from the ON resistance of the conventional device by approximately 10%.

Under the recent circumstances where semiconductor devices tend to be more and more downsized, it is a great advantage that the ON resistance can be decreased even when the semiconductor device is downsized.

In the conventional device, the connect layer 2160 was not distinguished as the element-side connecting portion 100 and the contact-side connecting portion 110, and the element-side connecting portion was similarly diffused to reach the semiconductor substrate.

As already explained, resistance between MOSFET and the semiconductor substrate in the instant embodiment is higher than the resistance between MOSFET and the semiconductor substrate in the conventional device.

However, the ON resistance of the semiconductor device is most influenced by the resistance of the channel portion 90. In the semiconductor device according to the embodiment, the entire length of the channel portion 90 increases due to downsizing of the semiconductor device or the unit cell, and the channel resistance decreases as a whole. Therefore, the ON resistance of the entire semiconductor device according to the embodiment decreases.

When the semiconductor device is switched from ON to OFF or from OFF to ON, a large voltage derived from inductance, for example, may be applied to the source and the drain.

The contact-side connecting portion 110 of the semiconductor device according to the embodiment surrounds the source layer 80, and the resistance of the contact-side connecting portion 110 is lower than the resistances of the semiconductor layer 50 and the base layer 120.

Therefore, the avalanche current between the source and the drain can readily flow through the contact-side connecting portion 110 immediately under the source layer 80, and the potential difference between the source layer 80 and the contact-side connecting portion 110 is small. As a result, the junction between the source layer 80 and the contact-side connecting portion 110 is not biased forward. Thus the semiconductor device is not destructed by an excessive current, and device breakdown by L-load switching does not occur.

In order to prevent device breakdown by L-load switching, it is effective to prevent avalanche breakdown between the source and the drain of the element-side semiconductor. Thus the withstanding voltage between the source and the drain of the contact-side semiconductor device 300 is preferably lower than the withstanding voltage between the source and the drain of the element-side semiconductor device 200.

The semiconductor device according to the embodiment can be manufactured by merely changing the mask of the element-side connecting portion 100 and the contact-side connecting portion 110 in the conventional process.

Figure 5:
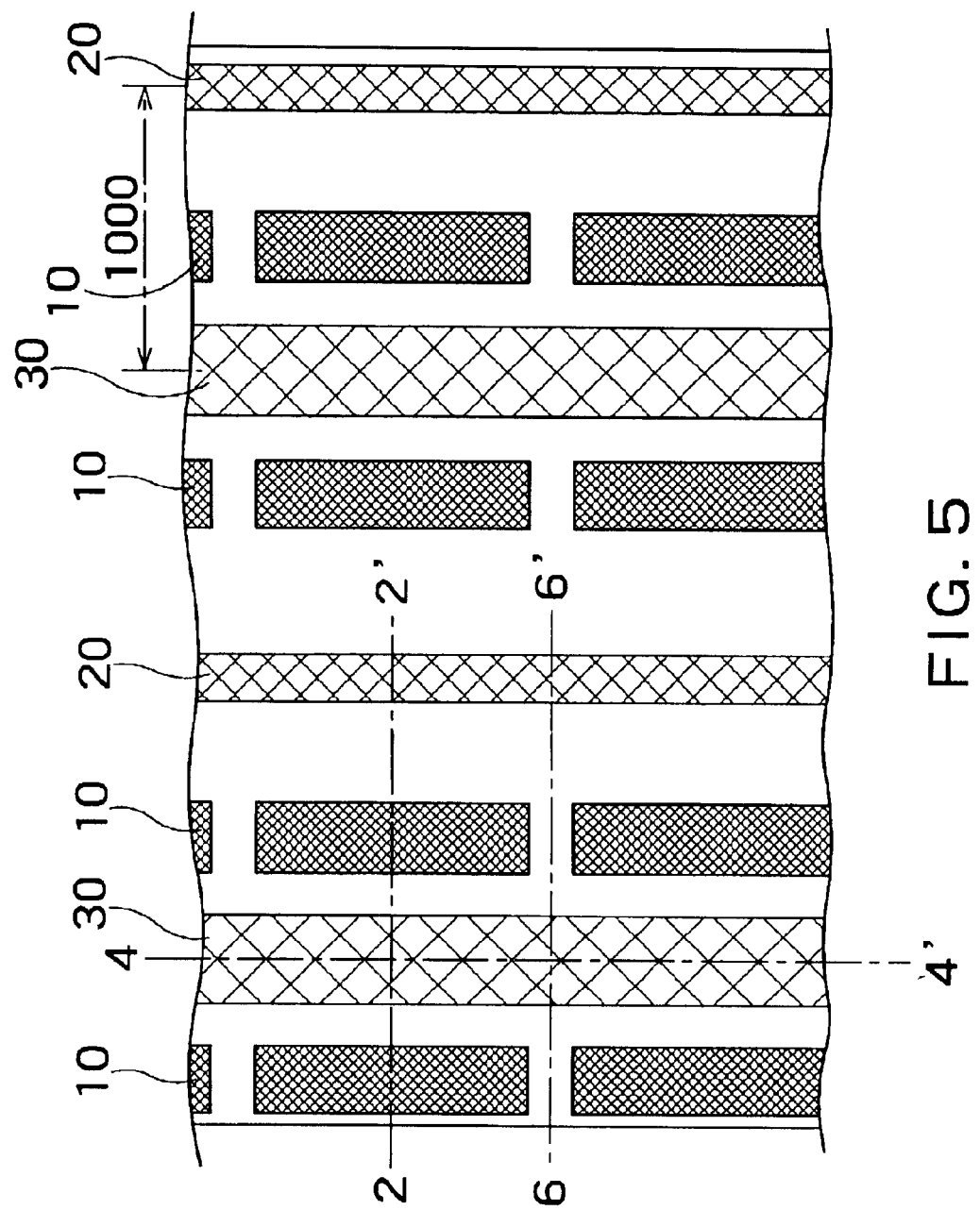
FIG. 5 is an enlarged schematic plan view of a part of a semiconductor device according to the second embodiment of the invention.

FIG. 5 is an enlarged schematic plan view of a part of a semiconductor device according to the second embodiment of the invention.

Figure 6:
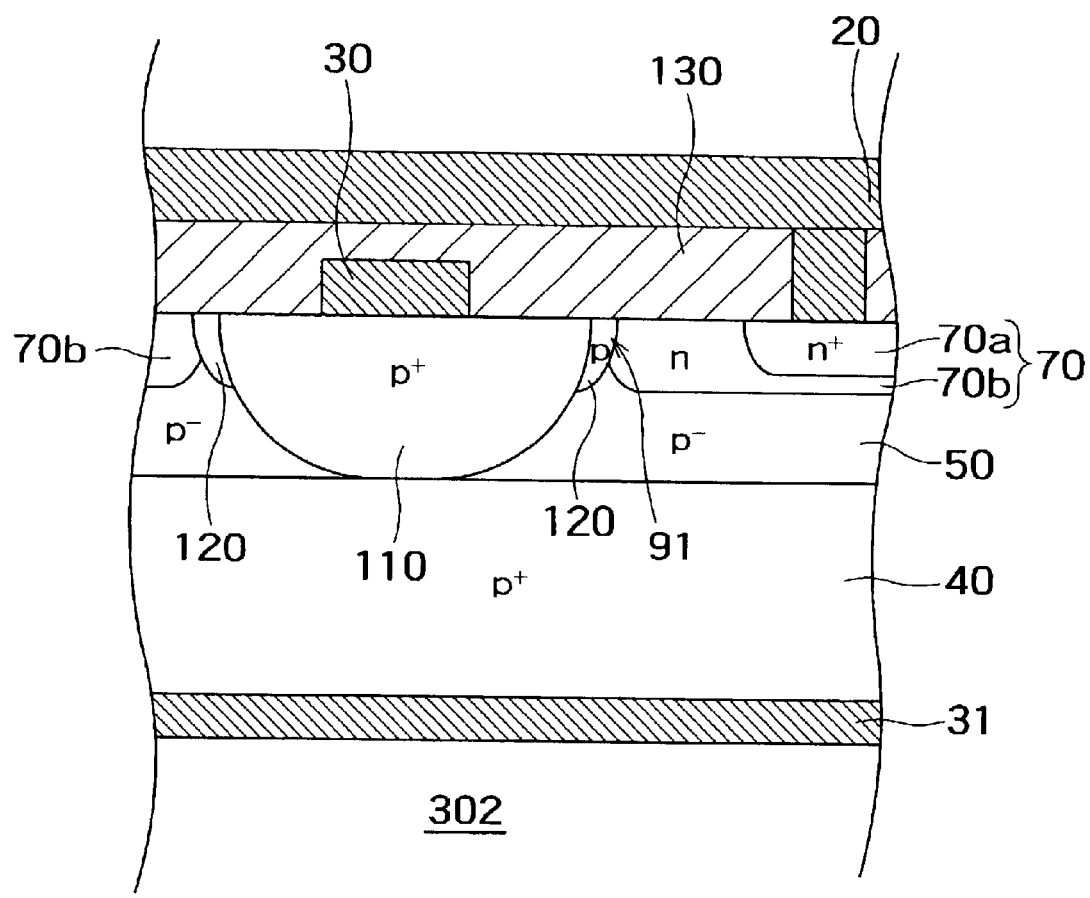
FIG. 6 is an enlarged cross-sectional view taken along the line 6–6' of FIG. 5.

FIG. 6 is an enlarged cross-sectional view taken along the line 6–6' of FIG. 5. The cross-sectional view taken along the line 2–2' of FIG. 5 is the same as that shown in FIG. 2.

The semiconductor device according to this embodiment includes the element-side semiconductor device 200 (see FIG. 2) and the contact-side semiconductor device 302 (see FIG. 6). The element-side semiconductor device 200 has the gate electrode 10, but the contact-side semiconductor device 302 has no gate electrode. The cross-sectional view taken along the line 4–4' is the same as FIG. 4.

In the semiconductor device according to the invention, the contact-side semiconductor device need not turn ON. Therefore, the contact-side semiconductor device 302 needs no gate electrode. Because no gate electrode is formed in the contact-side semiconductor device 302, the electrostatic capacitance of the entire gate electrodes 10 or the drain-gate capacitance (feedback capacitance) decreases. Therefore, the switching speed of the semiconductor device is higher.

Figure 25B:
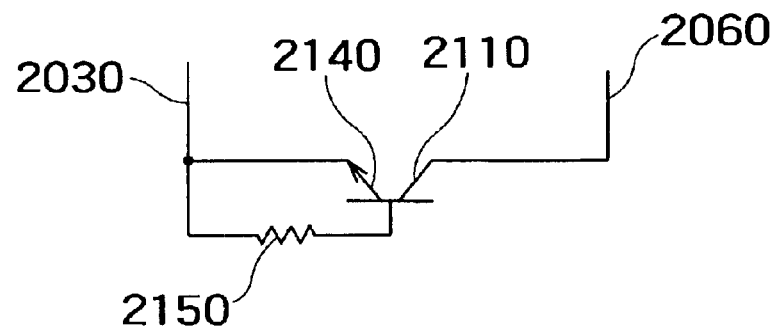
Figure 26:
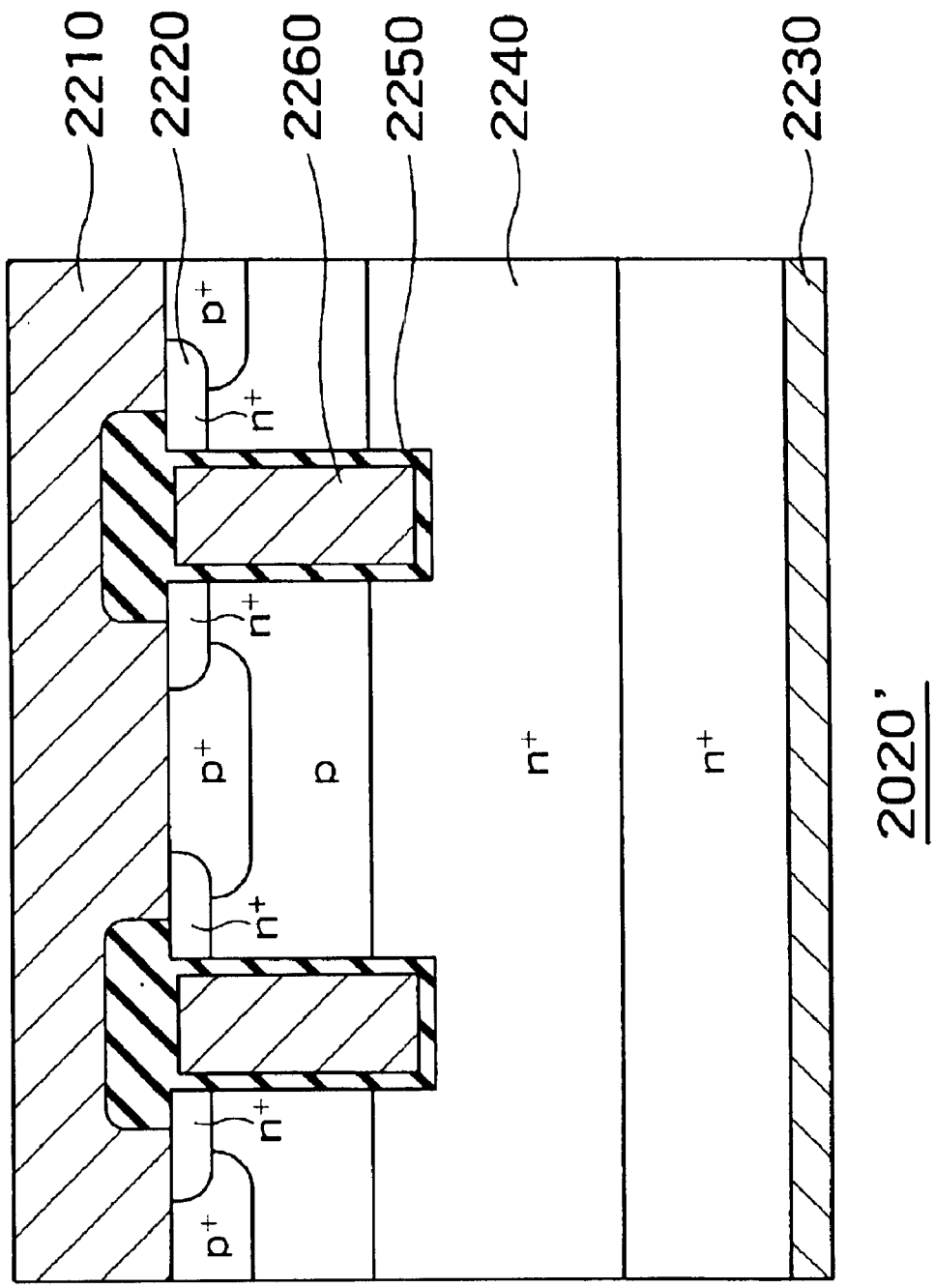
FIG. 26 is an enlarged cross-sectional view of another conventional switching power MOSFET 2020.

Furthermore, the contact-side semiconductor device 302 has no source layer. Therefore, the parasitic bipolar transistor in the conventional device as shown in FIGS. 25A and 25B is not formed. In the contact-side semiconductor device 302, a diode is made up of the drain layer 70 and the base layer 120 between the drain electrode 20 and the source electrode 30 or 31.

In the semiconductor device according to the instant embodiment, the withstanding voltage of the diode formed between the drain electrode 20 and the source electrode 30 in the contact-side semiconductor device 302 is lower than the withstanding voltage of the parasitic bipolar transistor formed between the drain electrode 20 and the source electrode 30 in the element-side semiconductor device 200. As a result, even when an excessive power is supplied between the drain electrode 20 and the source electrode 31 of the semiconductor device, almost all current flows to the diode formed in the contact-side semiconductor device 302. Therefore, device breakdown by L-load switching does not occur, and the semiconductor device is not destructed.

Figure 7:
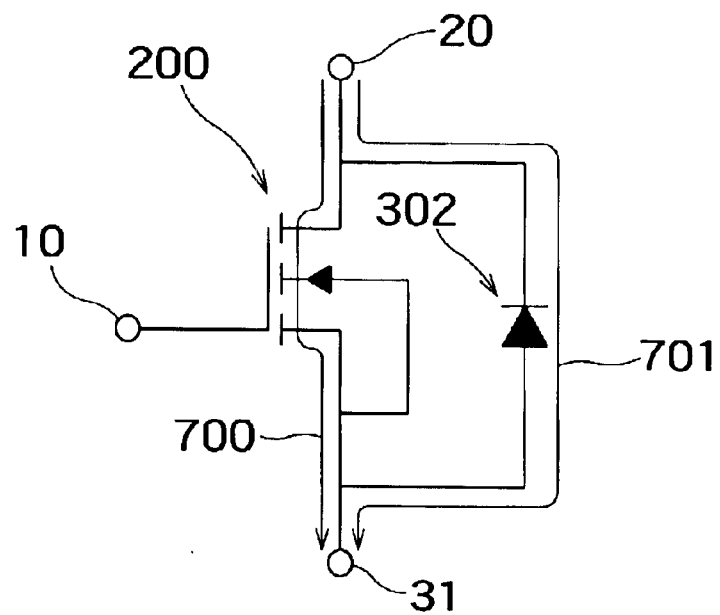
FIG. 7 is an equivalent circuit diagram that shows connection among a gate electrode, drain electrode and source electrode in the second embodiment.

FIG. 7 is an equivalent circuit diagram that shows connection among the gate electrode 10, drain electrode 20 and source electrode 31 in the second embodiment.

Figure 8:
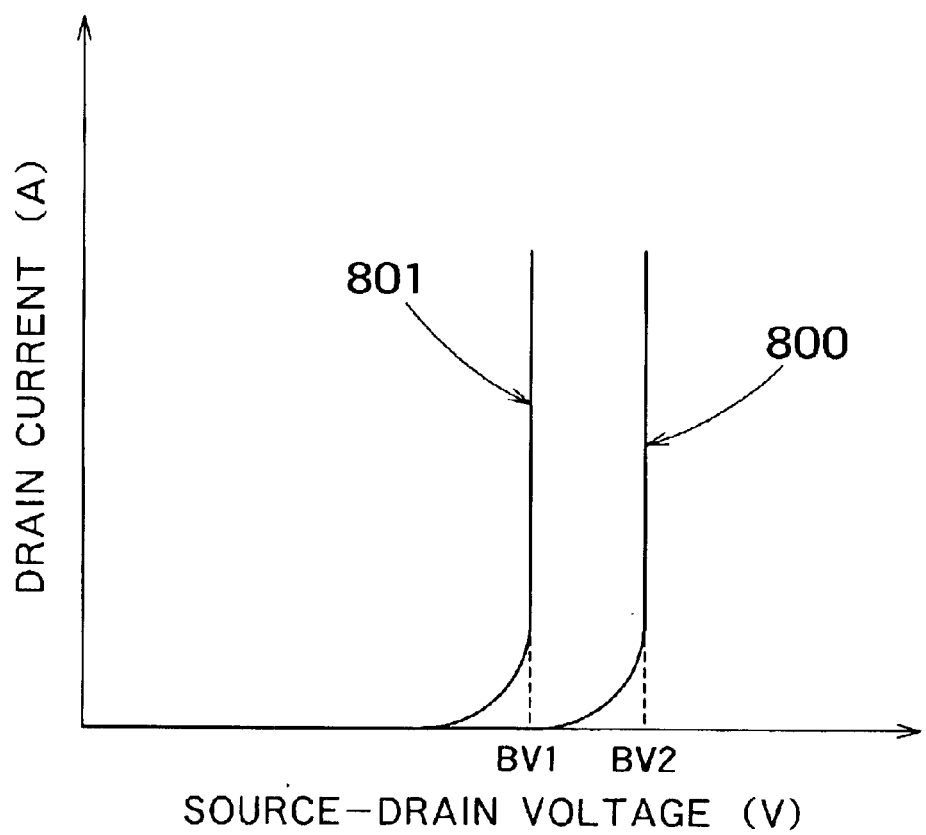
FIG. 8 is a graph that shows, in comparison, the source-drain withstanding voltage of a contact-side semiconductor device and the source-drain withstanding voltage of a element-side semiconductor device.

FIG. 8 is a graph that shows, in comparison, the source-drain withstanding voltage 801 of the contact-side semiconductor device and the source-drain withstanding voltage 800 of the element-side semiconductor device. The withstanding voltage 801 has a lower voltage than the withstanding voltage 800.

Therefore, when the semiconductor device is ON under application of a predetermined voltage to the gate electrode 10, the current flows in the element-side semiconductor device 200 between the drain electrode 20 and the source electrode 31 as shown by the arrow 700.

When excessive current flows between the drain electrode 20 and the source electrode 31, the current flows in the contact-side semiconductor device 302 between the drain electrode 20 and the source electrode 31 as shown by the arrow 701.

Because of the existence of the contact-side semiconductor device 302, when the semiconductor device is switched from ON to OFF or from OFF to ON, the power between the drain electrode 20 and the source electrode 31 does not concentrate to the element-side semiconductor device 200, and the element-side semiconductor device 200 is not destructed.

Figure 9:
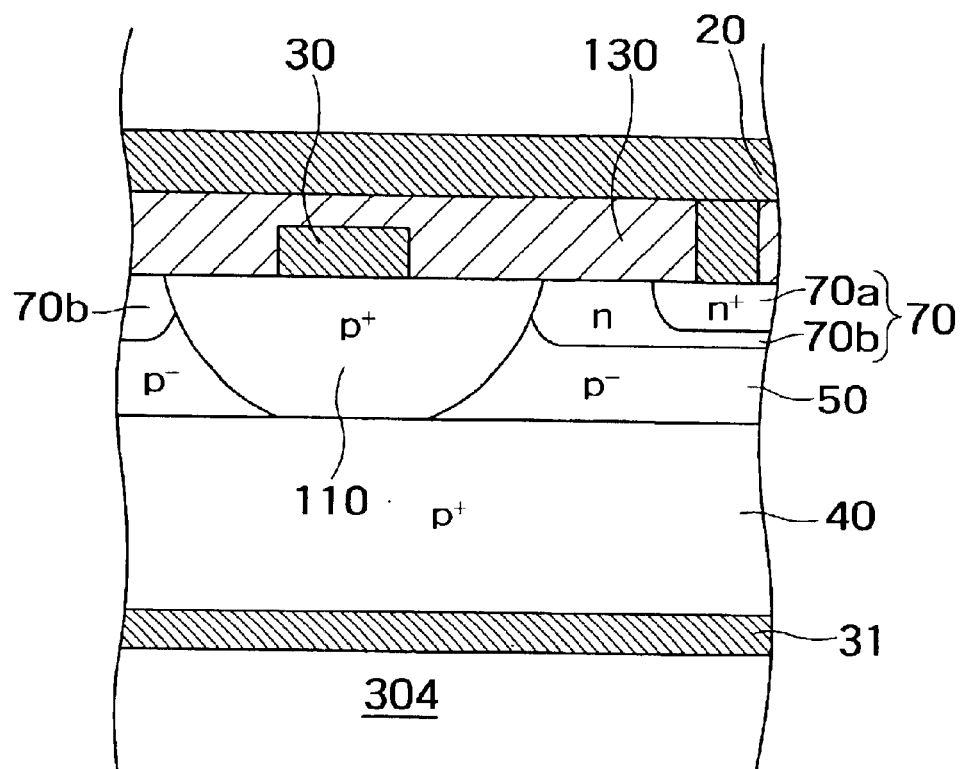
FIG. 9 is an enlarged schematic plan view of a part of a semiconductor device according to the third embodiment of the invention.

FIG. 9 is an enlarged schematic plan view of a part of a semiconductor device according to the third embodiment of the invention. In this embodiment, the element-side semiconductor device is same as the element-side semiconductor device 200 of FIG. 2, whereas the contact-side semiconductor device 304 is different from the second embodiment shown in FIG. 6 in that the p-type base layer 120 is not formed in the contact-side semiconductor device 304.

The p$^+$-type contact-side connecting portion 110 having a higher impurity concentration is formed adjacent to the field buffering portion 70$b$. As a result, the diode between the drain electrode 20 and the source electrode 30 of the contact-side semiconductor device 304 is made up of the p+-type contact-side connecting portion 110 and the field buffering portion 70b, and the withstanding voltage is lower. Therefore, the withstanding voltage of the diode between the drain electrode 20 and the source electrode 30 of the contact-side semiconductor device 304 is not higher than the withstanding voltage of the npn bipolar transistor between the drain electrode 20 and the source electrode 30 of the element-side semiconductor device 200.

In the field buffering portion 70b, an n-type impurity in the amount of approximately $1 \times 10^{12}$ cm$^{-2}$ to $5 \times 10^{12}$ cm$^{-2}$ preferably exists as the substantial impurity amount that is the quantity deducting the quantity of the p-type impurity from the quantity of the n-type impurity. In this case, the depletion layer can easily extend in the field buffering portion 70b, and an adequate value of resistance can be maintained in the field buffering portion 70b.

According to the embodiment, lateral width of the diffusion layer of the field buffering portion 70b is not different between the element-side semiconductor device 200 and the contact-side semiconductor device 304. Therefore, the photo mask used for forming the field buffering portion 70b of the conventional device need not be changed.

Figure 10:
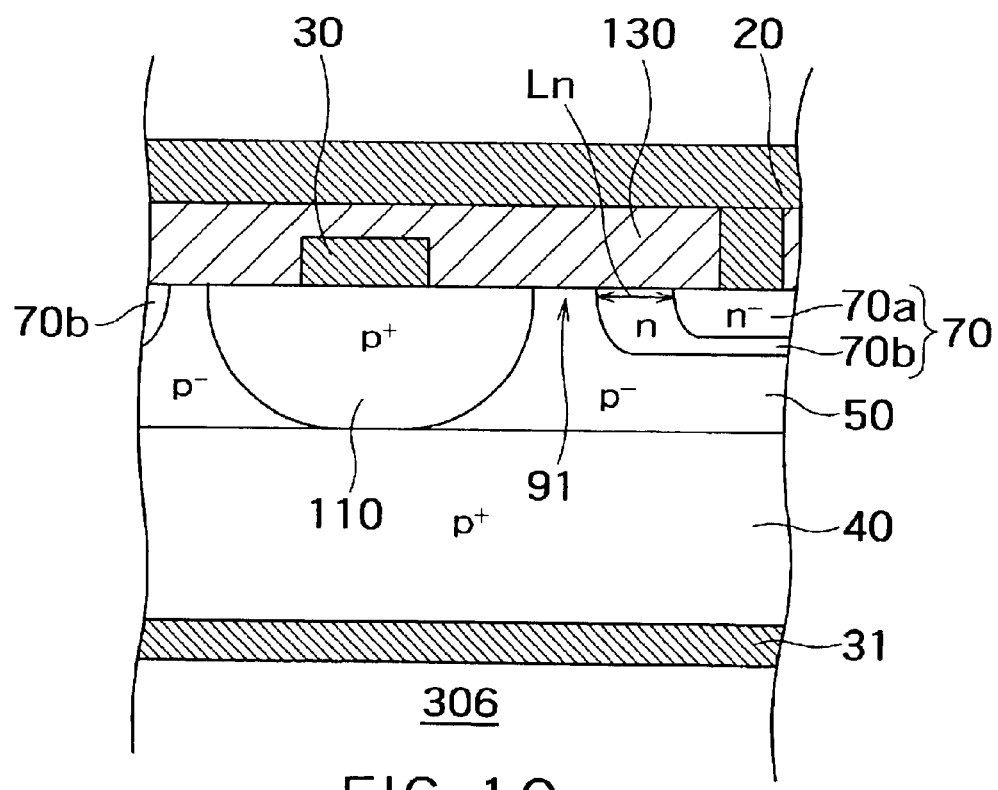
FIG. 10 is an enlarged schematic plan view of a part of a semiconductor device according to the fourth embodiment of the invention.

FIG. 10 is an enlarged schematic plan view of a part of a semiconductor device according to the fourth embodiment of the invention. In this embodiment, the element-side semiconductor device is same as the element-side semiconductor device 200 of FIG. 2, whereas the contact-side semiconductor device 306 is different from the second embodiment shown in FIG. 6 in the lateral width (length) Ln of the field buffering portion 70b that extends from a perimeter of the contact portion 70a of the contact-side semiconductor device 306. That is, lateral width Ln of the field buffering portion 70b of the contact-side semiconductor device 306 to the channel portion 91 is smaller than that of the field buffering portion 70b of the element-side semiconductor device 200. Therefore, when a voltage is applied to the drain electrode 20, extension of the depletion layer in the field buffering portion 70b of the contact-side semiconductor device 306 is smaller than that of the element-side semiconductor device 200. Thereby, the withstanding voltage of the diode between the drain electrode 20 and the source electrode 30 of the contact-side semiconductor device 306 is lowered than the withstanding voltage of the npn bipolar transistor between the drain electrode 20 and the source electrode 30 of the element-side semiconductor device 200.

Figure 11:
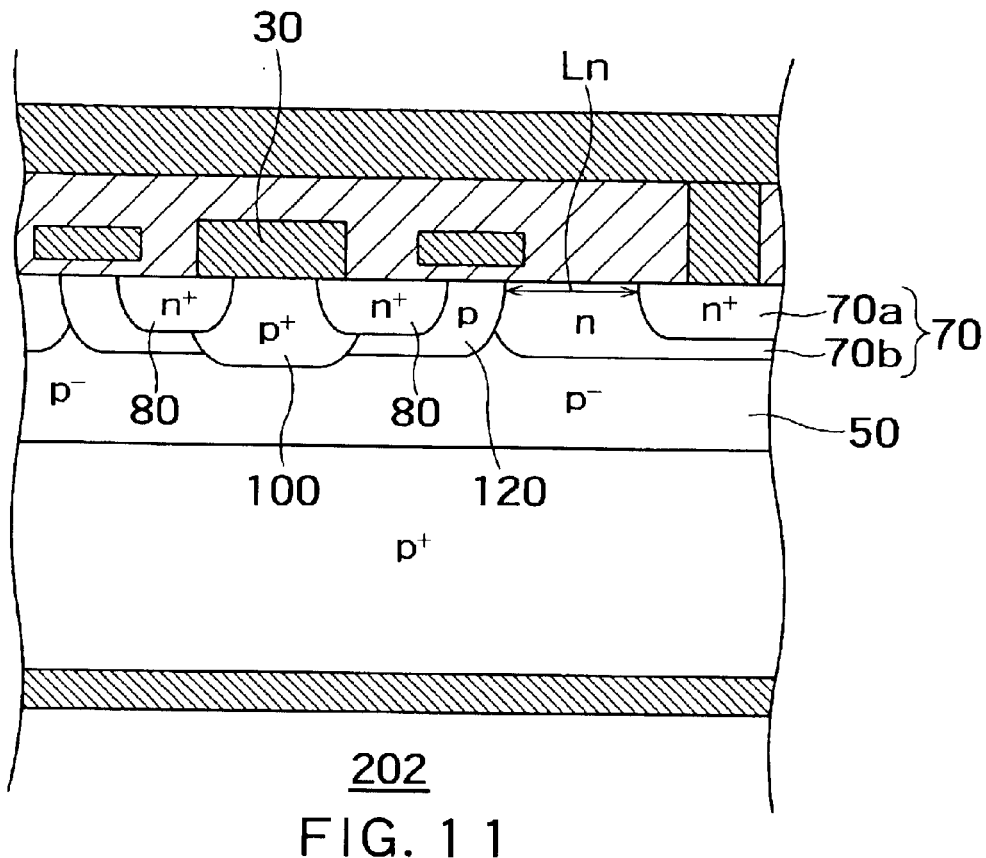
FIG. 11 is an enlarged cross-sectional view of an element-side semiconductor device according to the fifth embodiment using a metal plug as a contact-side connecting portion.
Figure 12:
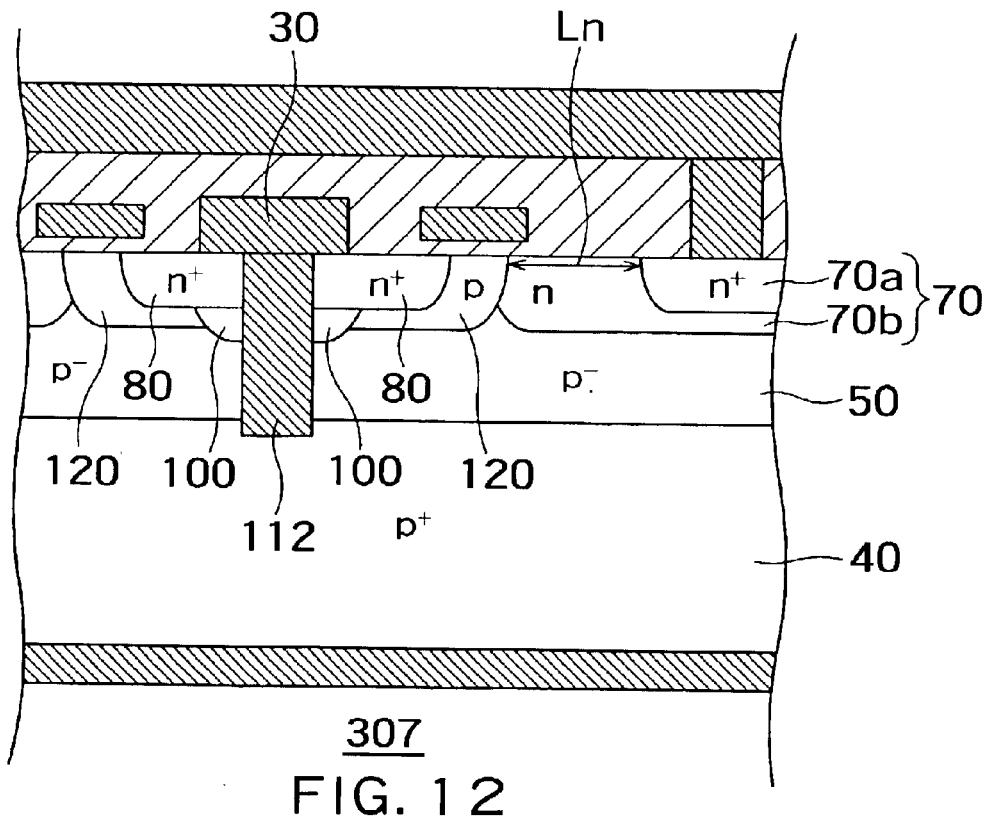
FIG. 12 is an enlarged cross-sectional view of a contact-side semiconductor device according to the fifth embodiment using a metal plug as the contact-side connecting portion.

FIGS. 11 and 12 are cross-sectional views of an element-side semiconductor device according to the fifth embodiment using a metal plug as a contact-side connecting portion. FIG. 11 corresponds to the section taken along the line 2–2' of FIG. 5 whereas FIG. 12 corresponds to the section taken along the line 6–6' of FIG. 5. The contact-side connecting portion 112 shown in FIG. 12 is a metal plug 112. The contact-side connecting portion 112 is in electrical contact with the source electrode 30 and the semiconductor substrate 40. Therefore, the metal plug 112 has the same function as that of the contact-side connecting portion 110 according to the first to fourth embodiment, which is made up of a p+-type diffusion layer.

Since the metal plug 112 has a lower resistance than the diffusion layer, the ON resistance of the semiconductor device decreases. In addition, since the metal plug 112 need not be diffused, the contact-side connecting portion can be made in a narrower region than the diffusion layer. Therefore, the semiconductor device using the metal plug 112 as the contact-side connecting portion has a lower ON resistance than the semiconductor device using the diffusion layer, and can be downsized.

However, the contact-side semiconductor device 307 shown in FIG. 12 includes a contact portion 70a, field buffering portion 70b and base layer 120 that are substantially the same as those of the element-side semiconductor device 202 of FIG. 11. Therefore, the source-drain withstanding voltage of the contact-side semiconductor device 307 is approximately equal to the source-drain withstanding voltage of the element-side semiconductor device 202. As a result, in case the power semiconductor device is a combination of the contact-side semiconductor device 307 and the element-side semiconductor device 202, device breakdown by L-load switching cannot be prevented.

Figure 13A:
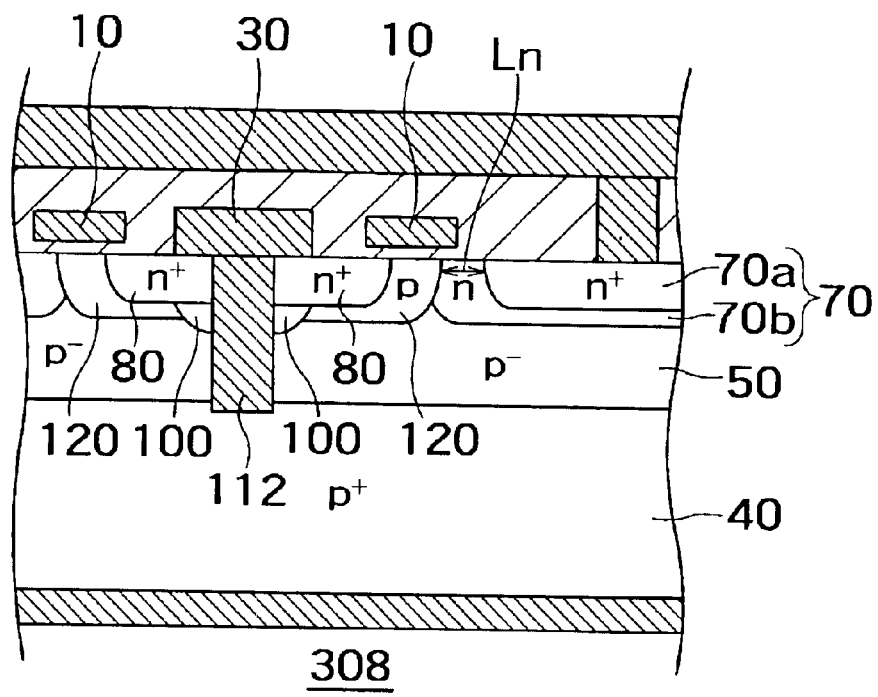
FIGS. 13A and 13B are cross-sectional views of modifications of the contact-side semiconductor device according to the fifth embodiment using the metal plug as shown in FIG. 11 or FIG. 12.
Figure 13B:
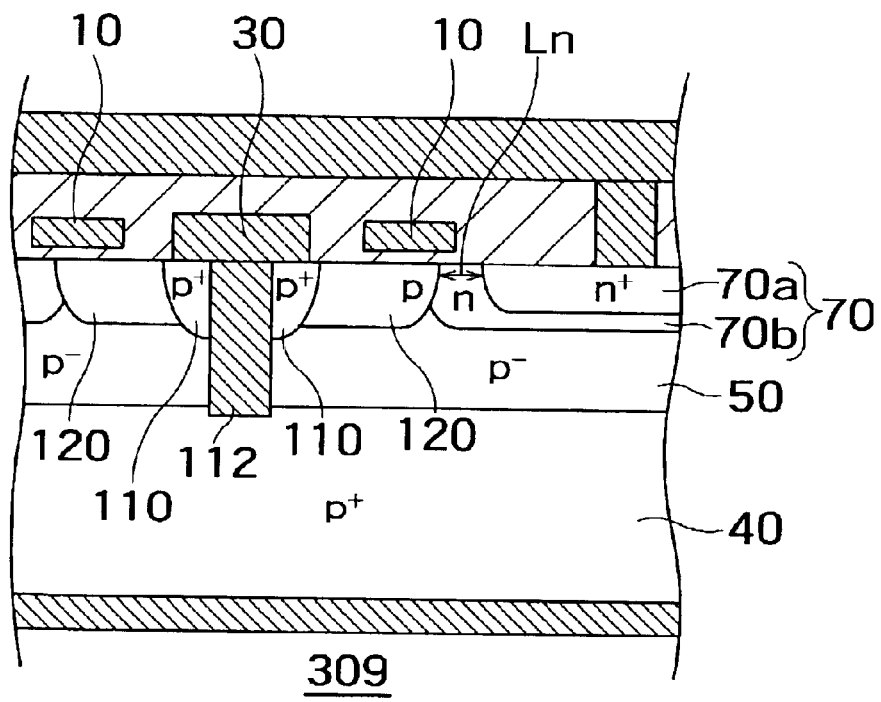
Figure 14A:
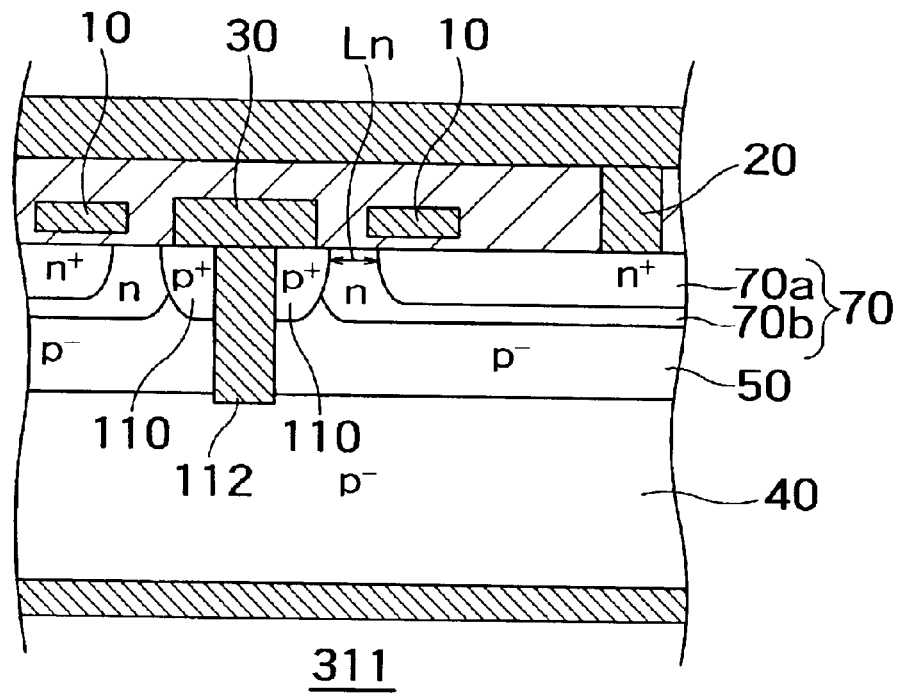
FIGS. 14A and 14B are cross-sectional views of modifications of the element-side semiconductor device and the contact-side semiconductor device according the fifth embodiment of the invention using the metal plug shown in FIG. 11 or FIG. 12.
Figure 14B:
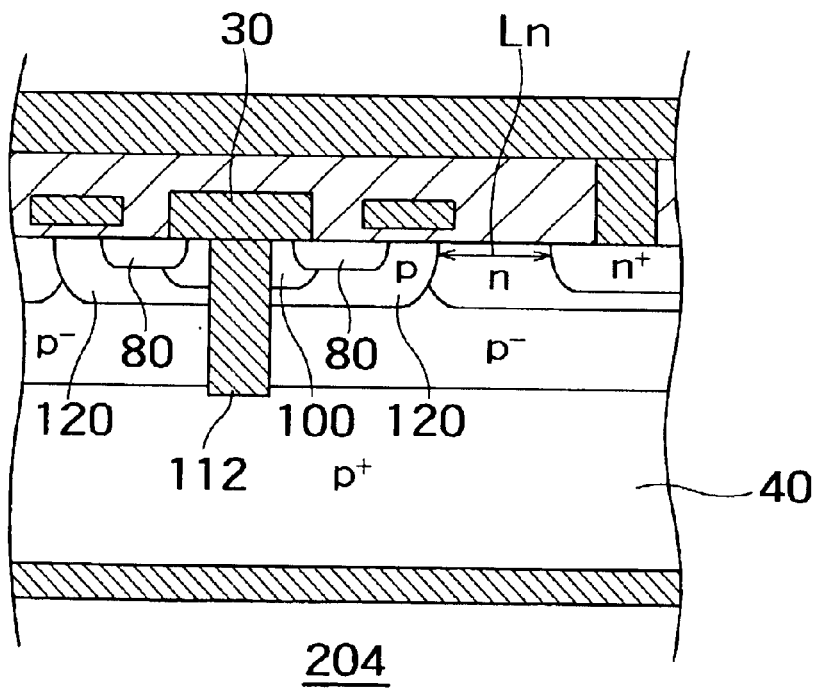

FIG. 13A, FIG. 13B, FIG. 14A and FIG. 14B are cross-sectional views of modifications of the contact-side semiconductor device according to the fifth embodiment using the metal plug as shown in FIG. 11 or FIG. 12. FIG. 13A, FIG. 13B and FIG. 14A show modifications of the contact-side semiconductor device 307 whereas FIG. 14B shows a modification of the element-side semiconductor device 202.

The contact-side semiconductor device 308 shown in FIG. 13A is different from the contact-side semiconductor device 307 in FIG. 12 in that the drain contact portion 70a is laterally (in the direction toward the channel) wider.

Therefore, lateral width Ln of the field buffering portion 70b extending from the perimeter of the contact portion 70a of the contact-side semiconductor device 308 is narrower than the lateral widths Ln of the field buffering portions 70b extending from perimeters of the contact portions 70a of the contact-side semiconductor device 307 and the element-side semiconductor device 202. As a result, in case a certain voltage is applied between the source and the drain, the depletion layer extending between the field buffering portion 70b and the base layer 120 of the contact-side semiconductor device 308 becomes narrower than the depletion layer extending between the field buffering portion 70b and the base layer 120 of the contact-side semiconductor device 307. Therefore, the source-drain withstanding voltage of the contact-side semiconductor device 308 becomes lower than the source-drain withstanding voltages of the contact-side semiconductor device 307 and the element-side semiconductor device 202.

Therefore, in case the power semiconductor device is a combination of the contact-side semiconductor device 308 and the element-side semiconductor device 202, almost all of the avalanche current of the power semiconductor device passes the contact-side semiconductor device 308. Thus the ON resistance of the power semiconductor device decreases, and the element-side semiconductor device 202 is protected simultaneously.

However, since the contact-side semiconductor device 308 has formed the n+-type source layer 80, a parasitic npn bipolar transistor exists in the contact-side semiconductor device 308. Therefore, when the avalanche current passes the base layer 120 directly under the source layer 80, the parasitic npn bipolar transistor turns ON. As a result, device breakdown does not occur in the contact-side semiconductor device 308.

The contact-side semiconductor device 309 shown in FIG. 13B is different from the contact-side semiconductor device 308 in FIG. 13A in the absence of the n+-type source layer 80. Because of the absence of the source layer 80 in the contact-side semiconductor device 309, no parasitic npn bipolar transistor exists in the contact-side semiconductor device 309. Since the diode exists between the source and the drain of the contact-side semiconductor device 309, device breakdown does not occur in the contact-side semiconductor device 309 even when the avalanche current passes between the source and the drain of the contact-side semiconductor device 309.

Therefore, in case the power semiconductor device is a combination of the contact-side semiconductor device 309 and the element-side semiconductor device 202, the ON resistance of the power semiconductor device decreases, the element-side semiconductor device 202 is protected, and no device breakdown occurs in the contact-side semiconductor device 309.

The contact-side semiconductor device 311 shown in FIG. 14A is different from the contact-side semiconductor device 309 in FIG. 13B in the absence of the p-type base layer 120. That is, the contact-side semiconductor device 311 has a simpler structure than the contact-side semiconductor device 309. It is also different from the contact-side semiconductor device 309 in that the field buffering portion 70b and the contact portion 70a of the drain layer 70 are laterally wider in the direction toward the channel such that the field buffering portion 70b contacts the contact-side connecting portion 110. On the other hand, in comparison with the contact-side semiconductor device 309, lateral width Ln of the field buffering portion 70b from the perimeter of the contact portion 70a may be equal.

Therefore, the power semiconductor in combination of the contact-side semiconductor device 311 and the contact-side semiconductor device 202 has the same effects as those of the power semiconductor device in combination of the contact-side semiconductor device 309 and the element-side semiconductor device 202.

The contact-side semiconductor devices 307, 308, 309, 311 each have the gate electrode 10. However, the gate electrode 10 may be omitted on the contact-side semiconductor devices 307, 308, 309, 311. Without the gate electrode 10 of the contact-side semiconductor device, the switching speed of the power semiconductor device increases under no electrostatic capacity of the gate electrode 10.

The semiconductor device according to the instant embodiment uses a diffusion layer as the element-side connecting portion and a metal plug as the contact-side connecting portion. However, the metal plug may be formed on the entire extension along the line 4-4' of FIG. 5. That is, a metal plug may be used as the element-side connection portion of the element-side semiconductor device.

For example, FIG. 14B is a cross-sectional view of a modified element-side semiconductor device 204 using a metal plug as the element-side connecting portion.

The element-side semiconductor device 204 has a metal plug 102 between adjacent source layers 80. The metal plug 102 is in contact with the metal plug 112 in the contact-side semiconductor device 307, 308, 309 or 311. Therefore, the metal plug is formed over the entire extension along the line 4-4' of FIG. 5.

On the other hand, in order to connect the source electrode 30 to the element-side connecting portion 100, the distance between adjacent source layers 80 must be wider than the metal plug 102. Because, if the distance between adjacent source layer 80 is narrower than the metal plug 102, the source electrode 30 cannot contact the element-side connecting portion 100, as a result, it is difficult to downsize the semiconductor device according to the embodiment shown in FIG. 14B.

In case the element-side semiconductor device 202 of FIG. 11 is formed, because of the absence of the metal plug, the source electrode 30 can be connected to both adjacent source layers 80 and the element-side connecting portion 100 even when the distance between adjacent source layer 80 is narrow. In the contact-side semiconductor device 307 of FIG. 12, there is no problem even if the distance between adjacent source layers 80 is too narrow to connect the source electrode 30 to the element-side connecting portion 100 because connection of the source electrode 30 to the source layers 80 and connection of the source electrode 30 to the element-side connecting portion 100 are attained in the element-side semiconductor device 202.

Therefore, the power semiconductor device made up of the element-side semiconductor device 202 of FIG. 11 and the contact-side semiconductor device 307 of FIG. 12 can be downsized more than the power semiconductor device made by using the element-side semiconductor device 204 of FIG. 14B.

Therefore, among the models according to the fifth embodiment shown in FIGS. 11 through 13, the power semiconductor device formed by combining the element-side semiconductor device 202 and the contact-side semiconductor device 309 or 311 is preferable from the viewpoint of the effects of the instant embodiment.

However, any of the other models may be employed taking account of the manufacturing process, manufacturing cost and other factors.

In the contact-side semiconductor device 308, 309 or 311, lateral width of the contact portion 70a is relatively wide. Therefore, lateral width Ln of the field buffering portion 70b extending from the perimeter of the contact portion 70a is narrower than that of the field buffering portion 70b of the element-side semiconductor device 202 or 204.

However, lateral widths of the contact portions 70a with the contact-side semiconductor device 308, 309 or 311 and the element-side semiconductor device 202 or 204 may be equal. In this case, in order that the lateral width Ln of the field buffering portion 70b extending from the perimeter of the contact portion 70a in the contact-side semiconductor device 308, 309 or 311 is narrower than that of the field buffering portion 70b of the element-side semiconductor device 202 or 204, lateral width of the field buffering portion 70b itself may be narrowed without changing the lateral width of the contact portion 70a. Thereby, the source-drain withstanding voltage of the contact-side semiconductor device 308, 309 or 311 can be made lower than the source-drain withstanding voltage of the element-side semiconductor device 202 or 204.

However, lateral width of the base layer 120 must be wide enough to contact the field buffering portion 70b. In this manner, the source-drain withstanding voltage of the contact-side semiconductor device 308, 309 or 311 becomes lower than that of the element-side semiconductor device 202 or 204.

In this embodiment, the metal plugs 102 and 112 may be made of the same material in the same process. Since the metal plugs 102 and 112 contact with each other, they can be regarded substantially unitary.

Alternatively, the metal plugs 102 and 112 may be made of different materials in difference processes. In this case, they may be connected by a interconnection.

Figure 15:
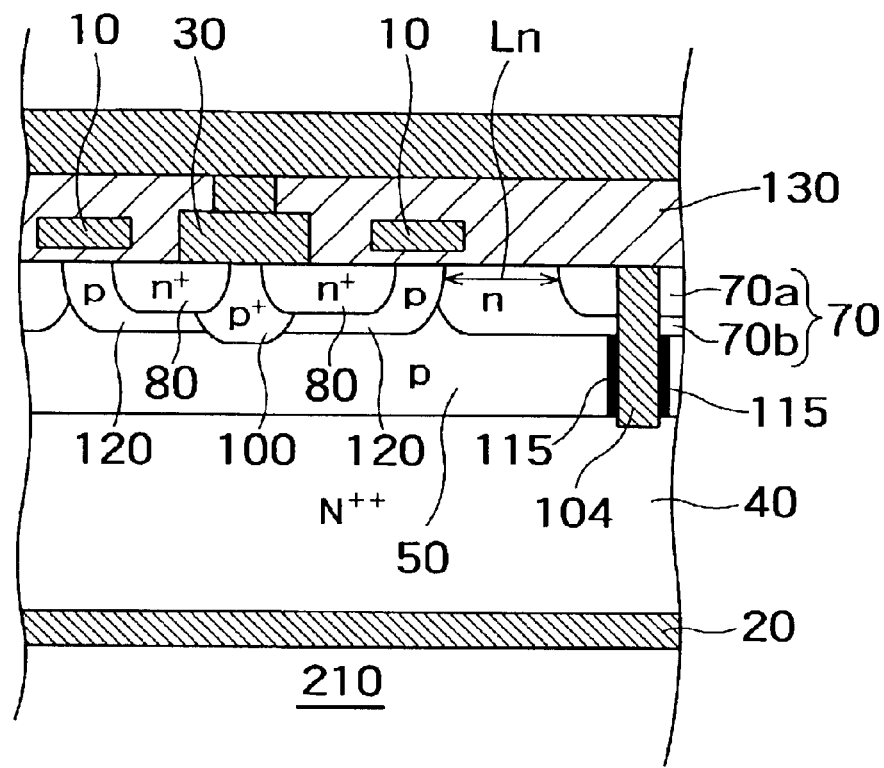
FIG. 15 is a cross-sectional view of a semiconductor device having a drain electrode on the bottom surface according to the sixth embodiment of the invention.
Figure 16:
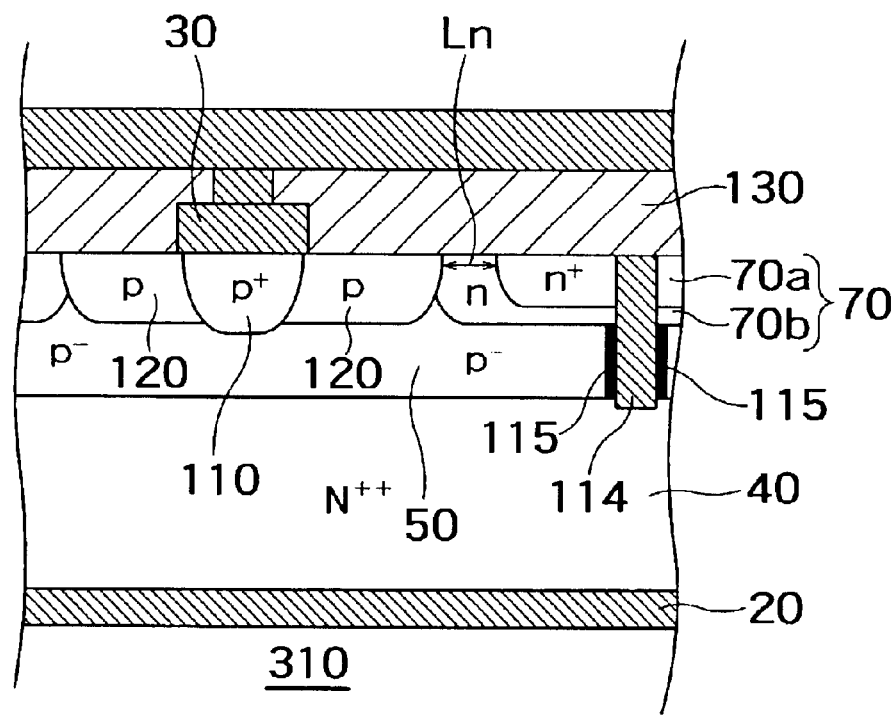
FIG. 16 is a cross-sectional view of a semiconductor device having a drain electrode on the bottom surface according to the sixth embodiment of the invention.

FIG. 15 and FIG. 16 are cross-sectional views of a semiconductor device having a drain electrode on the bottom surface according to the sixth embodiment of the invention. In this embodiment, the semiconductor substrate 40 is $N^{+++}$-type. The drain electrode 20 is formed on the bottom surface of the semiconductor substrate 40 in contact therewith. Metal plugs 104 and 114 extend from the drain layer 70 through the semiconductor layer 50 to reach the semiconductor substrate 40. Thereby, the drain layer 70 is connected to the semiconductor substrate 40 and the drain electrode 20 on the bottom surface.

To insulate the metal plugs 104 and 114 from the semiconductor layer 50, plug insulators 115 are formed around the metal plugs 104 and 114. An n-type impurity such as As, P is implanted in a diagonal direction relative to the trenches burying the metal plugs 104 and 114. After that, the impurity is diffused by annealing to form the n-type semiconductor layer. The n-type semiconductor layer insulates the metal plugs 104 and 114 from the semiconductor layer 50. $SiO_2$ or other remainder formed on side surfaces of the trenches upon etching thereof may be uses as plug insulators 115.

The contact-side semiconductor device 310 shown in FIG. 16 does not have the source layer 80. Thereby, it is prevented that the parasitic npn bipolar transistor turns ON with the avalanche current and destructs the semiconductor element of the contact-side semiconductor device 310.

The contact portion 70a of the drain of the contact-side semiconductor device 310 is laterally wider than the contact surface 70a of the element-side semiconductor device 210. As a result, lateral width Ln of the field buffering portion 70b extending from the perimeter of the contact portion 70a in the contact-side semiconductor device 310 becomes narrower than that of the field buffering portion 70b of the element-side semiconductor device 210. Thereby, the source-drain withstanding voltage of the contact-side semiconductor device 310 can be lowered than the source-drain withstanding voltage of the element-side semiconductor device 210.

The element-side connecting portion 100 and the contact-side connecting portion 110 are approximately equal in depth and impurity concentration. Therefore, the element-side connecting portion 100 and the contact-side connecting portion 110 can be formed simultaneously.

The source electrode 30 is formed on the top surface of the semiconductor substrate 40 and covers the insulating element 130.

The semiconductor layer 50 may be n-type. In this case, however, its concentration is preferably lower than that of the field buffering portion 70b because the source-drain withstanding voltage can be determined by the lateral width Ln of the field buffering portion 70b extending from the perimeter of the contact portion 70a.

In the instant embodiment, the metal plugs 104 and 114 may be made of the same material in the same process. Since the metal plugs 104 and 114 contact with each other, they can be regarded substantially unitary.

Alternatively, the metal plugs 104 and 114 may be made of different materials in difference processes. In this case, they may be connected by a interconnection.

In the semiconductor devices according to the fifth and sixth embodiments, metals usable as the metal plugs 102, 104, 112, 114 include tungsten, aluminum, copper, Al—Si and Ai—Si—Cu, for example.

Metal plugs 102, 104, 112, 114 may be replaced by non-metallic materials. Doped polycrystalline silicon may be used as a non-metallic plug. In this case, after the trench is formed in a location for forming the plug, an impurity is diagonally implanted to the trench before burying the plug to lower the resistance of sidewalls of the trench. After that, the plug is buried to form a sidewall conductive layer (not shown) around the plug. The sidewall conductive layer electrically connects the drain layer 70 or the source electrode 30 to the semiconductor substrate 40 and the drain electrode 20 or the source electrode 31 on the bottom surface.

The first to sixth embodiments of the invention have element unit 1000 (see FIG. 1 or 5) each including the gate electrode 10, the drain layer 70, the source layer 80, element-side connecting portion 100, contact-side connecting portion 110, the drain electrode 20 and the source electrode 30. Adjacent element units 1000 share one of the drain electrode 20 and the source electrode 30. That is, the drain electrodes 20 and the source electrodes 30 of a plurality of the element units 1000 are connected in parallel. Therefore, when the number of element units 1000 increase, the total channel width becomes wider, which permit larger current flow between the source and the drain.

In the first to sixth embodiments of the invention, as shown in FIG. 1 or 5, each element unit 1000 includes a connect row of a plurality of contact-side connecting portions 110 (which underlie the source electrode 30) arranged alternately, linearly, and a linear drain row of the drain layer 70 (underlie the drain electrode 20). Adjacent connect rows are substantially in parallel similarly to adjacent source electrodes 30. Each drain row extends substantially in parallel with and intervenes adjacent connect rows similarly to each drain electrode 20.

Aligning respective components in this manner facilitates downsizing of the semiconductor device by a design change and integration of semiconductor devices.

Figure 17A:
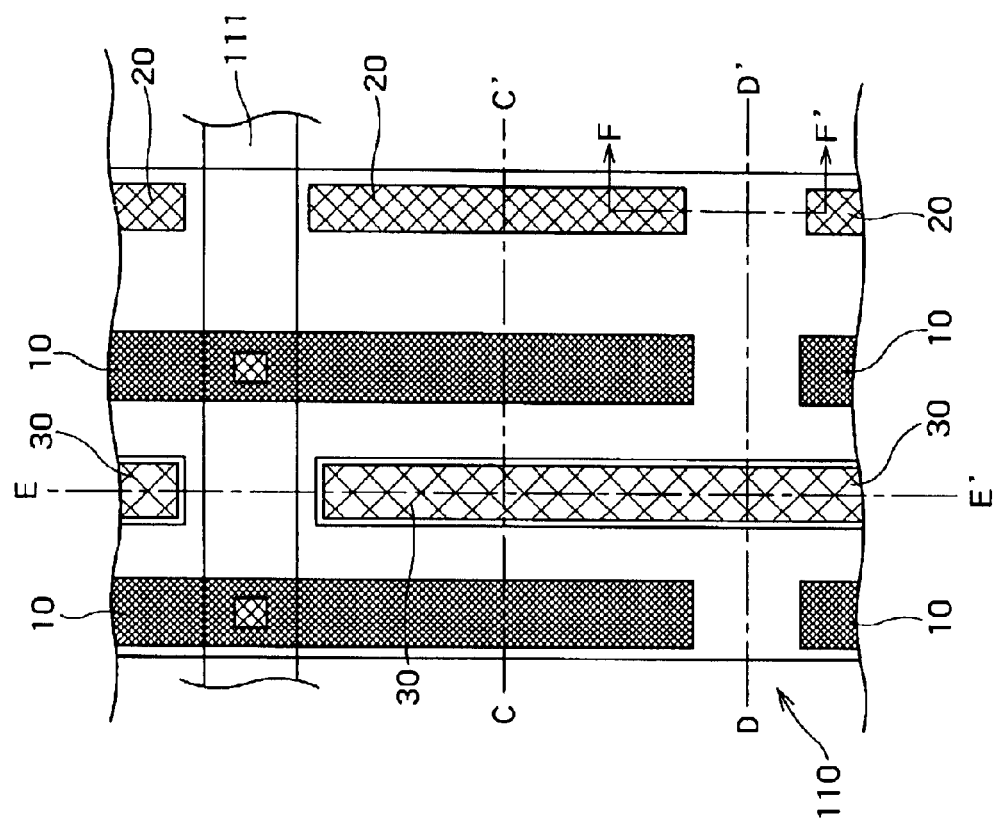
FIGS. 17A and 17B are enlarged schematic plan views of a part of a semiconductor device according to an embodiment of the invention different from the embodiment shown in FIG. 1 or FIG. 5.
Figure 17B:
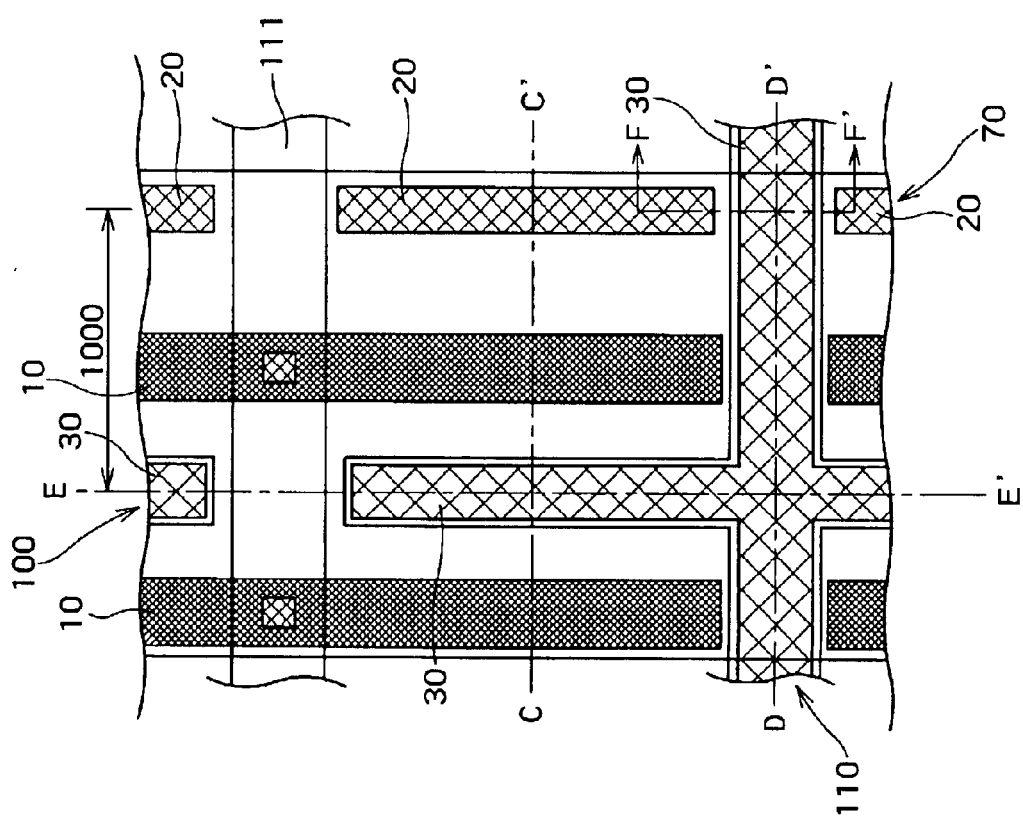

FIGS. 17A and 17B are enlarged schematic plan views of a part of a semiconductor device according to an embodiment of the invention different from the embodiment shown in FIG. 1 or FIG. 5. In the semiconductor device according to this embodiment, a plurality of element-side connecting portions 100 are aligned linearly along the line E–E', and contact-side connecting portions 110 are aligned along the line D–D'. In FIG. 17A, the element-side connecting portions 100 and the contact-side connecting portions 110 underlie the source electrode 30. The drain layers 70 are linearly aligned in parallel with the line E–E' under the drain electrodes 20.

The contact-side connecting portions 110 are formed to align perpendicularly to the direction of alignment of the element-side connecting portions 100 and the direction of alignment of the drain layers 70. The contact-side connecting portions 110 are provided to intervene between and contact with a plurality of the element-side connecting portions 100, and are provided to intervene a plurality of drain layers 70 out of contact with but near the drain contact portions 70a.

It is also acceptable to form a unitary element-side connecting portion 100 extending long and straight and a unitary drain layer 70 extending long and straight and to linearly align a plurality of contact-side connecting portions 110. In this case, the unitary element-side connecting portion 100 is formed to intervene between and contact with a plurality of contact-side connecting portions 110. The unitary drain layer 70 is formed to intervene between and near a plurality of contact-side connecting portions 110 such that its contact portion 70a is out of contact with but near the contact-side connecting portions 110.

Although the element side connecting portions 100, contact-side connecting portion 110 and drain layers 70 in the instant embodiment are formed straight, they may be curved.

Hatched portions of the gate electrodes, drain electrodes 20 and source electrodes 30 in FIGS. 17A and 17B are contact portions between the gate electrodes 10 and the gate interconnection 111, contact portions between the drain electrodes 20 and the drain layers 70, and contact portions of the source electrodes 30 with the source layers 80 and the element-side connecting portions 100 or contact-side connecting portions 110, respectively.

FIG. 17B is different from FIG. 17A in that the portion of the source electrodes 30 is not formed along the line D–D'. The contact-side connecting portions 110, however, are formed along the line D–D' similarly to FIG. 17A. Since this embodiment does not include the source electrode 30 along the line D–D', it is advantageous in that the parasitic capacitance between the source electrode 30 and the drain electrode 20 or gate electrode 10 decreases.

Figure 18:
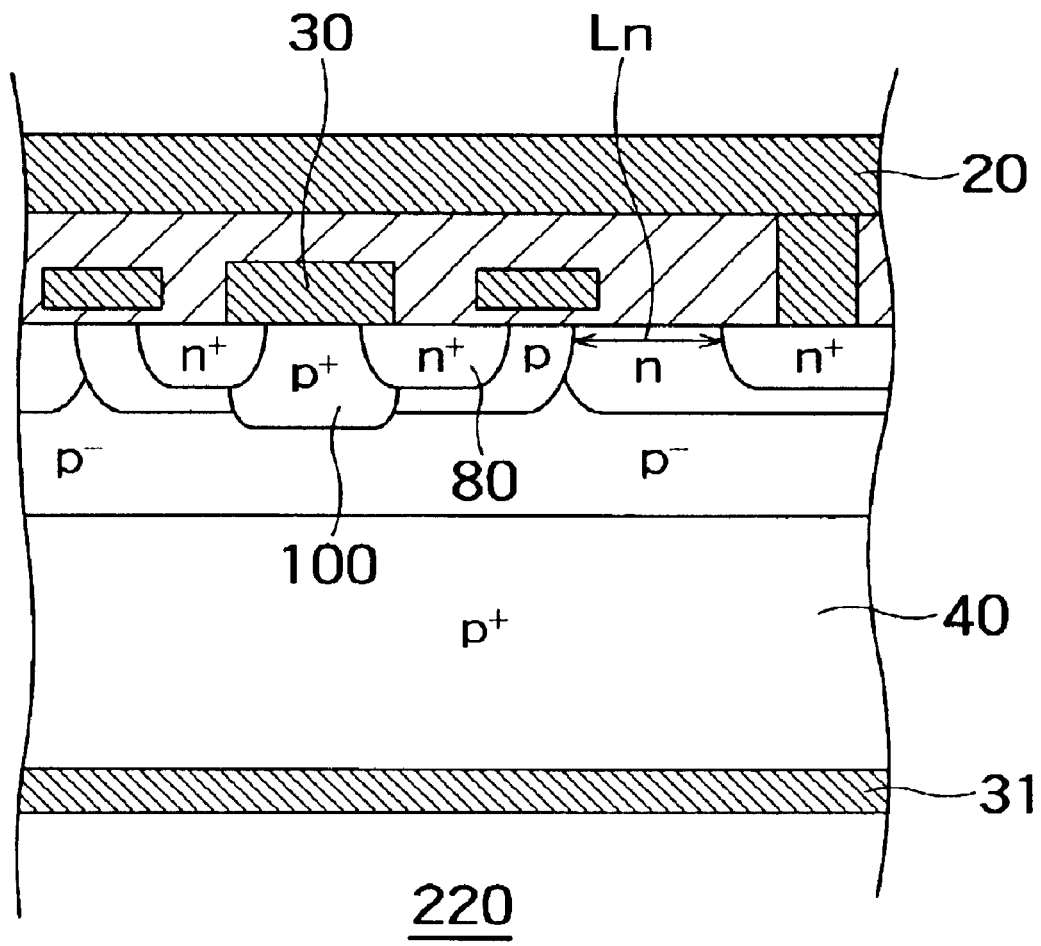
FIG. 18 is a cross-sectional view taken along the line C–C' of FIG. 17.

FIG. 18 is a cross-sectional view of the element-side semiconductor device 220 according to the embodiment of FIG. 17A or 17B, taken along the line C–C'. The source electrode 30 is connected to the source layer 80 and the element-side connecting portion 100. The element-side connecting portion 100 does not reach the semiconductor substrate 40.

Figure 19A:
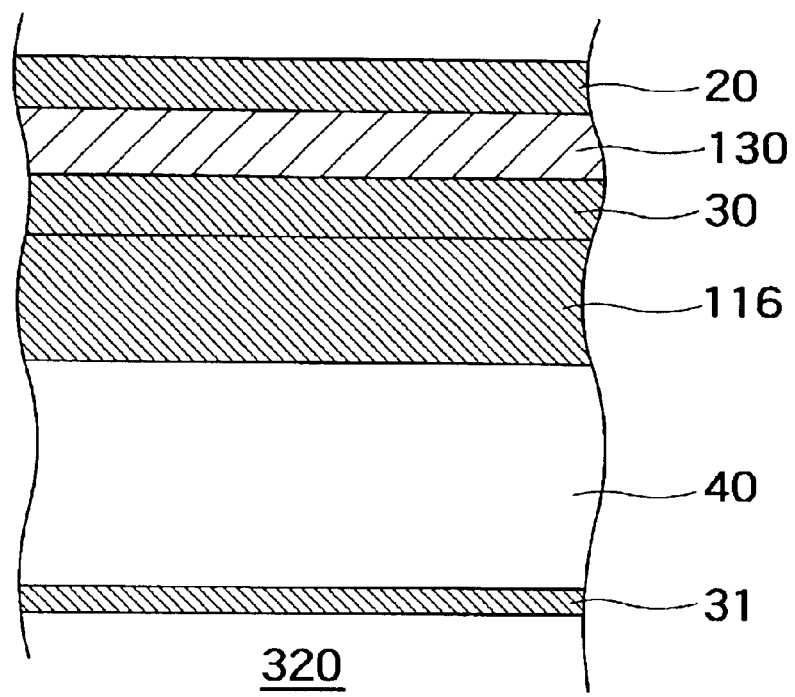
FIGS. 19A and 19B are cross-sectional views taken along the line D–D' of FIG. 17.
Figure 19B:
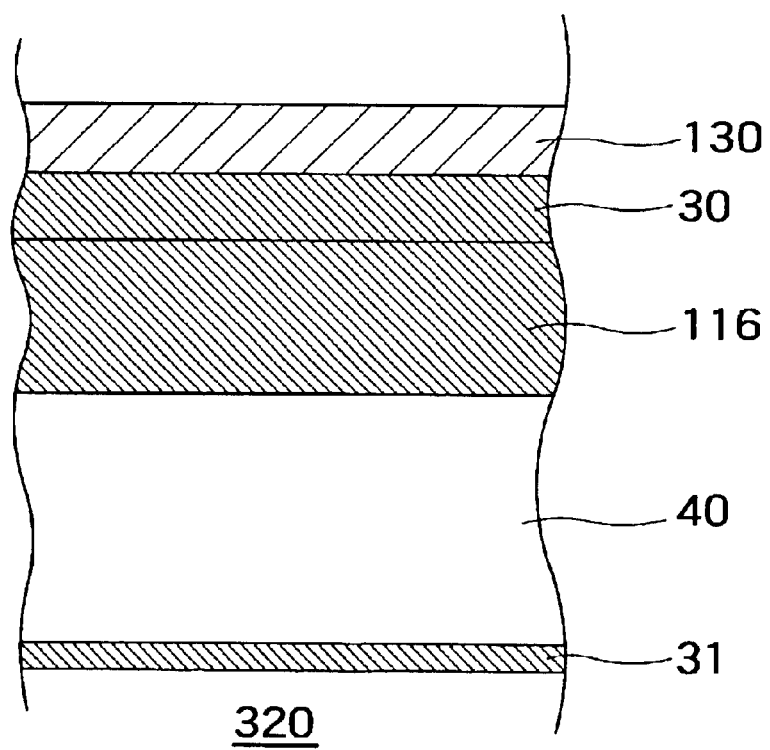

FIGS. 19A and 19B are cross-sectional views of the contact-side semiconductor device 320 according to the embodiment of FIG. 17A using the metal plug as the contact-side connecting portion, taken along the line D–D'. The metal plug 116 extends to reach the semiconductor substrate 40 and spans in the right-and-left direction in FIG. 19. Therefore, the metal plug 116 extends perpendicular to the drain electrode 20 and hence the drain layer 70. The source electrode 30 is connected to the metal plug 116. The line D–D' section of FIG. 17B appears in FIG. 19A or 19B without a part of the source electrode 30.

The drain electrode 20 is formed on the insulating element 130 in FIG. 19A. In this embodiment, the drain electrode 20 overlaps the metal plug 116 as the contact-side connecting portion. However, as shown in FIG. 19B, the device may be so designed that the drain electrode 20 does not overlap the metal plug 116. The design where the drain electrode 20 and the metal plug 116 do not overlap contributed to decreasing the source-drain capacitance.

Figure 20:
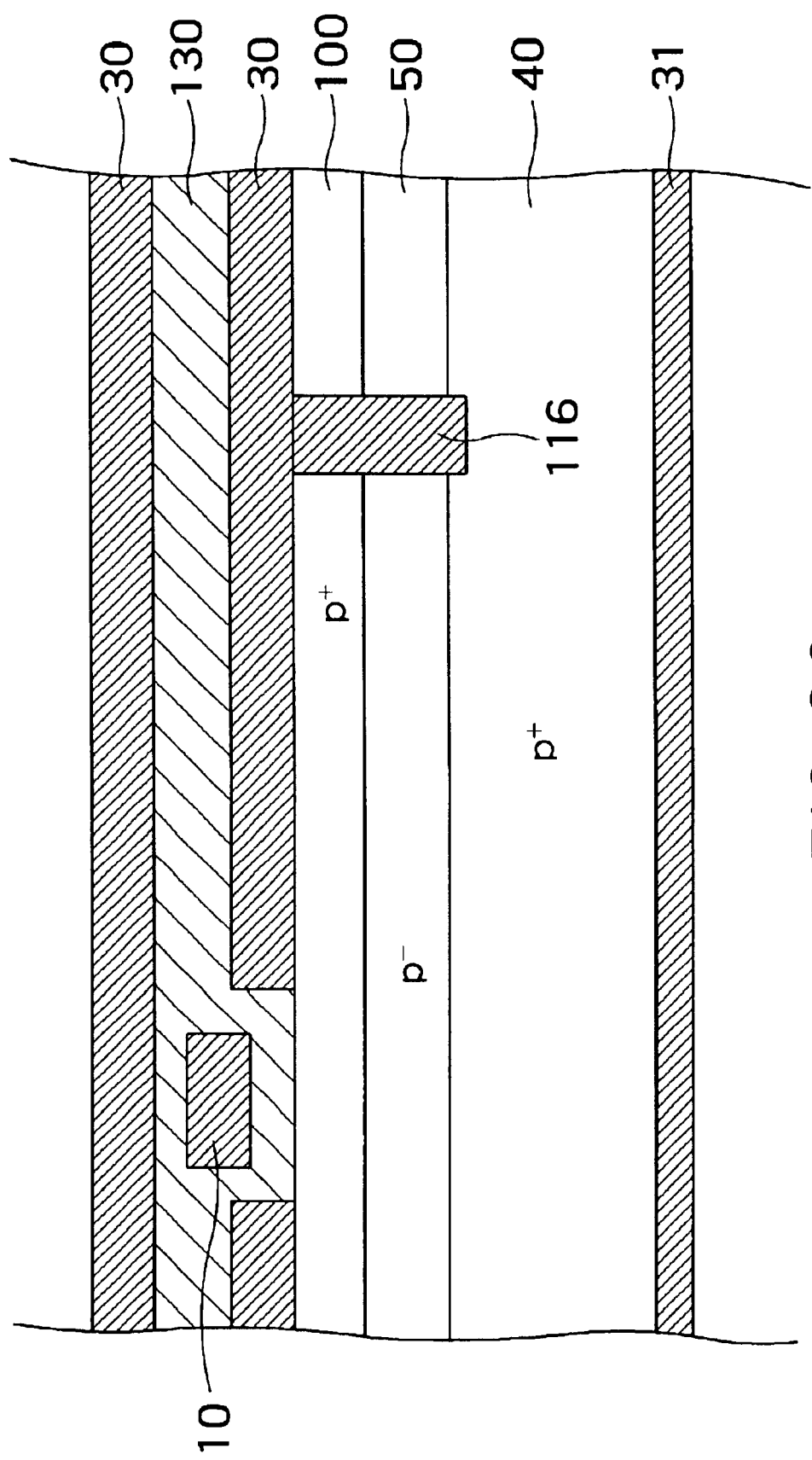
FIG. 20 is a cross-sectional view taken along the line E–E' of FIG. 17.

FIG. 20 is a cross-sectional view of the embodiment using the metal plug as the contact-side connecting portion, taken along the line E–E' of FIG. 17B. Here is shown that the metal plug 116 reaches the semiconductor substrate 40. The element-side connecting portion 100 extends along the line E–E' into contact with the metal plug 116. Therefore, in this embodiment, the element-side connecting portion 100 and the metal plug 116 extend perpendicular to each other.

When the semiconductor device according to the instant embodiment is ON, a current flows between the source electrode 30 along the line E–E' of FIG. 17A or 17B and the drain electrode 20 in parallel with the line E–E'. It also flows from the source electrode 30 to the source electrode 31 on the bottom surface of the semiconductor substrate 40 via the metal plug 116 along the line D–D'.

Figure 21A:
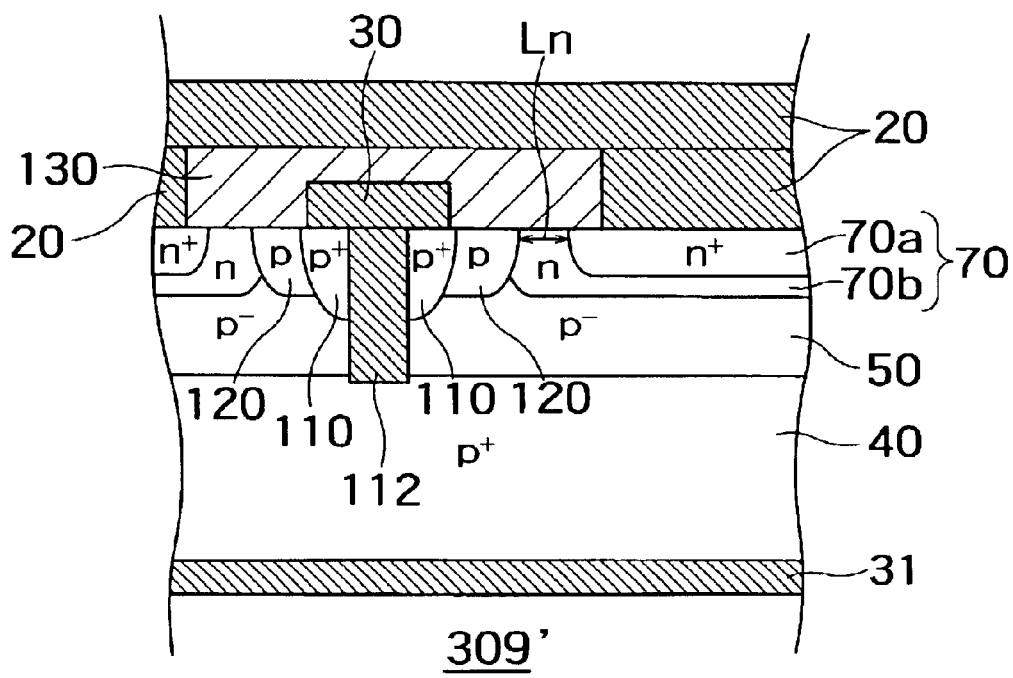
FIGS. 21A and 21B are enlarged cross-sectional views of the power semiconductor device shown in FIG. 17A, taken along the line F–F' of FIG. 17.
Figure 21B:
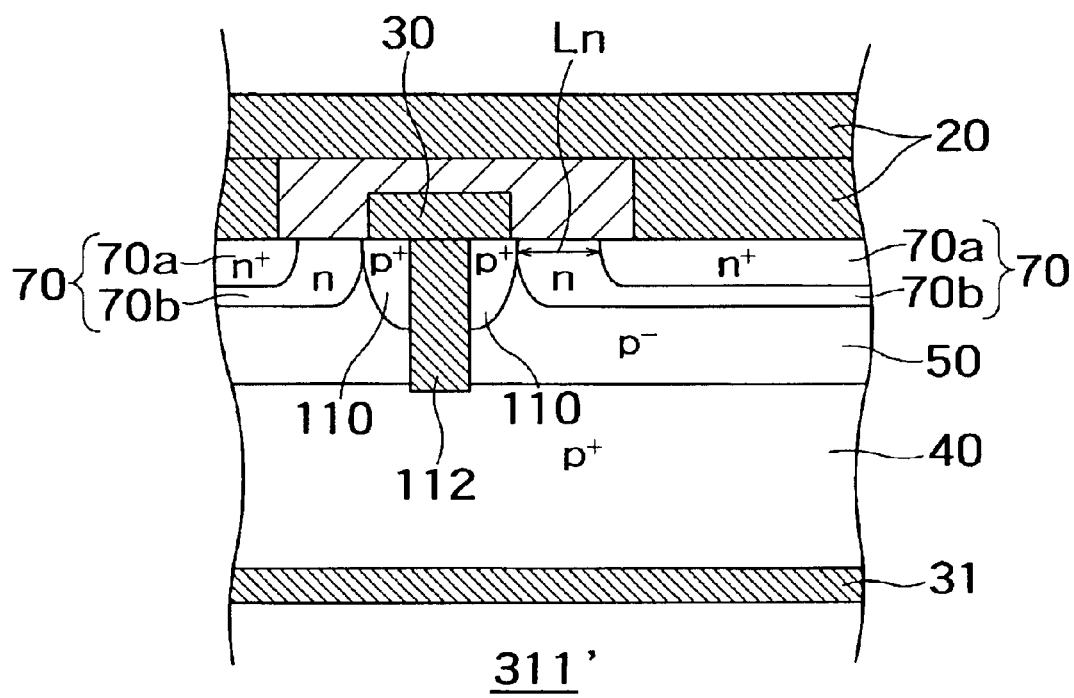

FIGS. 21A and 21B are enlarged cross-sectional views of the power semiconductor device shown in FIG. 17A, taken along the line F–F' of FIG. 17. FIG. 21A is an enlarged cross-sectional view of the power semiconductor device that includes a contact-side semiconductor device 309' having the same configuration as that of the contact-side semiconductor device 309 shown in FIG. 13B. Similarly to FIG. 13B, the contact-side semiconductor device 309' has the contact-side connecting portion 110 and the base layer 120 on opposite side surfaces of the metal plug 116. Therefore, the base layer 120 and the drain layer 70 form a diode. The withstanding voltage of the diode is preferably lower than the withstanding voltage of the parasitic npn bipolar transistor of the element-side semiconductor device 220. That is, lateral with Ln of the field buffering portion 70b extending from the contact portion 70a of the contact-side semiconductor device 309' is preferably shorter than the lateral width Ln of the field buffering portion 70b extending from the contact surface 70a of FIG. 18. Thereby, any avalanche current caused by L-load switching flows from the drain electrode 20 near the line D–D' to the source electrode 31 through the diode and the metal plug 116 formed in the contact-side semiconductor device 309'. Therefore, the element-side semiconductor device (the portion corresponding to C–C' of FIG. 17A) is protected. That is, the instant embodiment also has the same effects as those of the first through sixth embodiments.

FIG. 21B is an enlarged cross-sectional view of the power semiconductor device that includes a contact-side semiconductor device 311' having the same configuration as the contact-side semiconductor device 311 shown in FIG. 14A. The contact-side semiconductor device 311' is the same as the contact-side semiconductor device 309' in that it includes the contact-side connecting portion 110 at opposite side surfaces of the metal plug 116, but it is different in the absence of the base layer. The device is so formed that the contact-side connecting portion 110 and the drain layer 70 form a diode. The withstanding voltage of the diode is preferably lower than the withstanding voltage of the parasitic npn bipolar transistor of the element-side semiconductor device 220. That is, lateral with Ln of the field buffering portion 70b extending from the contact portion 70a of the contact-side semiconductor device 311' is preferably shorter than the lateral width Ln of the field buffering portion 70b extending from the contact surface 70a of FIG. 18. Thereby, any avalanche current caused by L-load switching flows from the drain electrode 20 near the line D–D' to the source electrode 31 through the diode and the metal plug 116 formed in the contact-side semiconductor device 311'. Therefore, the element-side semiconductor device (the portion corresponding to C–C' of FIG. 17A) is protected. That is, the instant embodiment also has the same effects as those of the first through sixth embodiments.

The enlarged cross-sectional view taken along the line F–F' of the power semiconductor device shown in FIG. 17B is different from the contact-side semiconductor devices 309' and 311' shown in FIGS. 21A and 21B, respectively, in that the source electrode 30 does not exist. In the other respects, however, the configuration of the power semiconductor device shown in FIG. 17B in the enlarged cross-sectional view along the line F–F' may be identical to those of the contact-side semiconductor device 309' and 311'. Thereby, the same effects as those of the first to sixth embodiments are ensured.

Figure 22A:
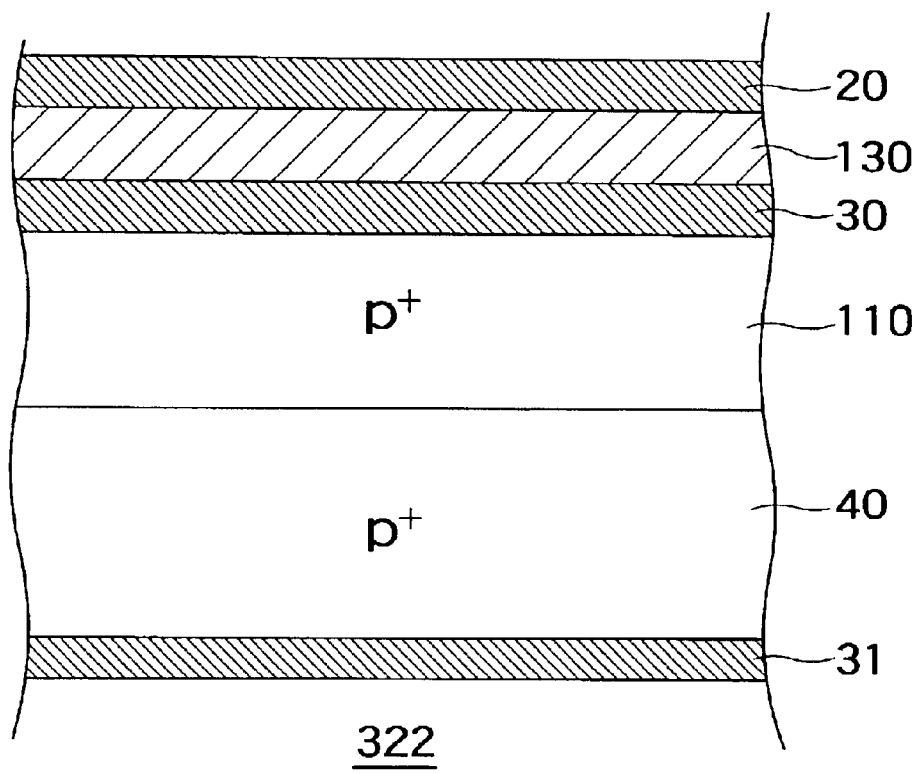
FIGS. 22A and 22B are enlarged cross-sectional views of a contact-side semiconductor device 322 using a diffusion layer as a contact-side connecting portion according to the embodiment of FIG. 17A.
Figure 22B:
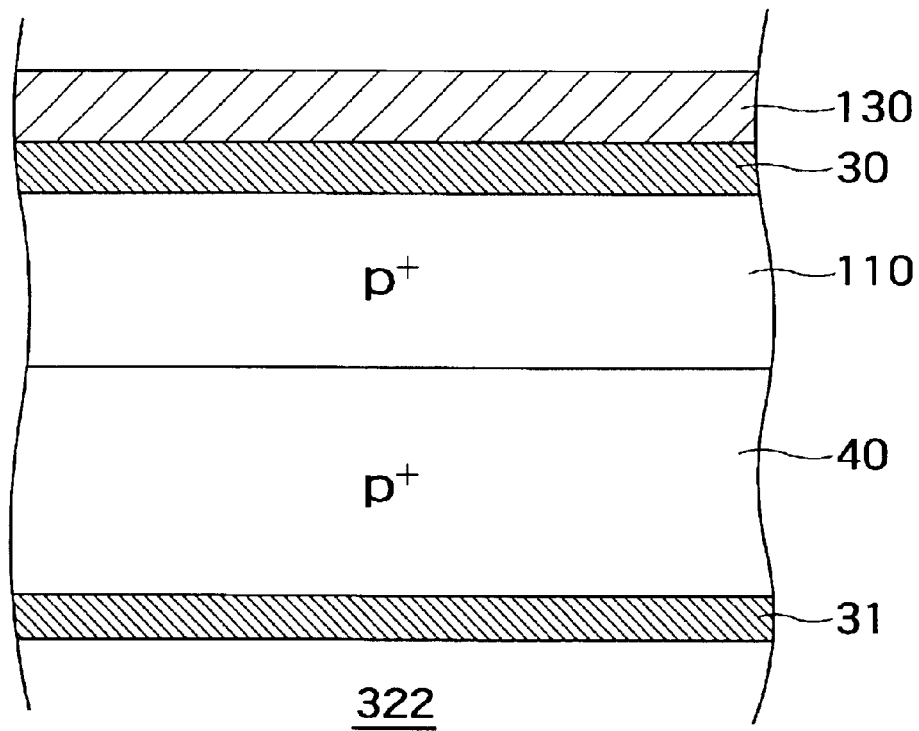

FIGS. 22A and 22B are enlarged cross-sectional views of a contact-side semiconductor device 322 using a diffusion layer as a contact-side connecting portion according to the embodiment of FIG. 17A. A section of the element-side semiconductor device is the same as the section of the element-side semiconductor device 220 shown in FIG. 18. The contact-side semiconductor device 322, however, uses the contact-side connecting portion 110 made up of a diffusion layer instead of the metal plug used in the contact-side semiconductor device 320 shown in FIG. 19. Therefore, in the section of the contact-side semiconductor device 322, the portion of the metal plug 116 shown in FIG. 18 is replaced by the contact-side connecting portion 110 made of a diffusion layer.

The drain electrode 20 is formed on the insulating element 130 of FIG. 22A. The drain electrode 20 overlaps the contact-side connecting portion 110. However, as shown in FIG. 22B, the device may be so designed that the drain electrode 20 does not overlap the contact-side connecting portion 110. The configuration where the drain electrode 20 does not overlap the contact-side connecting portion 110 contributed to decreasing the source-drain capacitance. Also in the embodiment of FIG. 17B, a diffusion layer may be used as the contact-side connecting portion. In this case, en enlarged cross-sectional view taken along the line D–D' appear in FIG. 22A or 22B without the source electrode 30.

Figure 23:
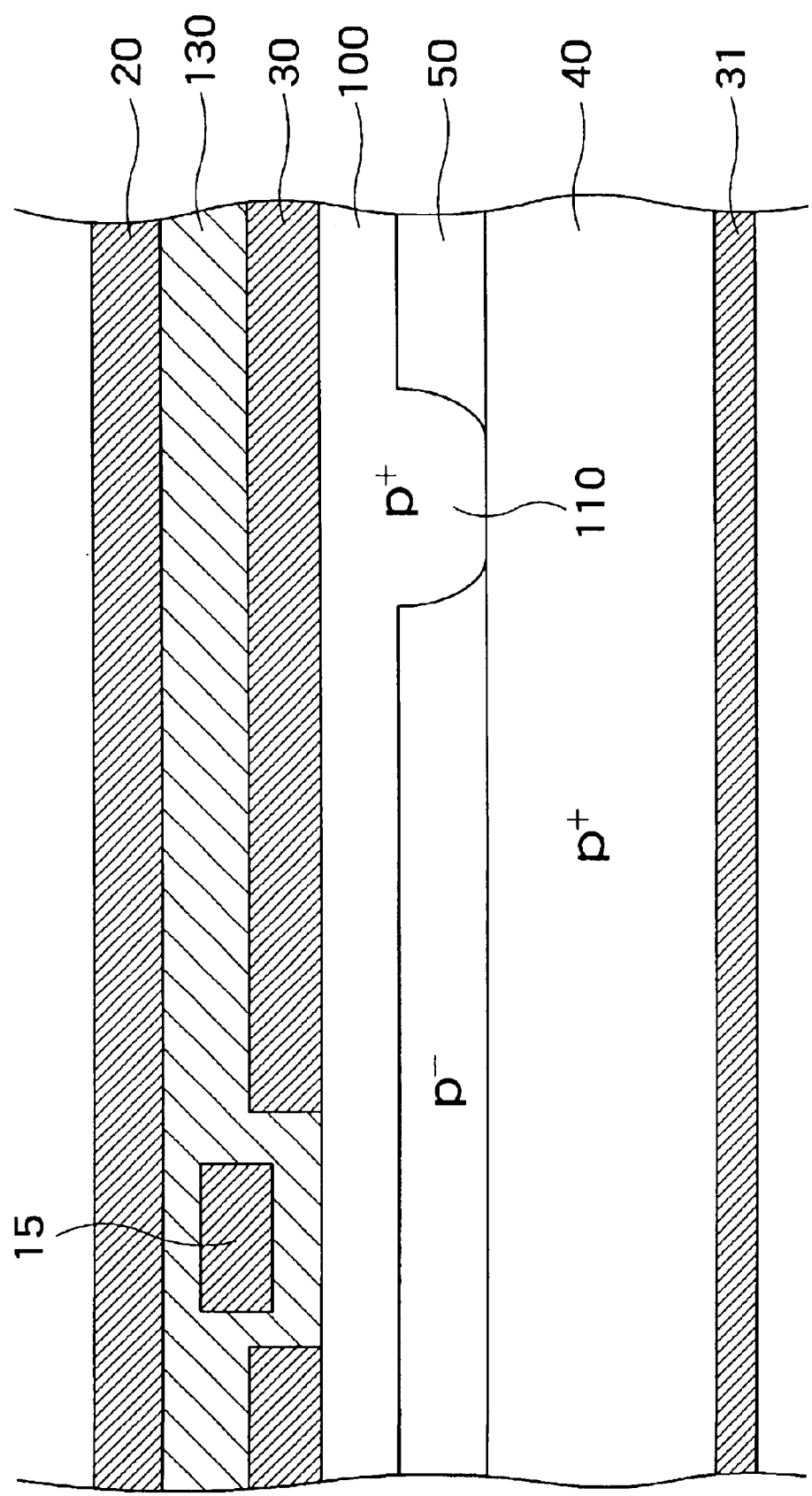
FIG. 23 is across-sectional view of an embodiment shown in FIG. 17A or 17B using a diffusion layer as the contact-side connecting portion, taken along the line E–E' of FIG. 17A or 17B.
Figure 24:
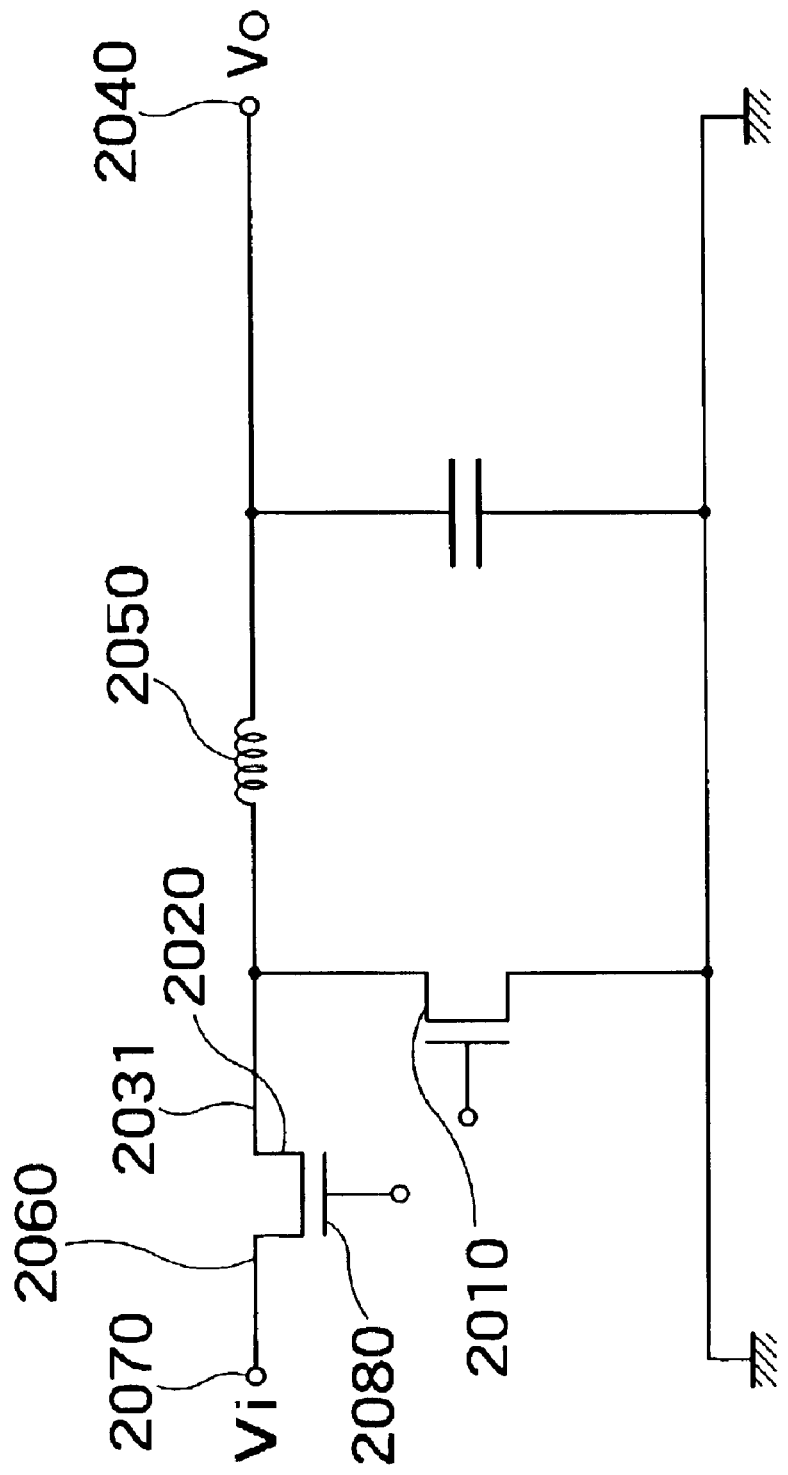
FIG. 24 is a circuit diagram of a DC-DC converter 2000 used as a power source of a conventional, typical synchronous rectification circuit type.

FIG. 23 is a cross-sectional view of an embodiment shown in FIG. 17A or 17B using a diffusion layer as the contact-side connecting portion, taken along the line E–E' of FIG. 17A or 17B. Here is shown that the contact-side connecting portion 110 using a diffusion layer is formed in the portion of the metal plug 116 in FIG. 20.

The semiconductor devices according to the invention are applicable not only to DC-DC converters of a synchronous rectification circuit type but also to all power semiconductor devices that can deal with high frequencies.

In addition, the semiconductor devices according to the invention are applicable to semiconductor devices used under application of a large power irrespectively of the presence or absence of inductance.

Furthermore, the semiconductor devices according to the invention are applicable to switching power MOSFETs and rectifying power MOSFETs.

In case a semiconductor device according to the invention is applied to a rectifying power MOSFET, a Schottky diode can be connected in parallel between the source and the drain. In this case, a current can flow even upon a delay of switching of the rectifying power MOSFET. As a result, the Schottky diode compensates the rectifying power MOSFET and functions as a bypass.

Figure 27:
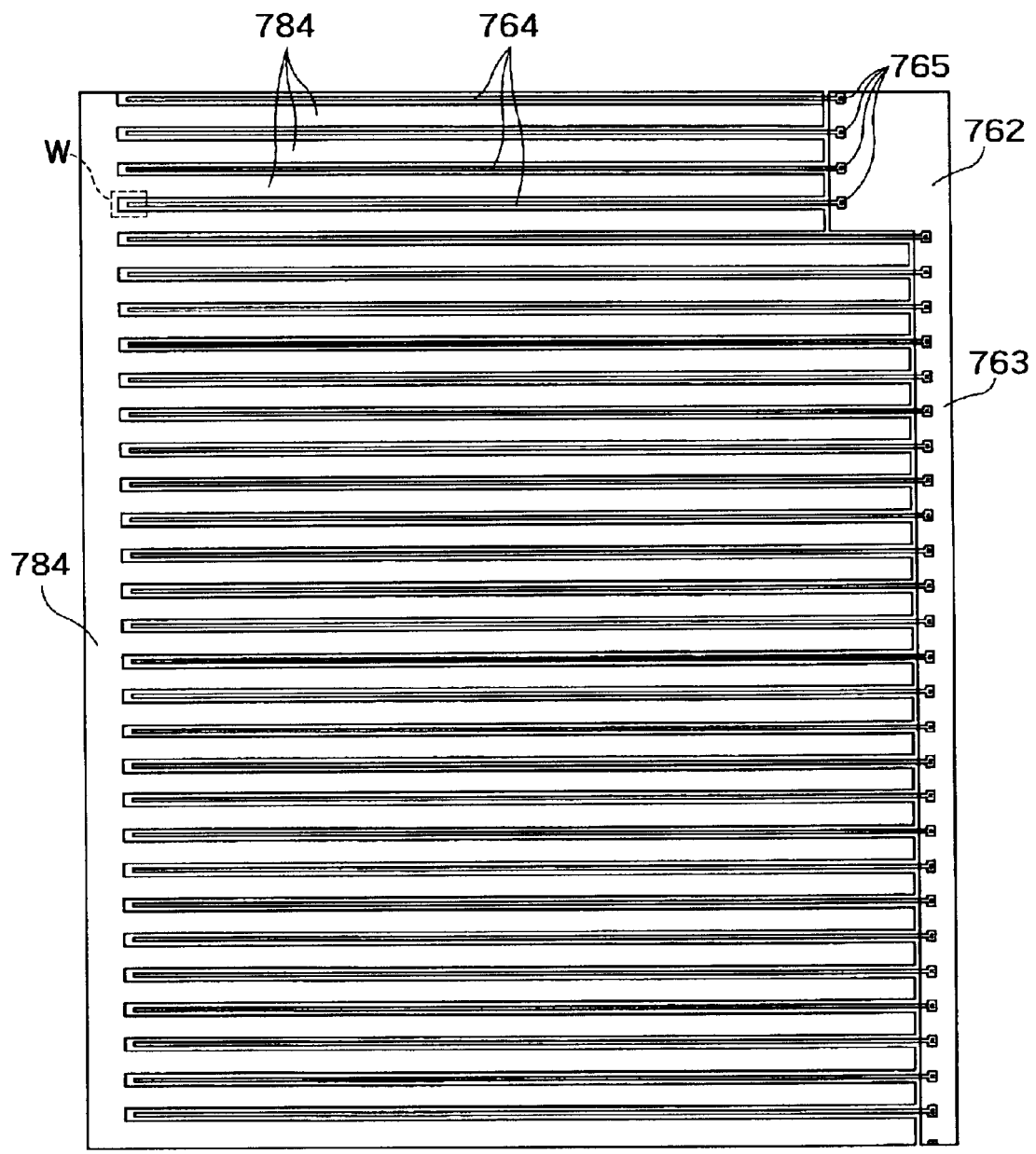
FIG. 27 is an enlarged schematic plan view of a part of a semiconductor device according to the seventh embodiment of the invention.

FIG. 27 is an enlarged schematic plan view of a part of a semiconductor device according to the seventh embodiment of the invention. FIG. 27 is a plan view of a MOSFET chip, taken from above it, and schematically shows it for simplicity. In any of the embodiments shown in FIGS. 1 through 6, the contact-side connecting portion 110 has been explained as underlying the source electrode (short-circuiting electrode) 30. In the following seventh to tenth embodiments, however, a p$^+$-type region (second semiconductor region) corresponding to the contact-side connecting portion underlies the gate electrode or gate interconnection (see FIG. 30). Thus, for convenience, the p$^+$-type region formed under the gate electrode or gate interconnection in the semiconductor device in any of the seventh to tenth embodiment is called a interconnection-side connecting portion whereas the device including the interconnection-side connecting portion is called a interconnection-side semiconductor device.

In the embodiment taken here, the MOSFET chip includes a gate bonding pad 762, gate connection pattern 763, gate interconnections 764 and drain electrodes 784. The bonding pad 762 is a pattern in a layer common to the gate connection pattern 763 and is continuously connected thereto. An insulating film underlying the bonding pad 762 and the gate connection pattern 763 has formed vias 765 that connect the bonding pad 762 or gate connection pattern 763 to perimeters of the gate interconnections 764. The gate interconnections 764 are electrically connected to the gate electrodes 777 (see FIGS. 28 and 29).

More specifically, the bonding pad 762 used for connection to the exterior is connected to the gate electrodes 777 together with the gate connection pattern 763 continuous from the bonding pad 762 through the vias 765 and through the gate interconnections 764.

The bonding pad 762, gate connection pattern 763 and gate interconnections 764 are made of a metal such as aluminum for lowering the resistance up to the gate electrodes 777.

Although the gate electrodes 777 are not shown in FIG. 27, it is formed to intersect the gate interconnections 764. Width of each gate interconnection 764 is approximately from 2 µm to 4 µm. Distance between adjacent gate interconnections 764 is approximately from 50 µm to 200 µm.

Drain electrodes are formed to intervene the gate interconnections 764. The drain electrodes 784 are removed from above the gate interconnection 764 for the purpose of reducing the parasitic capacitance between the gate interconnections 744 and the drain electrodes 784.

Figure 28:
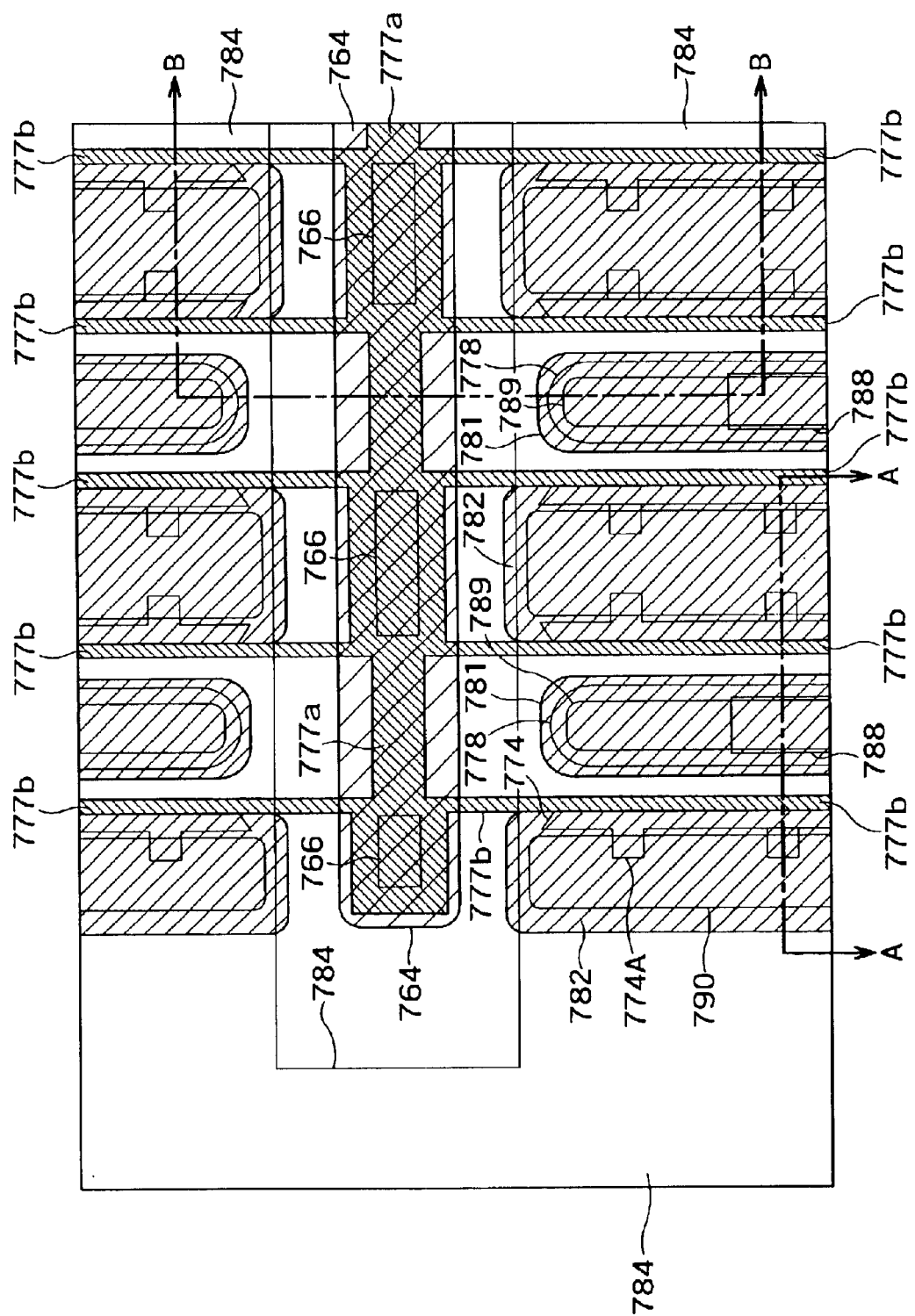
FIG. 28 is an enlarged see-through plan view of a portion W shown by the broken line in the MOSFET chip of FIG. 27.

FIG. 28 is an enlarged see-through plan view of a portion W shown by the broken line in the MOSFET chip of FIG. 27. The gate interconnection 764 extends in the lateral direction on the sheet surface of FIG. 28. The drain electrode 784 is formed around and distant from the gate interconnection 764. That is, above the gate interconnection 764, the drain electrode 784 does not exist. Thereby, the gate-drain parasitic capacitance decreases.

The gate interconnection 764 is connected to the gate electrode 777 through the contact holes 766. The gate electrode 777 is made of polycrystalline silicon or metal silicide, for example, and it is made up of a gate electrode 777a connected to the gate interconnection 764 and gate electrodes 777b extending perpendicularly from the gate electrodes 777a. The gate electrode 777a and the gate electrodes 777b form a pattern of a common layer. The gate electrode 777a is the portion for connecting the gate electrodes 777b to the gate interconnection 764, and it may be selectively removed from between the contact holes 766. Thereby, the gate-source parasitic capacitance can be reduced.

The gate electrodes 777b, short-circuiting electrodes 782 and drain electrodes 781 underlie the drain electrode 784. The short-circuiting electrodes 782 and the drain electrodes 781 extend substantially in parallel along the gate electrodes 777b. That is, each short-circuiting electrode 782 is formed in one side of each gate electrode 777b, and each drain electrode 781 is formed on the other side of each gate electrode 777b. In FIG. 28, the gate interconnection 764, gate electrodes 777a, 777b and drain electrodes 781 are shown by hatching.

The gate interconnection 764 is connected to the gate electrode 777a through the contact holes 766.

The drain electrode 784 is connected to the drain electrodes 781 through the contact holes 778. The drain electrodes 781 are connected to n$^+$-type contact portions 778 that are selective portions of the drain layer via the contact plugs 789.

The short-circuiting electrodes 782 are connected to n$^+$-type source layers 774 through the contact plugs 790. Each source layer 774 is a comb-shaped element having a projecting portion 774A on the plane of the semiconductor substrate. The short-circuiting electrodes 782 are connected to the source layers 774 by contact with the projecting portions 774A. Thereby, the withstanding voltage against avalanche breakdown is improved. That is, device breakdown by L-load switching is less liable to occur.

Figure 29:
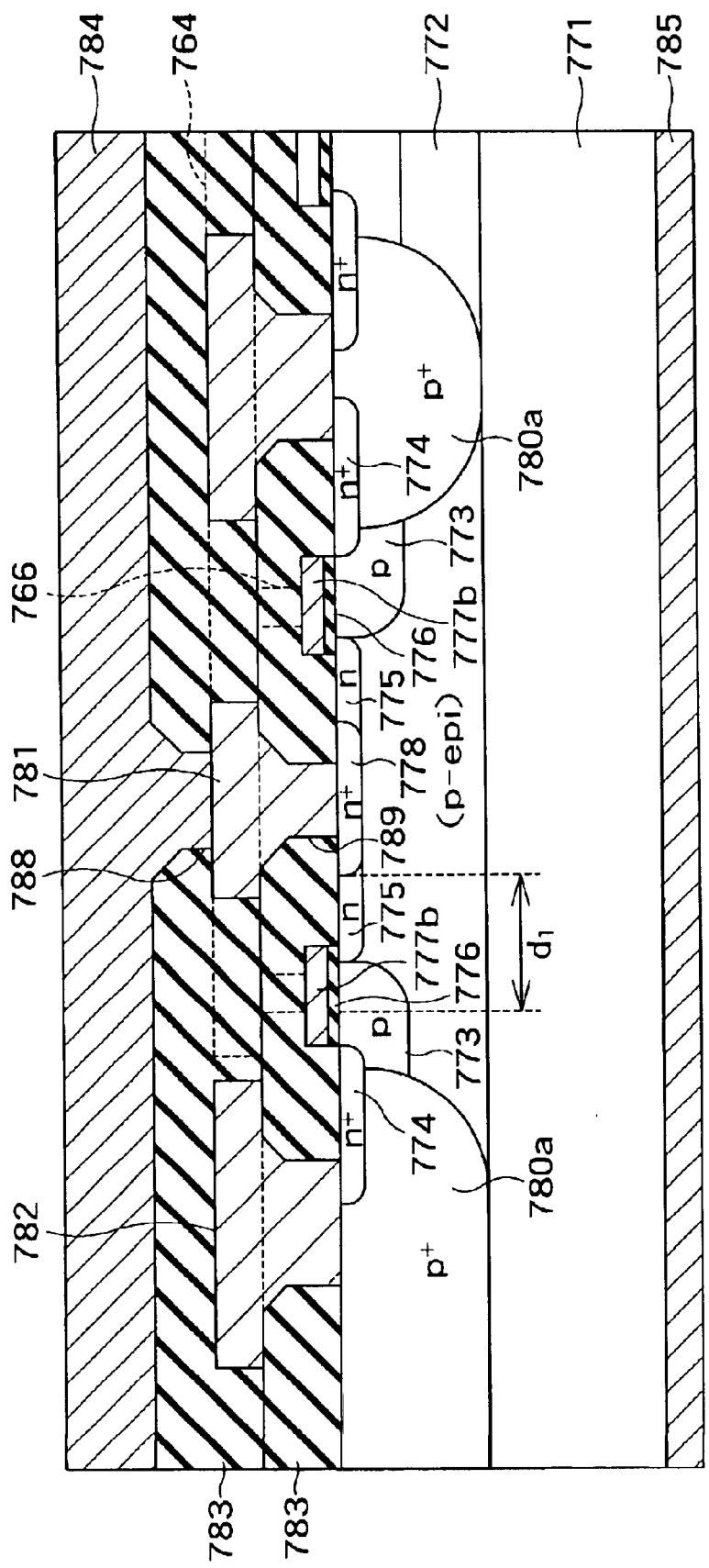
FIG. 29 is a cross-sectional view of an element-side semiconductor device 252 taken along the line A—A of FIG. 28.

FIG. 29 is a cross-sectional view of an element-side semiconductor device 252 taken along the line A—A of FIG.

28. With reference to FIG. 29, configuration of the semiconductor device according to the instant embodiment is explained in greater detail.

The element-side semiconductor device 252 includes a low-resistance p+-type silicon semiconductor substrate 771, and a p−-type silicon epitaxial layer 772 epitaxially grown on the surface of the semiconductor substrate 771 and having a higher resistance than the semiconductor substrate 771. Thickness of the silicon epitaxial layer 772 is approximately 3 μm.

On the surface of the silicon epitaxial layer 772, p-type body regions 773 are selectively formed. A part of the surface of each body region 773 functions as a channel region of a semiconductor element. In opposite sides of each channel region, an n+-type source layer 774 and an n-type drift layer (also called as an electrolysis buffering portion) 775 are selectively formed in a self-aligned fashion to oppose to each other. On the body region 773 between the source layer 774 and the drift layer 775, i.e. on the channel region, a gate insulating film 776 in form of a silicon oxide film is formed. On the gate insulating film 776, the gate electrode 777b is formed. Inside the drift region 775, the n+-type contact portion 778 is selectively formed. The drain layer is made up of the drift region 775 and the contact portion 778.

Under the source region 774, a p+-type element-side connecting portion 780a is formed. The element-side connecting portion 780a extends from the epitaxial layer 772 to reach the semiconductor substrate 771. The short-circuiting electrode 782 is formed to contact with and connect the source layer 774 and the connecting portion 780a. FIG. 29 shows a section of the source layer 774 at its projecting portion 774A. Therefore, the source layer 774 is in contact with the short-circuiting electrode 782.

The contact portion 778 is in contact with the drain electrode 781 via the contact plug 789.

Furthermore, an inter-layer insulating layer 783 is formed on the epitaxial layer 772, and the drain electrode 784 overlies the inter-layer insulating layer 783. The drain electrode 784 is connected to the drain electrode 781, and electrically connected to the contact portion 778 via the contact plug 789.

On the bottom surface of the semiconductor substrate 771, the source electrode 785 is formed in contact with the semiconductor substrate 771. Therefore, the source layer 774 is electrically connected to the source electrode 785 through the short-circuiting electrode 882, connecting portion 780 and semiconductor substrate 771. Although the gate interconnection 764 does not appear in the section taken along the line A—A of FIG. 28, FIG. 29 shows it in a see-through fashion with a broken line.

The element-side semiconductor device 252 is different from the element-side semiconductor 200 shown in FIG. 2 in the configuration of the element-side connecting portion 100. The element-side connecting portion 100 of the element-side semiconductor device 200 in FIG. 2 does not reach the semiconductor substrate 40, but the element-side connecting portion 780a of the element-side semiconductor device 252 reaches the semiconductor substrate 771. As a result, the ON resistance of each unit cell of this embodiment is lower than those of the embodiments in which only the contact-side connecting portion reaches the semiconductor substrate. Moreover, even if the drift layer 775 includes laterally narrow local portions due to fluctuation in the manufacturing process and the withstanding voltage of the element-side semiconductor device 252 decreases, the element-side connecting portion 780a can flow electric charges to the semiconductor substrate 771 relatively easily.

The drain electrode 784 and the source electrode 785 are main electrodes. The short-circuiting electrode 782 is formed to short-circuit the source region 774 and the connecting portion 780.

Figure 30:
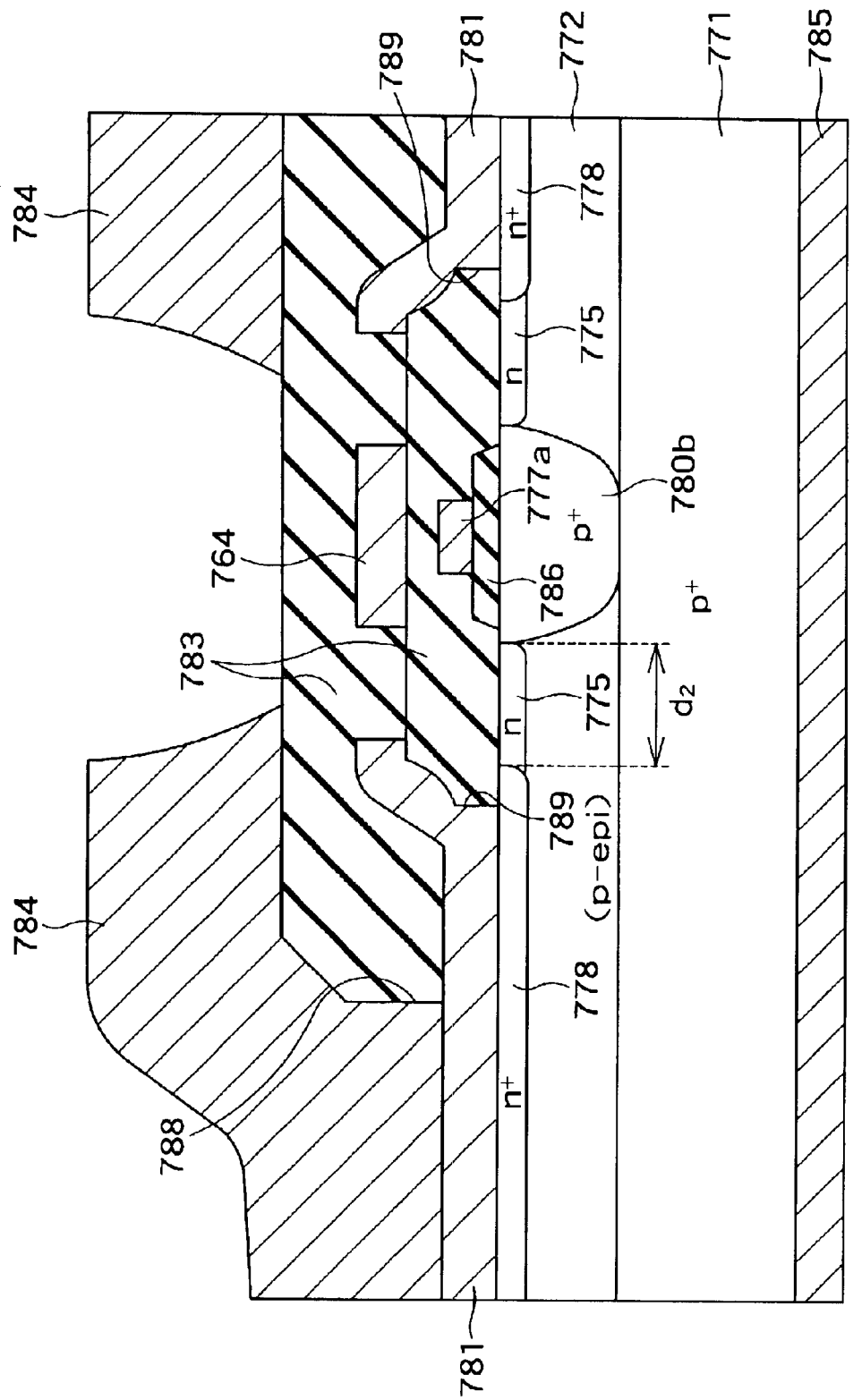
FIG. 30 is a cross-sectional view of a interconnection-side semiconductor device 352 taken along the line B—B of FIG. 28.

FIG. 30 is a cross-sectional view of a interconnecting-side semiconductor device 352 taken along the line B—B of FIG. 28. As already explained, the drain electrode 784 overlying the gate interconnection 764 is selectively removed from above the gate interconnection 764 in order to minimize the gate-drain parasitic capacitance.

A interconnection insulating film 786 underlies the gate electrode 777a, and a interconnection-side connecting portion 780b underlies the gate electrode 777a. The interconnection-side connecting portion 780b extends along the gate interconnection 764 and the gate electrode 777a below the gate interconnection 764 and the gate electrode 777a. That is, the interconnection-side connecting portion 780b substantially is perpendicular to the element-side connecting portion 780a. As a result, the surface region of the semiconductor substrate can be used effectively, and the semiconductor device can be further downsized. The element-side connecting portion 780a and the interconnection-side connecting portion 780b may be equal in depth. Therefore, the element-side connecting portion 780a and the interconnection-side connecting portion 780b can be formed in a common manufacturing process. Thus the embodiment shown here is more advantageous for simplifying the manufacturing process than other embodiments. The interconnection insulating film 786 is thicker than the gate insulating film 776. While the thickness of the gate insulating film 776 is approximately 30 nm, thickness of the interconnection insulating film 786 is approximately from 100 nm to 300 nm. The interconnection insulting film 786 thicker than the gate insulating film 776 contributes to diminishing the parasitic capacitance between the gate electrode 777a and the interconnection-side connecting portion 780b. It results in reducing the gate-source parasitic capacitance of the semiconductor device.

The drift layer 775 has an LDD (lightly doped drain) structure. The drift layer 775 serves as the field-buffering portion 775. Therefore, withstanding voltage of the element-side semiconductor device 252 is determined substantially by the lateral length of the drift layer 775. If the lateral length of the drift layer 775 is approximately 1 μm, then the withstanding voltage of the element-side semiconductor device 252 is approximately from 30V to 40V.

The drift layer 775 is formed by ion implantation of an n-type impurity such as phosphorus (P) or arsenic (As). The quantity of the impurity implanted into the drift layer 775 is approximately from $2 \times 10^{12}$ to $4 \times 10^{12}$ cm$^{-2}$. In the section shown in FIG. 29, perimeters of the drift layer 775 are formed in self-alignment by using the gate electrode 777b as its mask.

The drift layer 775 is relatively shallow, and its depth is approximately from 0.1 μm to 0.2 μm. As a result, the drift layer 775 and the gate electrode 777b are opposed only in a small area, and the drain-gate capacitance is small. Therefore, by employing the LDD structure, the semiconductor device according to the embodiment can be increased in switching speed and decreased in switching loss.

The contact portion 778 must be in ohmic contact with the contact plug 789. For this purpose, n-type impurity concentration of the surface of the contact portion 778 should be at least about $1 \times 10^{18}$ cm$^{-3}$, and preferably not lower than $1 \times 10^{19}$ cm$^{-3}$ approximately.

In case the withstanding voltage of the element-side semiconductor device 252 need not be higher than 10V, the n⁺-type contact portion 778 is formed in self-alignment by using the gate electrode 777b as its mask without forming the drift layer 775.

Thickness of the inter-layer insulating film 783 between the short-circuiting electrode 782 and the drain electrode 784 is 1 μm or more to minimize the parasitic capacitance between the parasitic drain and source generated between the short-circuiting electrode 782 and the drain electrode 784. However, in case the inter-layer insulating film 783 between the short-circuiting electrode 782 and the drain electrode 784 is excessively thick, aspect ratio of the contact hole 788 will become excessively large. This makes it difficult to bury the drain electrode 784 in the contact hole 788 and undesirably increases the resistance value of the drain electrode 784. Increase of the resistance value of the drain electrode 784 cause to increase the resistance value of the element-side semiconductor device 252. Therefore, there is an upper limit for the thickness of the inter-layer insulating film 783 between the short-circuiting electrode 782 and the drain electrode 784.

Thickness of the drain electrode 784 is 4 μm or more, and preferably 6 μm or more. The semiconductor substrate 771 is as thick as 100 μm or less. As a result, the ON resistance of the element-side semiconductor device 252 is reduced.

The channel region of the element-side semiconductor device 252 is formed to include not only the p⁻-type epitaxial layer 772 and also the p-type body region 773. The body region 773 is formed by ion implantation or thermal diffusion of a p-type impurity (such as boron) in a process preceding the process of forming the gate electrode 777. In this process, the impurity is injected only to about a half of the portion, which will underlie the gate electrode 777b formed later, nearer to the source layer 774, and no ions are implanted into about the half nearer to the drain layer. Therefore, the p-type impurity concentration gradually becomes lower toward the drain-side perimeter of the channel region (perimeter of the drift layer 775). As a result, in the element-side semiconductor device 252, the depletion layer extending from between the body region 773 and the drift layer 775 also extends into the body region 773 in addition to the drift layer 775.

On the other hand, in case the p-type impurity concentration is relatively higher near the perimeter of the channel region nearer to the drain (perimeter of the drift layer 775), concentration of the end portion of the n-type drift layer 775 undesirably decreases. It invites an increase of the ON resistance of the element-side semiconductor device 252.

In the element-side semiconductor device 252, drain layers 775, 778, body region 773 and source layer 774 form an npn bipolar transistor in the region from the drain electrode 781 and the short-circuiting electrode 782. Once a voltage is applied to the bipolar transistor, the depletion layer extends longer by d1 than the lateral width of the drift layer 775 as already explained.

In the interconnection-side semiconductor device 352 shown in FIG. 30, the connector portion 780b and the drift layer 775 form a parasitic diode between the semiconductor substrate 771 and the drain region 778. Once a voltage is applied to the parasitic diode, the depletion layer extends by the lateral width d2 of the drift layer 775.

Since the width d2 is narrower than the width d1, withstanding voltage of the parasitic diode in the interconnection-side semiconductor device 352 is lower than the withstanding voltage of the bipolar transistor in the element-side semiconductor device 252. Therefore, if a large voltage is applied to the semiconductor device, for example, upon L-load switching, the parasitic diode in the interconnection-side semiconductor device 352 breaks down by avalanche breakdown. Therefore, no voltage higher than the withstanding voltage of the parasitic diode is applied to the element-side semiconductor device 252. As a result, it does not occur that the element formed in the semiconductor device according to the embodiment, i.e. the element-side semiconductor device 252, is destructed by a large voltage.

Figure 31:
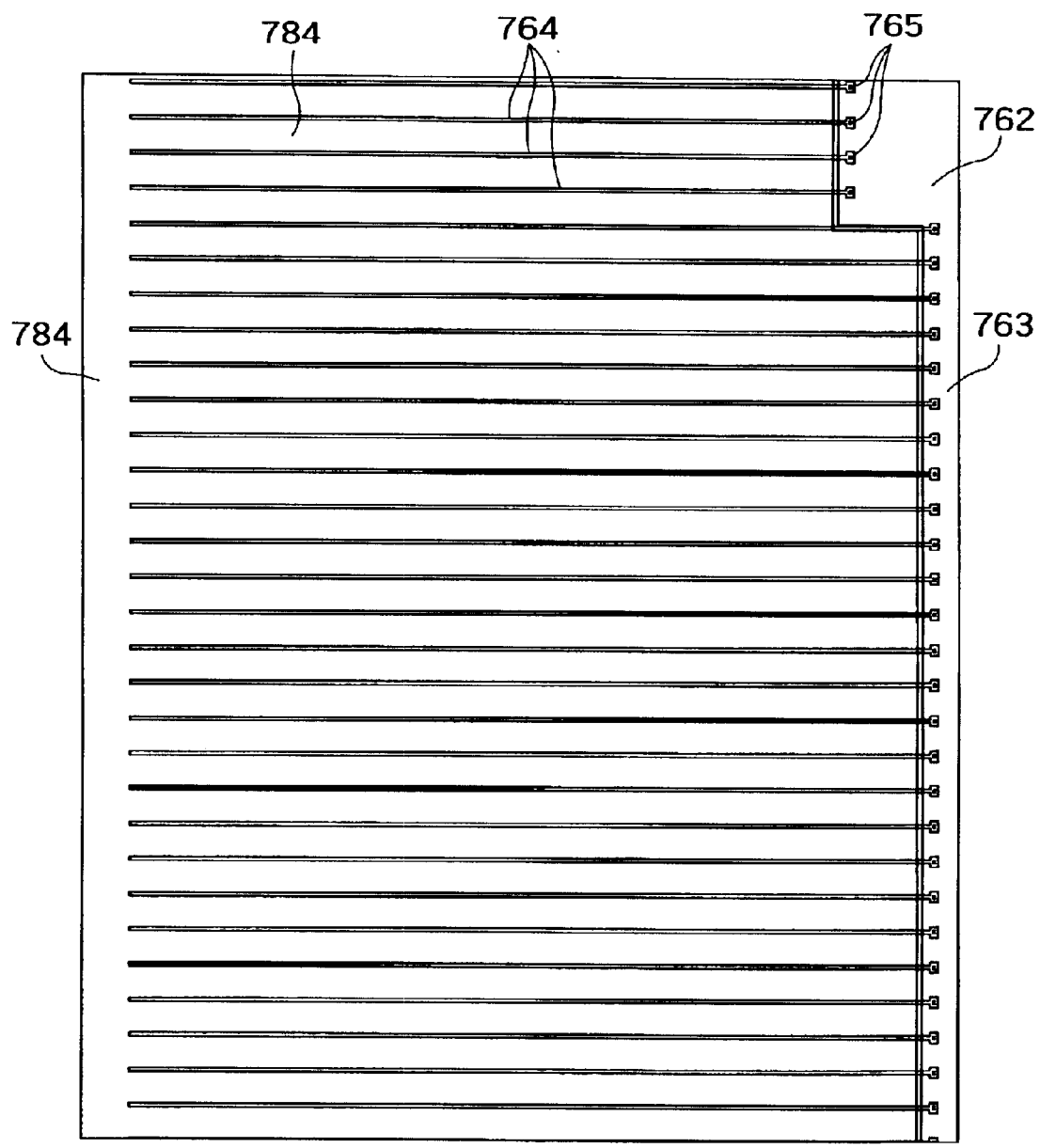
FIG. 31 is a enlarged plan view of a semiconductor device according to the eighth embodiment.

FIG. 31 is an enlarged plan view of a semiconductor device according to the eighth embodiment. The semiconductor device according to this embodiment is different from the semiconductor device according to the seventh embodiment in that the drain electrode 784 is formed to lie also above the gate interconnection 764.

Figure 32:
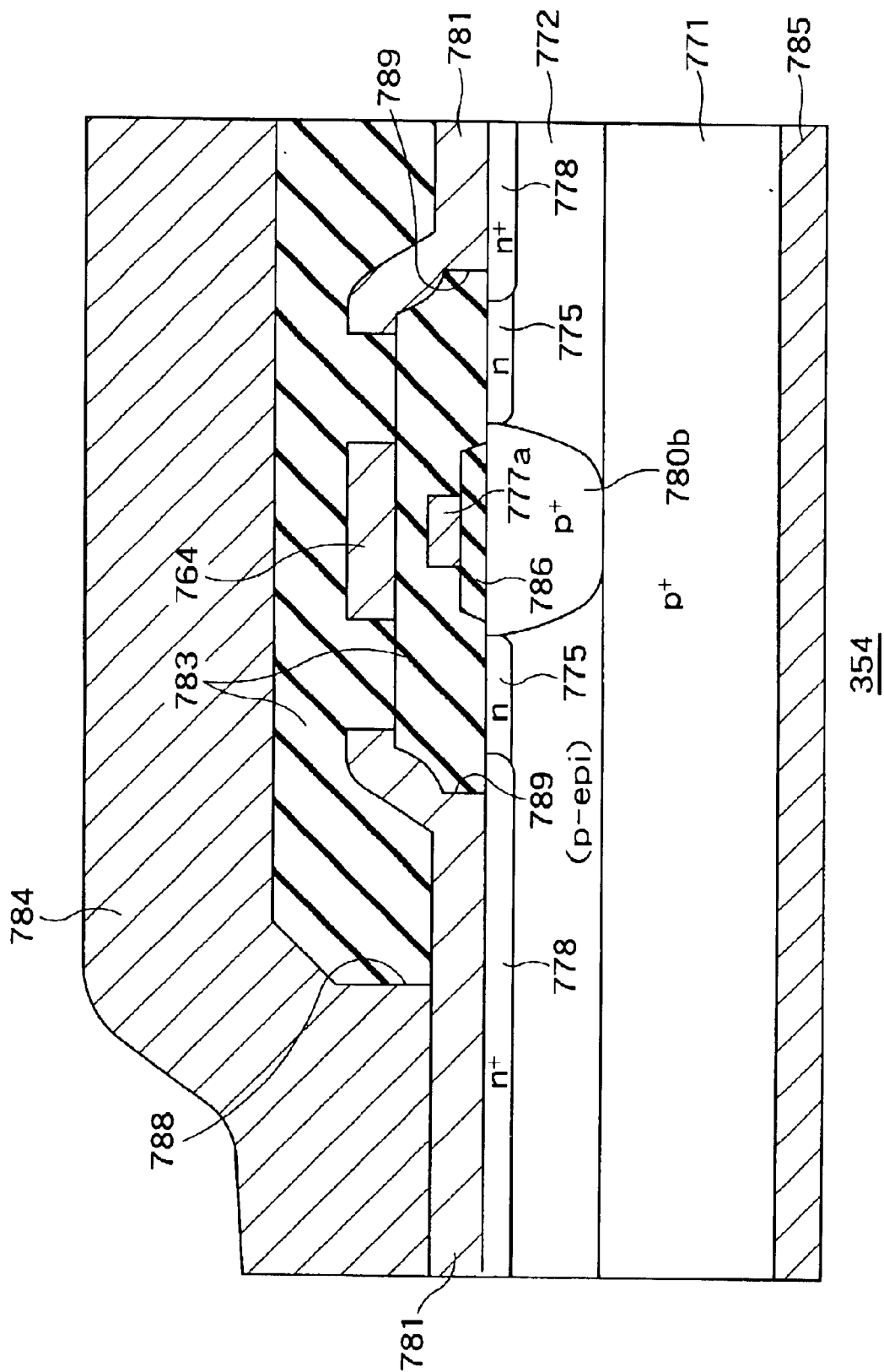
FIG. 32 is a cross-sectional view of a interconnection-side semiconductor device 354 according to the eighth embodiment.

FIG. 32 is a cross-sectional view of a interconnection-side semiconductor device 354 according to the eighth embodiment. As compared with the interconnection-side semiconductor device 352 shown in FIGS. 28 and 30, the drain electrode 784 is formed to lie also above the gate interconnection 764. Since the resistance value of the drain electrode 784 therefore decreases, the ON resistance of the semiconductor device according to the eighth embodiment is lower than the ON resistance of the semiconductor device according to the seventh embodiment. The element-side semiconductor device according to the instant embodiment is omitted from illustration because its configuration is the same as that of the element-side semiconductor device according to the seventh embodiment.

Figure 33:
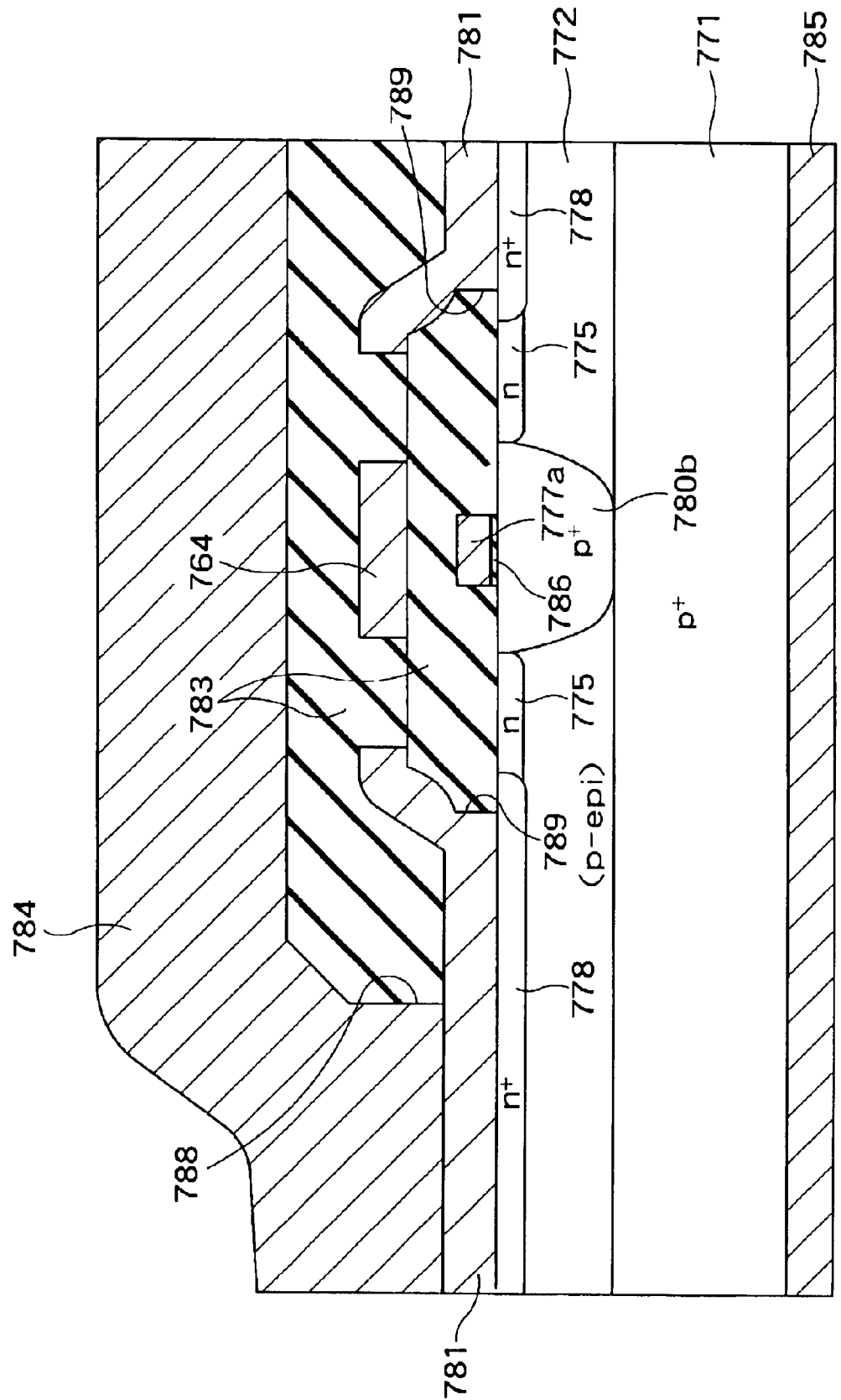
FIG. 33 is a cross-sectional view of a interconnection-side semiconductor device 356 according to the ninth embodiment.

FIG. 33 is a cross-sectional view of a interconnection-side semiconductor device 356 according to the ninth embodiment. This embodiment is different from the semiconductor device according to the seventh embodiment in that the drain electrode 784 lies also above the gate interconnection 764 and that the thickness of the interconnection insulating film 786 is approximately equal to the thickness of the gate insulating film 776 of the element-side semiconductor device.

Because of the existence of the drain electrode 784 also above the gate interconnection 764, the ON resistance of the semiconductor device according to this embodiment is lower than the ON resistance of the semiconductor device according to the seventh embodiment. In addition, because the thickness of the interconnection-side insulating film 786 is approximately equal to the thickness of the gate insulating film 776, the interconnection insulating film 786 of the interconnection-side semiconductor device 356 and the gate insulating film 776 of the element-side semiconductor device can be manufactured in a common process. Here again, configuration of the element-side semiconductor device is the same as that of the element-side semiconductor device according to the seventh embodiment, it is omitted here.

Figure 34:
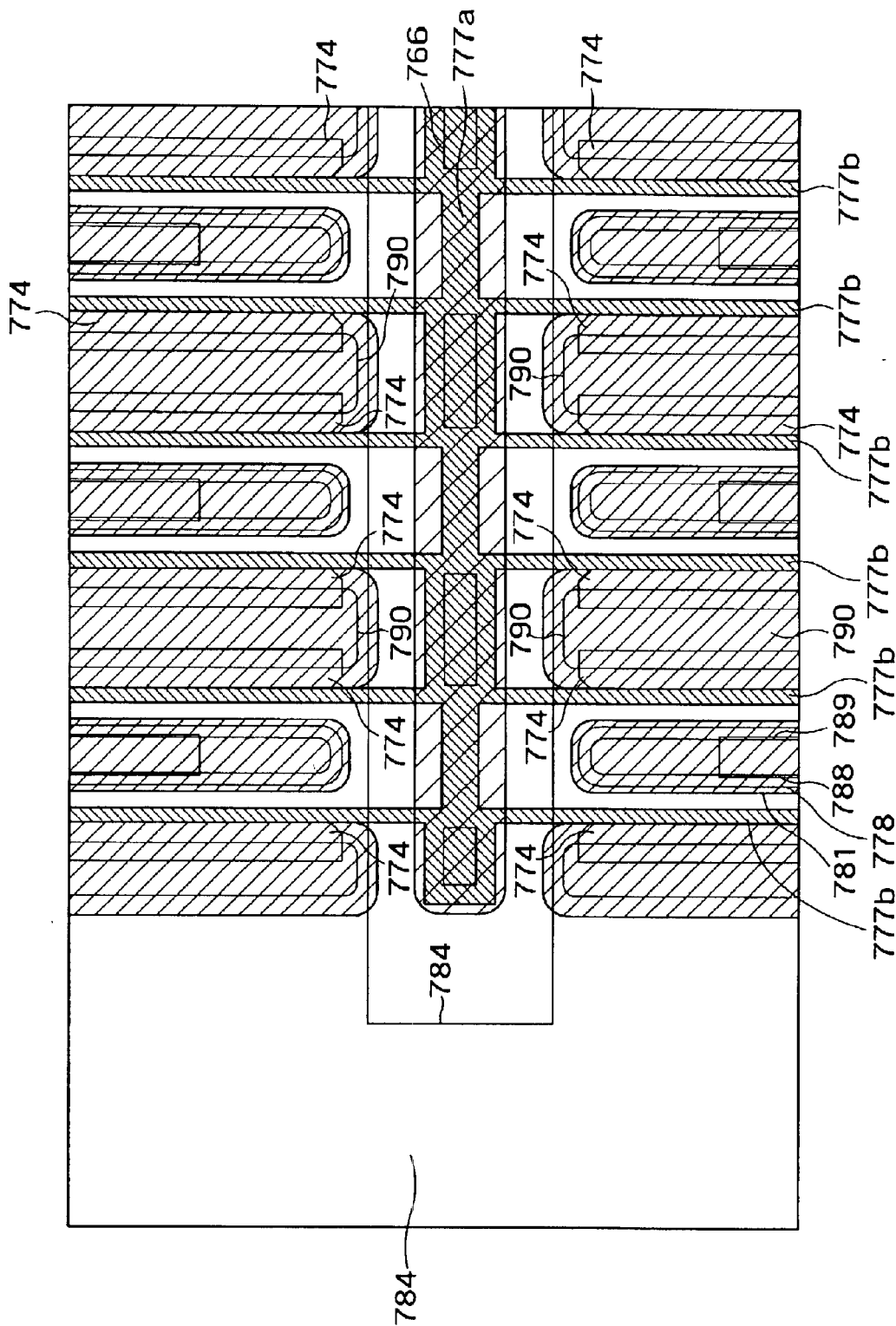
FIG. 34 is an enlarged plan view of a semiconductor device according to the tenth embodiment.

FIG. 34 is an enlarged plan view of a semiconductor device according to the tenth embodiment. According to the seventh embodiment shown in FIG. 28, the source diffusion layer 774 is comb-shaped, and the projecting portion 774A alone is in contact with the short-circuiting electrode 782.

In this embodiment, however, the source diffusion layer 774 is formed in an elongated geometry on the surface of the semiconductor substrate, and contacts with the entire length of one of its longer sides of the short-circuiting electrode 782. As a result, the ON resistance of the semiconductor device according to the embodiment is lower than the ON resistance of the semiconductor device according to the seventh embodiment. Cross-sectional views of the element-side semiconductor device and the interconnection-side semiconductor device should appear equally to the cross-sectional views of the semiconductor device according to the seventh embodiment, namely, FIG. 29 and FIG. 30, and they are not shown here.

Figure 35:
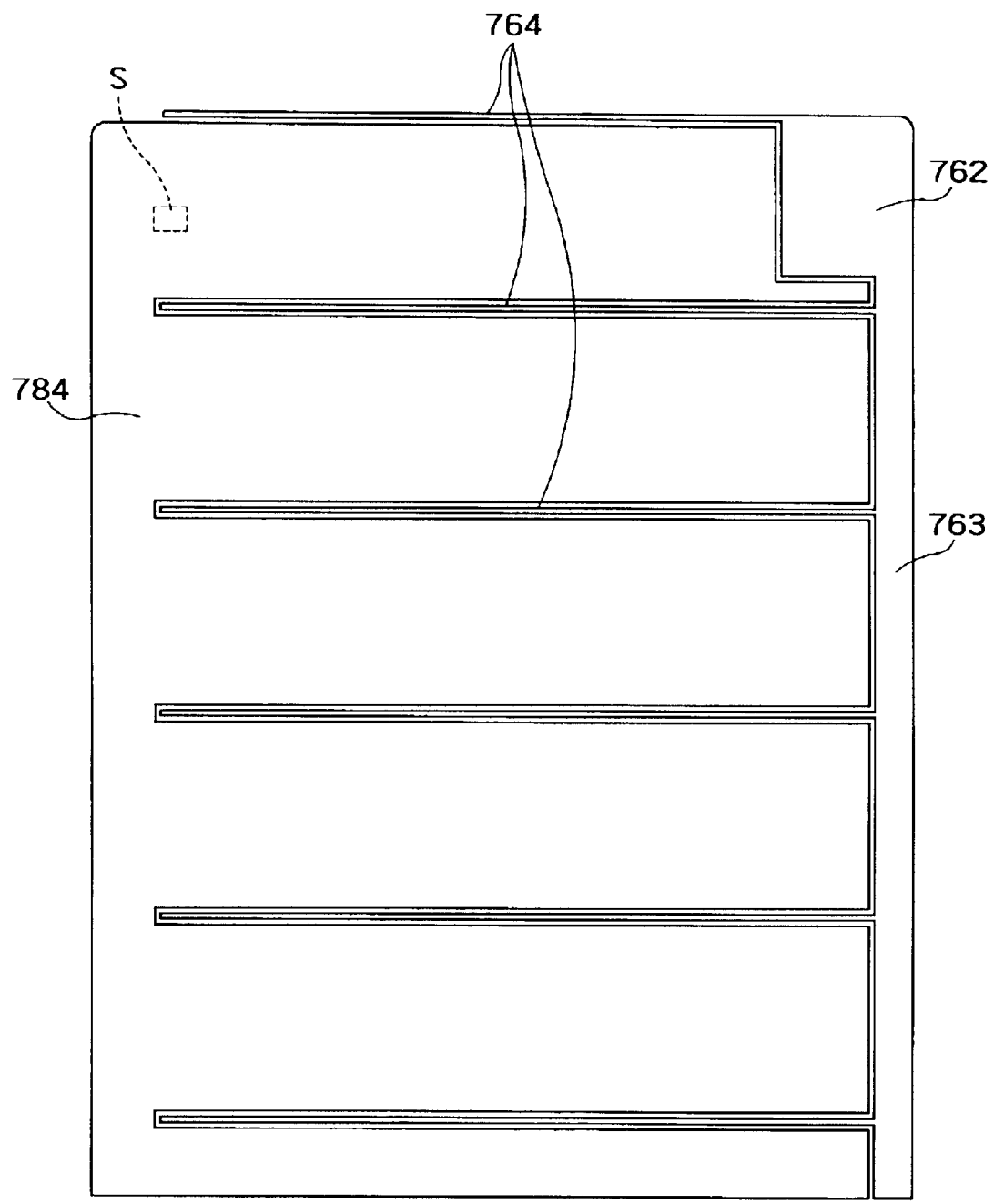
FIG. 35 is an enlarged plan view of a semiconductor device according to the eleventh embodiment.

FIG. 35 is an enlarged plan view of a semiconductor device according to the eleventh embodiment. This embodiment is different from the seventh embodiment shown in FIG. 28 in that there are less gate electrodes 777a and gate interconnections 764. In the seventh embodiment, gate electrodes 777a and gate interconnections 764 are formed above all interconnection-side semiconductor devices (FIG. 30). In this embodiment, however, there are no gate electrodes 777a and gate interconnections 764 above many of the interconnection-side semiconductor devices (for convenience, they are still called interconnection-side semiconductor devices even though not having gate electrodes 777a and gate interconnections 764). Moreover, in the instant embodiment, the gate interconnections 764 form a pattern made of a common layer a metal to the bonding pad 762 and the gate connection pattern 763, and they are continuously connected. Therefore, it needs not vias 765 unlike the seventh embodiment.

Similarly to the seventh embodiment, the gate interconnections 764 may be formed in a common layer of a metal to the short-circuiting electrodes 782 and the drain electrodes 781 such that they are connected to the gate connection pattern 763 by the vias 765.

Figure 36:
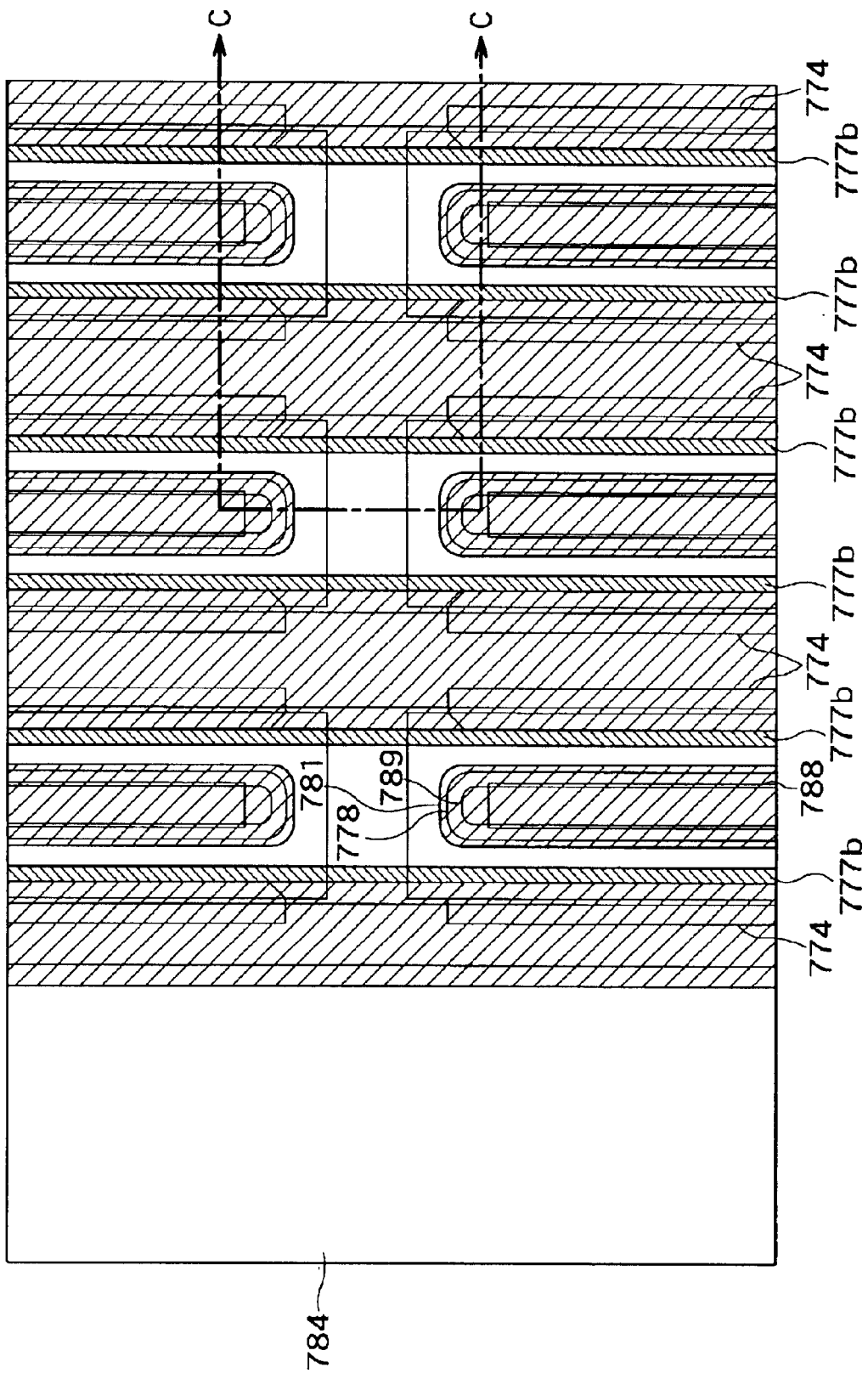
FIG. 36 is an enlarged, see-through plan view of a portion S shown by the broken line in the MOSFET chip shown in FIG. 35.

FIG. 36 is an enlarged, see-through plan view of a portion S shown by the broken line in the MOSFET chip shown in FIG. 35. Here is shown the portion where the gate electrodes 777a and gate interconnections 764 are not formed. Each gate electrode 777b continuously extends in a direction substantially being perpendicular to the gate interconnections 764. The gate electrodes 777 are made of a low-resistance material such as a metal or a metal silicide, for example. All gate electrodes 777b are connected to the gate interconnections 764 and the gate electrodes 777a. Although the gate electrodes 777a and the gate interconnections 764 are not formed above many of the interconnection-side semiconductor devices, since the gate electrodes 777b are made of a low-resistance material, resistance from each gate electrode 777b to the bonding pad 762 is sufficiently low. The gate electrodes 777a and the gate interconnections 764 may be reduced to only two at the extreme ends, for example.

On the other hand, the connecting portion 780b (see FIG. 37) underlies the interconnection-side semiconductor device similarly to the seventh embodiment. Thereby, the element-side semiconductor device can be protected.

Figure 37:
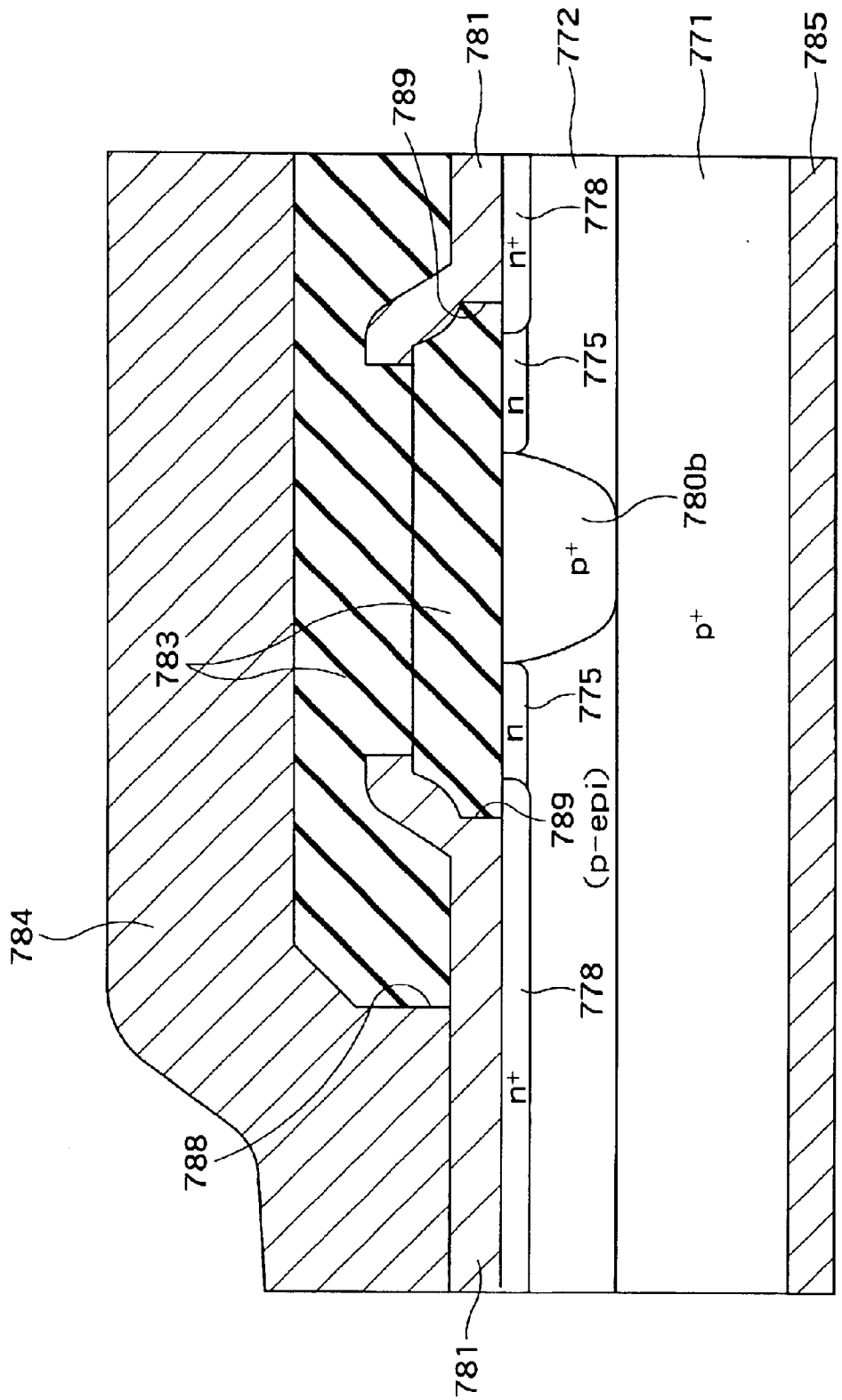
FIG. 37 is a cross-sectional view of a interconnection-side semiconductor device taken along the line C—C of FIG. 36.

FIG. 37 is a cross-sectional view of a interconnection-side semiconductor device taken along the line C—C of FIG. 36. The interconnection-side semiconductor device 358 includes no gate interconnections 764 and no gate electrodes 777a. Therefore, unlike the interconnection-side semiconductor device 352 shown in FIG. 30, the gate-drain parasitic capacitance is out of problem, and the drain electrode 784 need not be removed from above the connecting portion 780.

Moreover, since the instant embodiment need not take account the contact and the parasitic capacitance between the gate electrode 777a and the connecting portion 780b, the interconnection insulating film 786 need not be formed.

In case the gate electrodes 777 are made of a metal silicide in this embodiment, one electrode layer can be reduced if the short-circuiting electrodes 782 and the drain electrodes 781 are made of the same metal silicide as well.

Figure 38:
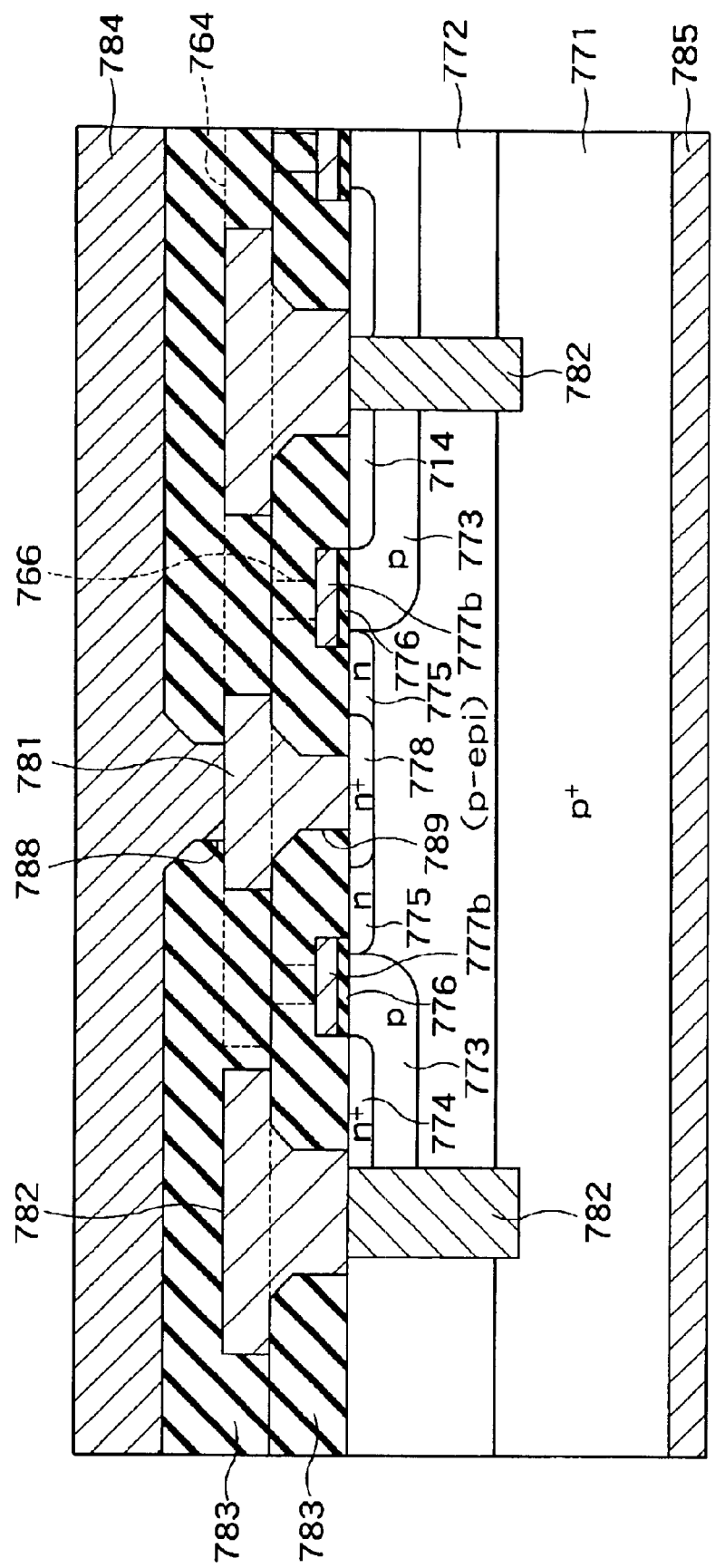
FIG. 38 is a cross-sectional view of an element-side semiconductor device 260 using metal plugs 782 in lieu of the connecting portions 780 in the element-side semiconductor device 252 shown in FIG. 29.

FIG. 38 is a cross-sectional view of an element-side semiconductor device 260 using metal plug 782 in lieu of the connecting portions 780 in the element-side semiconductor device 252 shown in FIG. 29. Each metal plug 782 extends from the surface of the epitaxial layer 772 and reaches the semiconductor substrate 771.

Figure 39:
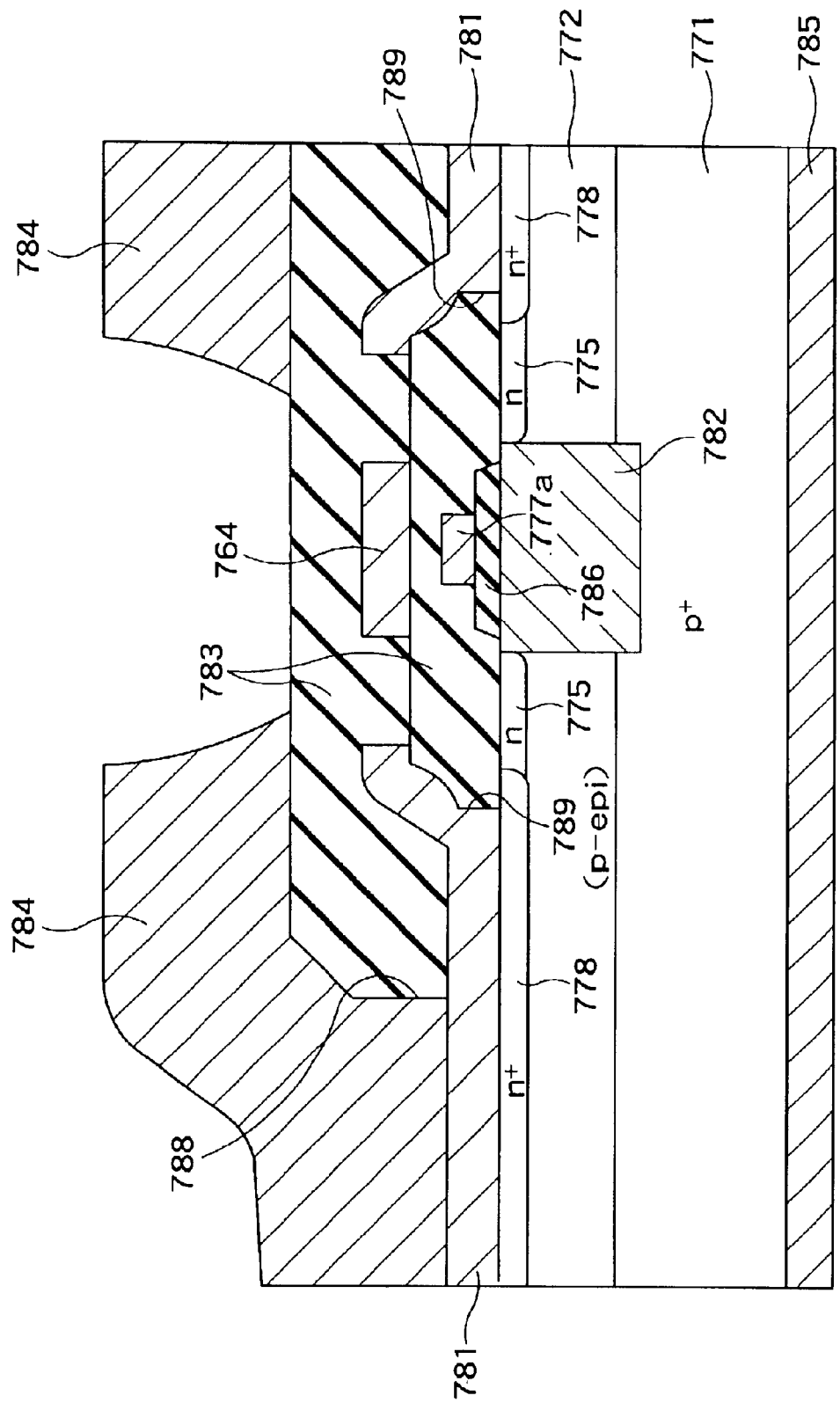
FIG. 39 is a cross-sectional view of a interconnection-side semiconductor device 360 using metal plugs 782 in lieu of the connecting portions 780 in the interconnection-side semiconductor device 352 shown in FIG. 30.

FIG. 39 is a cross-sectional view of a interconnection-side semiconductor device 360 using metal plugs 782 in lieu of the connecting portions 780 in the interconnection-side semiconductor device 352 shown in FIG. 30. Each metal plug 782 extends from the surface of the epitaxial layer 772 and reaches the semiconductor substrate 771.

The use of the metal plugs 782 instead of the connecting portions 780 as shown in FIGS. 38 and 39 contributes to reducing the ON resistance of the semiconductor device. Moreover, metal plugs can be formed narrower than diffusion layers, the use of metal plugs enables downsizing of the semiconductor device.

The element-side semiconductor device 260 may be combined with the interconnection-side semiconductor device 360 to make up a semiconductor device. Alternatively, it may be combined with the interconnection semiconductor device 352, 354, 356 or 358.

On the other hand, the interconnection-side semiconductor device 360 may be combined with, for example, the element-side semiconductor device 252 to make up the semiconductor device.

Figure 40:
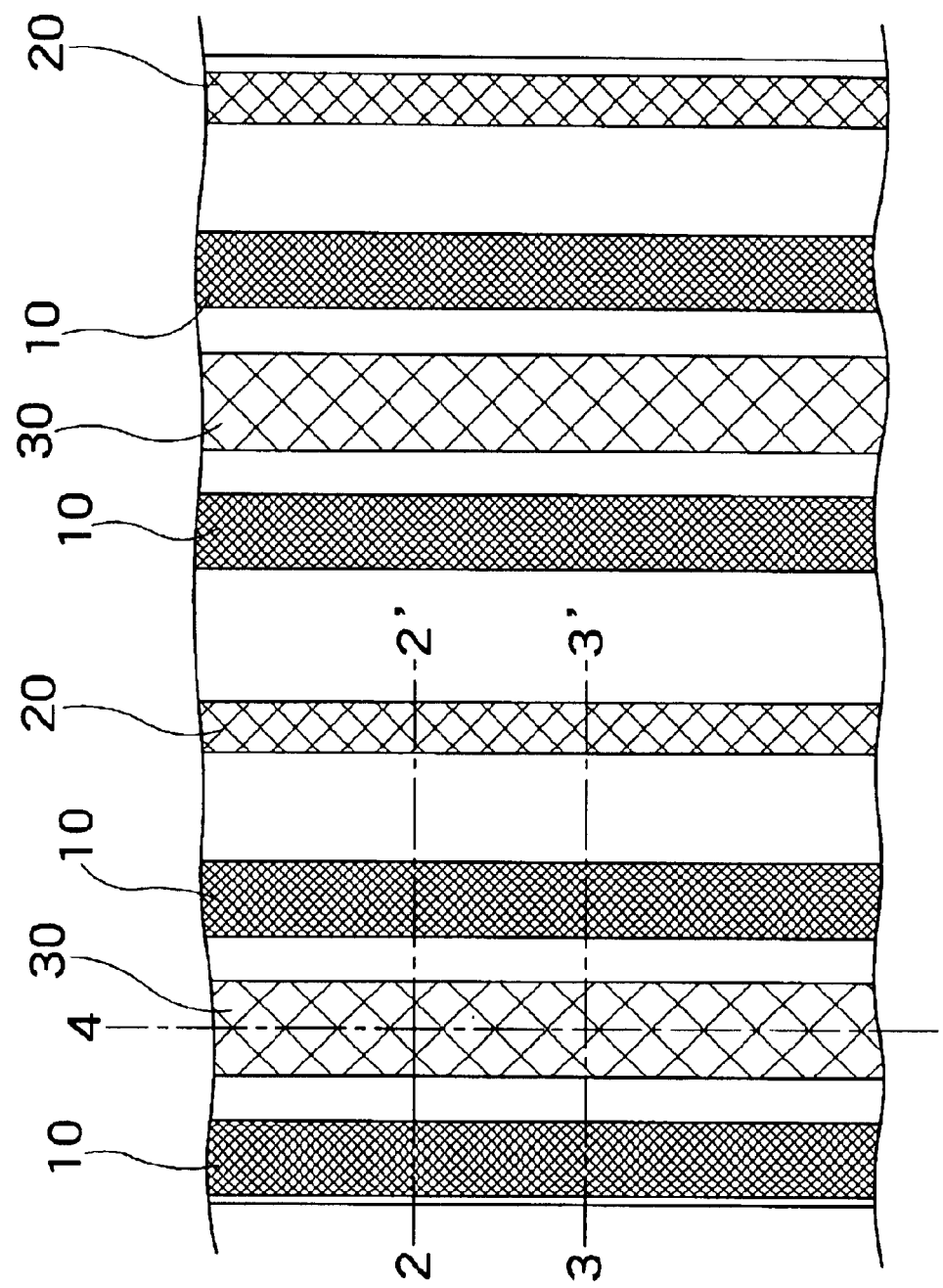
FIG. 40 is an enlarged schematic plan view of a part of a semiconductor device according to the twelfth embodiment.

FIG. 40 is an enlarged schematic plan view of a part of a semiconductor device according to the twelfth embodiment. This embodiment is different from the contact-side semiconductor device 300 according to the first embodiment (see FIG. 3) in that the contact-side semiconductor device 362 has no source region 80. The element-side semiconductor device in this embodiment is the same as the element-side semiconductor device 200 shown in FIG. 2.

Figure 41:
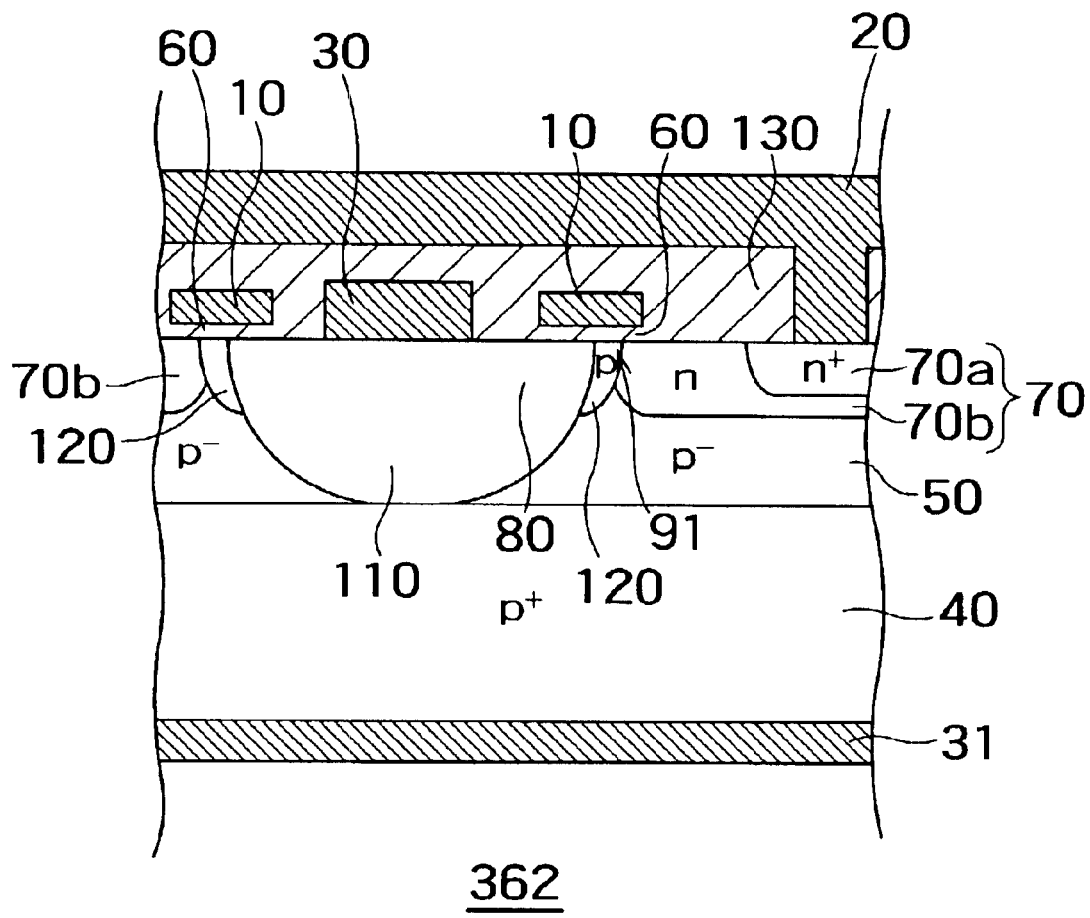
FIG. 41 is a cross-sectional view of a contact-side semiconductor device 362 according to the twelfth embodiment.

FIG. 41 is a cross-sectional view of a contact-side semiconductor device 362 according to the same embodiment. The semiconductor device made up of a combination of the element-side semiconductor device 200 and the contact-side semiconductor device 362 according to this embodiment also ensures the same effects as those of the first embodiment.

What is claimed is:

1. A semiconductor device comprising:

a semiconductor substrate;

a semiconductor layer having a higher resistance than that of said semiconductor substrate and provided on a top surface of said semiconductor substrate;

a gate electrode provided on a gale insulating film on the top surface of said semiconductor layer;

a drain layer of a first conductivity type selectively provided in a location in said semiconductor layer in one side of said gate electrode;

a drain electrode connected to said drain layer;

a source layer of the first conductivity type selectively provided in a location in said semiconductor layer in the other aide of said gate electrode;

an element-side connecting portion selectively provided on said semiconductor layer, said element-side connecting portion being provided in an active region on which semiconductor elements are formed;

a contact-side connecting portion selectively provided on said semiconductor layer, having lower resistance than said semiconductor layer and extending deeper toward said semiconductor substrate than said element-side connecting portion, said contact-side connecting portion being provided in an inactive region on which semiconductor elements are not formed;

a first source electrode connecting said source layer, said element-side connecting portion and said contact-side connecting portion; and a bottom electrode provided on the bottom surface of said semiconductor substrate in connection therewith.

2. The semiconductor device according to claim 1, wherein said bottom electrode is a second source electrode, and said contact-aide connecting portion reaches said semiconductor substrate.

3. The semiconductor device according to claim 2, wherein at least one of said element-side connecting portion and said contact-side connecting portion is a metal plug.

4. A semiconductor device comprising;

a semiconductor substrate;

a semiconductor layer having a higher resistance than that of said semiconductor substrate and provided on a top surface of said semiconductor substrate;

a gate electrode provided on a gate insulating film on the top surface of said semiconductor layer;

a drain layer of a first conductivity type selectively provided in a location in said semiconductor layer in one side of said gate electrode;

a drain electrode connected to said drain layer;

a source layer of the first conductivity type selectively provided in a location in said semiconductor layer in the other side of said gate electrode;

an element-side connecting portion selectively provided on said semiconductor layer, said element-side connecting portion being provided in an active region on which semiconductor elements are formed;

a contact-side connecting portion selectively provided on said semiconductor layer, having lower resistance than said semiconductor layer and extending deeper toward said semiconductor substrate than said element-side connecting portion, said contact-side connecting portion being provided being provided in an inactive region on which semiconductor elements are not formed;

a first source electrode connecting said source layer, said element-side connecting portion and said contact-side connecting portion; and a bottom electrode provided on the bottom surface of said semiconductor substrate in connection therewith;

wherein said bottom electrode is a second source electrode, and said contact-side connecting portion reaches said semiconductor substrate;

wherein said element-side connecting portion and said contact-side connecting portion are diffusion layers of a second conductivity type which is opposite to the first conductivity type.

5. The semiconductor device according to claim 3, wherein one or more said element-side connecting portions are provided along a straight line and wherein said contact-side connecting portion as provided to intervene between said element-side connecting portions or overlap said element-side connecting portions, said contact-side connecting portion is wider and deeper than said element-side connecting portions in a section perpendicular to the straight line.

6. A semiconductor device comprising:

a semiconductor substrate;

a semiconductor layer having a higher resistance than that of said semiconductor substrate and provided on a top surface of said semiconductor substrate;

a gate electrode provided on a gate insulating film on the top surface of said semiconductor layer;

a drain layer of a first conductivity two selectively provided in a location in said semiconductor layer in one side of said gate electrode;

a drain electrode connected to said drain layer;

a source layer of the first conductivity type selectively provided in a location in said semiconductor layer in the other side of said gate electrode;

an element-side connecting portion selectively provided on said semiconductor layer, said element-side connecting portion being provided in an active region on which semiconductor elements are formed;

a contact-side connecting portion selectively provided on said semiconductor layer, having lower resistance than said semiconductor layer and extending deeper toward said semiconductor substrate than said element-side connecting portion, said contact-side connecting portion being provided in an inactive region on which semiconductor elements are not formed;

a first source electrode connecting said source layer, said element-side connecting portion and said contact-side connecting portion; and a bottom electrode provided on the bottom surface of said semiconductor substrate in connection therewith;

wherein an element-side semiconductor device including said element-side connecting portion has a first bipolar transistor made up of said drain layer, said channel portion and said source layer in a region from said drain electrode to said first source electrode, wherein a contact-side semiconductor device including said contact-side connecting portion has a second bipolar transistor made up of said drain layer, said channel portion, said contact-side connecting portion and said source layer in a region from said drain electrode to said first source electrode; and wherein the withstanding voltage between said drain electrode and said first source electrode in said second bipolar transistor is substantially equal to or lower than the withstanding voltage between said drain electrode and said first source electrode in said first bipolar transistor.

7. The semiconductor device according to claim 6, wherein said drain layer includes a high-concentration layer having a relatively low resistance, and a field buffering portion provided around said high-concentration layer and having a relatively high resistance; and wherein the width of said field buffering portion from said high-concentration layer toward said channel portion in said contact-side semiconductor device is smaller than the width of said field buffering portion from said high-concentration layer toward said channel portion in said element-side semiconductor device.

8. A semiconductor device comprising:

a semiconductor substrate;

a semiconductor layer having a higher resistance than that of said semiconductor substrate and provided on a top surface of said semiconductor substrate;

a gate electrode provided on a gate insulating film on the top surface of said semiconductor layer;

a drain layer of a first conductivity type selectively provided in a location in said semiconductor layer in one side of said gate electrode;

a drain electrode connected to said drain layer;

a source layer of the first conductivity type selectively provided in a location in said semiconductor layer in the other side of said gate electrode;

an element-side connecting portion selectively provided on said semiconductor layer, said element-side connecting portion being provided in an active region on which semiconductor elements are formed;

a contact-side connecting portion selectively provided on said semiconductor layer, having lower resistance than said semiconductor layer and extending deeper toward said semiconductor substrate than said element-side connecting portion, said contact-side connecting portion being provided in an inactive region on which semiconductor elements are not formed;

a first source electrode connecting said source layer, said element-side connecting portion and said contact-side connecting portion; and a bottom electrode provided on the bottom surface of said semiconductor substrate in connection therewith;

wherein an element-side semiconductor device including said element-side connecting portion has a bipolar transistor made up of said drain layer, said channel portion and said source layer in a region from said drain electrode to said first source electrode;

wherein a contact-side semiconductor device including said contact-side connecting portion does not have said source layer, but includes a diode made up of said drain layer and said channel portion in a region from said drain electrode to said first source electrode; and wherein the withstanding voltage between said drain electrode and said first source electrode in said diode is substantially equal to or lower than the withstanding voltage between said drain electrode and said first source electrode in said bipolar transistor.

9. The semiconductor device according to claim 8, wherein said drain layer includes a high-concentration layer having a relatively low resistance, and a field buffering portion provided around said high-concentration layer and having a relatively high resistance; and wherein the width of said field buffering portion flour said high-concentration layer toward said channel portion in said contact-side semiconductor device is smaller than the width of said field buffering portion from said high-concentration layer toward said channel portion in said element-side semiconductor device.

10. A semiconductor device comprising:

a semiconductor substrate;

a semiconductor layer having a higher resistance than that of said semiconductor substrate and provided on a top surface of said semiconductor substrate;

a gate electrode provided on a gate insulation film on the top surface of said semiconductor layer;

a drain layer of a first conductivity type selectively provided in a location in said semiconductor layer in one side of said gate electrode;

a drain electrode connected to said drain layer;

a source layer of the first conductivity type selectively provided in a location in said semiconductor layer in the other side of said gate electrode;

an element-side connecting portion selectively provided on said semiconductor layer, said element-side connecting portion being provided in an active region on which semiconductor elements are formed;

a contact-side connecting portion selectively provided on said semiconductor layer, having lower resistance than said semiconductor layer and extending deeper toward said semiconductor substrate than said element-side connecting portion, said contact-side connecting portion being provided in an inactive region on which semiconductor elements are not formed;

a first source electrode connecting paid source layer, said element-side connecting portion and said contact-side connecting portion; and a bottom electrode provided on the bottom surface of said semiconductor substrate in connection therewith;

wherein said gate electrode is provided in said element-side semiconductor device but is not provided in said contact-side semiconductor device.

11. A semiconductor device comprising:

a semiconductor substrate:

a semiconductor layer having a higher resistance than that of said semiconductor substrate and provided on a top surface of said semiconductor substrate;

a gate electrode provided on a sate insulating film on the top surface of said semiconductor layer;

a drain layer of a first conductivity type selectively provided in a location in said semiconductor layer in one side of said gate electrode;

a drain electrode connected to said drain layer;

a source layer of the first conductivity type selectively provided in a location an said semiconductor layer in the other side of maid sate electrode;

a base layer of the second conductivity type provided around the source layer;

a first field buffering portion of the first conductivity type extending laterally from said drain layer toward said base layer, said first field buffering portion being provided in an active region on which elements are formed;

a second field buffering portion of the first conductivity type extending laterally from said drain layer toward said base layer, said second field buffering portion being provided in an inactive region on which elements are not formed and being laterally narrower than said first field buffering portion;

a first source electrode connecting said source layer and said base layer; and a metal plug extending from said drain layer to said semiconductor substrate through said semiconductor layer to connect between said drain layer and said semiconductor substrate;

a bottom electrode provided on the bottom surface of said semiconductor substrate in connection therewith, said bottom electrode acting as a drain electrode;

wherein said semiconductor substrate is the first conductivity type, and said bottom electrode is said drain electrode, and said first source electrode contacts the top surface of said semiconductor substrate, and wherein said semiconductor device has a metal plug extending from said drain layer to said semiconductor substrate through said semiconductor layer to connect between said drain layer and said semiconductor layer.

12. A semiconductor device comprising:

a semiconductor substrate;

a semiconductor layer having a higher resistance than that of said semiconductor substrate and provided on a top surface of said semiconductor substrate;

a gate electrode provided on a gate insulating film on the top surface of said semiconductor layer;

a drain layer of a first conductivity type selectively provided in a location in said semiconductor layer in one side of said gate electrode;

a drain electrode connected to said drain layer;

a source layer of the first conductivity type selectively provided in a location in said semiconductor layer in the other side of said gate electrode;

an element-side connecting portion selectively provided on said semiconductor layer, said element-side connecting portion being provided in an active region on which semiconductor elements are formed;

a contact-side connecting portion selectively provided on said semiconductor layer, having lower resistance than said semiconductor layer and extending deeper toward said semiconductor substrate than said element-side connecting portion, said contact-side connecting portion being provided in an inactive region on which semiconductor elements are not formed;

a first source electrode connecting said source layer, said element-side connecting portion and said contact-side connecting portion; and a bottom electrode provided on the bottom surface of said semiconductor substrate in connection therewith;

wherein there are provided a plurality of element units each including said gate electrode, said drain layer, said source layer, said element-side connecting portion, said contact-side connecting portion, said source electrode and said drain electrode, and every adjacent said element units share one of said source electrode and said drain electrode.

13. The semiconductor device according to claim 12, wherein said element unit includes a connecting line each made up of a plurality of said element-side connecting portions and a plurality of said contact-side connecting portions which are aligned alternately adjacent to each other along a straight line, and a drain line made up of a straight arrangement of said drain layer;

wherein adjacent said connecting lines are substantially parallel; and wherein said drain line intervenes between adjacent said connecting lines to extend in parallel therewith.

14. The semiconductor device according to claim 12, wherein each said element unit is configured as:

one or more said element-side connecting portions being provided to extend along a straight line;

said drain layer being provided to extend in parallel with the direction of said straight line of said element-side connecting portions; and said contact-side connecting portion being provided proximate to said drain layer and extending perpendicular to the direction of said straight line and contacting with said element-side connecting portions.

15. A semiconductor device comprising:

a semiconductor substrate;

a semiconductor layer having a higher resistance than that of said semiconductor substrate and provided on a top surface of said semiconductor substrate;

a gate electrode provided on a gate insulating film on the top surface of said semiconductor layer;

a drain layer of a first conductivity type selectively provided in a location in said semiconductor layer in one side of said gate electrode;

a drain electrode connected to said drain layer;

a source layer of the first conductivity type selectively provided in a location in said semiconductor layer in the other side of said gate electrode;

an element-side connecting portion selectively provided on said semiconductor layer, said element-side connecting portion being provided in an active region on which semiconductor elements are formed;

a contact-side connecting portion selectively provided on said semiconductor layer, having lower resistance than said semiconductor layer and extending deeper toward said semiconductor substrate than said element-side connecting portion, said contact-side connecting portion being provided in an inactive region on which semiconductor elements are not formed;

a first source electrode connecting said source layer, said element-side connecting portion and said contact-side connecting portion; and a bottom electrode provided on the bottom surface of said semiconductor substrate in connection therewith;

wherein said element-side connecting portion and said contact-side connecting portion are formed as a unitary body.

16. A semiconductor device comprising:

a semiconductor substrate;

a semiconductor layer having a higher resistance than that of said semiconductor substrate and provided on a top surface of said semiconductor substrate;

a gate electrode provided on a gate insulating film on the top surface of said semiconductor layer;

a drain layer of a first conductivity type selectively provided in a location in said semiconductor layer in one side of said gate electrode;

a drain electrode connected to said drain layer;

a source layer of a first conductivity type selectively provided in a location in said semiconductor layer in one side of said gate electrode;

an element-side connecting portion selectively provided on said semiconductor layer, said element-side connecting portion being provided in an active region on which semiconductor elements are formed;

a contact-side connecting portion selectively provided on said semiconductor layer, having lower resistance than said semiconductor layer and extending deeper toward said semiconductor substrate than said element-side connecting portion, said contact-side connecting portion being provided in an inactive region on which semiconductor elements are not formed;

a first source electrode connecting said source layer, said element-side connecting portion and said contact-side connecting portion; and a bottom electrode provided on the bottom surface of said semiconductor substrate in connection therewith;

wherein an element-side semiconductor device including said element-side connecting portion includes a bipolar transistor made up of said drain layer, said channel portion and said source layer;

wherein a contact-side semiconductor device including said contact-side connecting portion does not include said source layer, but includes a diode made up of said drain layer and said contact-side connecting portion or a semiconductor region of a second conductivity type which is opposite to the first conductivity type adjacent thereto in a region from said drain electrode to said first source electrode; and wherein the withstanding voltage between said drain electrode and said first source electrode in said diode is substantially equal to or lower than the withstanding voltage between said drain electrode and said first source electrode in said bipolar transistor.

17. A semiconductor device comprising:

a semiconductor substrate;

a semiconductor layer having a higher resistance than that of said semiconductor substrate and formed on a top surface of said semiconductor substrate;

a gate electrode formed on a gate insulating film on the top surface of said semiconductor layer;

a drain layer of a first conductivity type selectively formed in a location in said semiconductor layer in one aide of said gate electrode;

a drain electrode connected to said drain layer;

a source layer of the first conductivity type selectively formed in a location in said semiconductor layer in the other side of said gate electrode;

a first semiconductor region of a second conductivity type which is opposite to the first conductivity type connected to said source layer, which has lower resistance than that of said semiconductor layer and is selectively formed on said semiconductor layer, and which reaches said semiconductor substrate;

a second semiconductor region of the second conductivity type having a lower resistance than said semiconductor layer, and selectively formed on said semiconductor layer, which reaches said semiconductor substrate and is not adjacent to said source layer;

a short-circuiting electrode connected to said source layer and said first semiconductor region, a source electrode formed on the bottom surface of said semiconductor substrate in connection therewith, a bipolar transistor provided in a region from said drain electrode to said short-circuiting electrode and formed by said drain layer, said source layer and a channel portion which is provided between said drain layer and said source layer, a diode provided in a region from said drain electrode to said second semiconductor region and formed by said drain layer and said second semiconductor region, and wherein the withstanding voltage between said drain layer and said second semiconductor region in said diode is substantially equal to or lower than the withstanding voltage between said drain electrode and said source layer in said bipolar transistor.

18. The semiconductor device according to claim 17, wherein said source layer is comb-shaped to include a projecting portion when viewed on a plane parallel to the major surface of said semiconductor substrate, and said projecting portion is connected to said short-circuiting electrode.

19. The semiconductor device according to claim 17, wherein at least one of said drain layer, said source layer, said gate electrode, said drain electrode, said source electrode and said short-circuiting electrode have rounded corners when viewed from a plane parallel to the top surface of said semiconductor substrate.

20. The semiconductor device according to claim 17, wherein said first semiconductor region and said second semiconductor region are simultaneously formed in a common process.

21. The semiconductor device according to claim 17, wherein said first semiconductor region extends in a direction along said source layer, and said second semiconductor region is substantially perpendicular to the direction.

22. The semiconductor device according to claim 21, wherein said second semiconductor region extends below a gate interconnection connected to said gate electrode and extends along with said gate interconnection.

23. The semiconductor device according to claim 22, further comprising an interconnection insulating film between said gate interconnection and said second semiconductor region, said interconnection insulating film being thicker than said gate insulating film.

24. The semiconductor device according to claim 22, wherein said drain electrodes do not exist above said gate interconnection.

* * * * *